United States Patent
Goto et al.

(10) Patent No.: US 9,478,744 B2
(45) Date of Patent: Oct. 25, 2016

(54) HIGH MOLECULAR COMPOUND, METHOD FOR PRODUCING SAME, AND LIGHT-EMITTING ELEMENT

(75) Inventors: Osamu Goto, Tsukuba (JP); Fumiko Kako, Tsukuba (JP); Masayuki Soga, Tokyo (JP); Kazuei Ohuchi, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 671 days.

(21) Appl. No.: 13/989,987

(22) PCT Filed: Nov. 28, 2011

(86) PCT No.: PCT/JP2011/077420
§ 371 (c)(1),
(2), (4) Date: May 28, 2013

(87) PCT Pub. No.: WO2012/073903
PCT Pub. Date: Jun. 7, 2012

(65) Prior Publication Data
US 2013/0248778 A1    Sep. 26, 2013

(30) Foreign Application Priority Data

Nov. 30, 2010   (JP) ................................. 2010-267626

(51) Int. Cl.

| | | |
|---|---|---|
| H01L 51/54 | (2006.01) | |
| C09K 11/06 | (2006.01) | |
| H01L 51/00 | (2006.01) | |
| C08G 61/12 | (2006.01) | |
| C08K 5/34 | (2006.01) | |
| H01L 51/50 | (2006.01) | |

(52) U.S. Cl.
CPC ........... *H01L 51/0043* (2013.01); *C08G 61/12* (2013.01); *C08G 2261/124* (2013.01); *C08G 2261/3142* (2013.01); *C08G 2261/3162* (2013.01); *C08G 2261/3221* (2013.01); *C08G 2261/374* (2013.01); *C08G 2261/411* (2013.01); *C08G 2261/5242* (2013.01); *C08G 2261/95* (2013.01); *C08K 5/34* (2013.01); *H01L 51/0039* (2013.01); *H01L 51/0085* (2013.01); *H01L 51/50* (2013.01)

(58) Field of Classification Search
None
See application file for complete search history.

(56) References Cited

U.S. PATENT DOCUMENTS

| 6,355,773 B1 | 3/2002 | Weinfurtner et al. |
|---|---|---|
| 2003/0045642 A1 | 3/2003 | Wu et al. |
| 2003/0170490 A1 | 9/2003 | Hu et al. |
| 2006/0025564 A1 | 2/2006 | Craig et al. |
| 2006/0229427 A1 | 10/2006 | Becker et al. |
| 2010/0019203 A1 | 1/2010 | Akino et al. |
| 2010/0108993 A1 | 5/2010 | Moriwaki et al. |
| 2011/0118411 A1 | 5/2011 | Anryu et al. |

FOREIGN PATENT DOCUMENTS

| CN | 1599964 A | 3/2005 |
|---|---|---|
| CN | 1835985 A | 9/2006 |
| EP | 2336215 A1 | 6/2011 |
| EP | 2383306 A1 | 11/2011 |
| JP | 2001-151868 A | 6/2001 |
| JP | 2006-504862 A | 2/2006 |
| JP | 2007-501883 A | 2/2007 |

(Continued)

OTHER PUBLICATIONS

Office Action issued Jan. 12, 2015 in CN Application No. 201180057557.3.

(Continued)

*Primary Examiner* — Andrew K Bohaty
(74) *Attorney, Agent, or Firm* — Panitch Schwarze Belisario & Nadel LLP

(57) ABSTRACT

A polymer compound is provided for achieving satisfactory brightness even at a low driving voltage when applied to a light-emitting device. A preferred embodiment includes multiple first groups and a block (A) having a structure in which the first groups are linked by a second group represented by formula (0-0), and includes at least one of a group represented by formula (0-1) or a group represented by formula (0-2) as the first group;

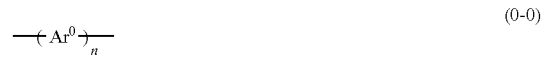

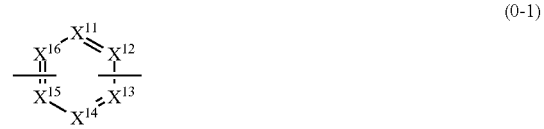

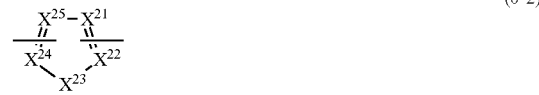

wherein $Ar^0$ represents an optionally substituted arylene group or divalent aromatic heterocyclic group having a structure different from the first group; n represents an average chain length of $Ar^0$ and equals 1.0 to 8.0; and $X^{11}$ to $X^{16}$ and $X^{21}$ to $X^{25}$ each represent a carbon atom or a nitrogen atom, where two or three of $X^{11}$ to $X^{16}$ are a nitrogen atom and three of $X^{21}$ to $X^{25}$ are a nitrogen atom.

34 Claims, 1 Drawing Sheet

(56) References Cited

FOREIGN PATENT DOCUMENTS

| | | |
|---|---|---|
| TW | 593627 B | 6/2004 |
| TW | 201000513 A | 1/2010 |
| WO | 2008093822 A1 | 8/2008 |
| WO | 2008096735 A1 | 8/2008 |
| WO | 2009131255 A1 | 10/2009 |
| WO | 2010041559 A1 | 4/2010 |
| WO | 2010084977 A1 | 7/2010 |

OTHER PUBLICATIONS

Office Action issued Sep. 1, 2015 in JP Application No. P2011262556.
Office Action issued Jun. 23, 2015 in TW Application No. 100143893.
Int'l Preliminary Report on Patentability issued Jun. 13, 2013 in Int'l Application No. PCT/JP2011/077420.
Int'l Search Report issued Mar. 6, 2012 in Int'l Application No. PCT/JP2011/077420.

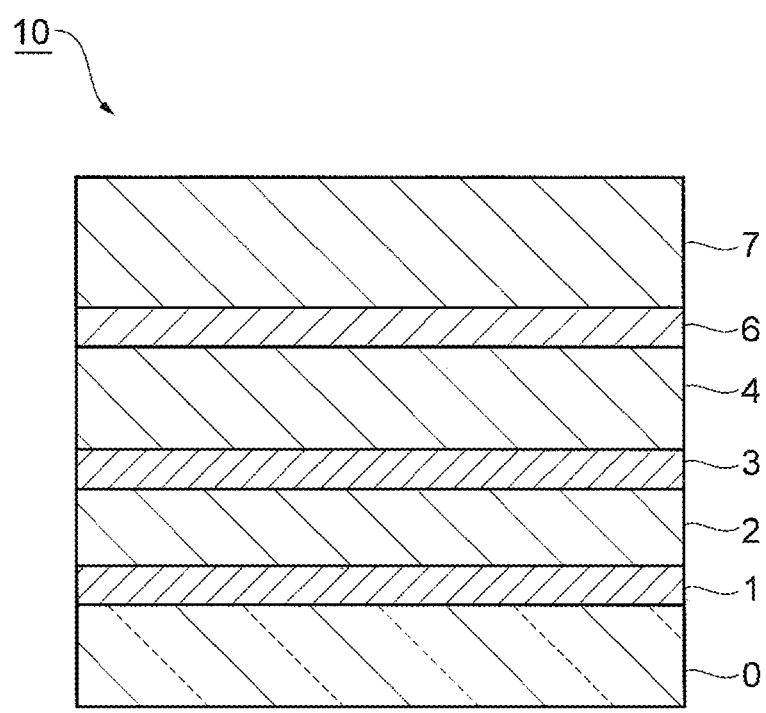

HIGH MOLECULAR COMPOUND, METHOD FOR PRODUCING SAME, AND LIGHT-EMITTING ELEMENT

CROSS-REFERENCE TO RELATED APPLICATION

This application is a Section 371 of International Application No. PCT/JP2011/077420, filed Nov. 28, 2011, which was published in the Japanese language on Jun. 7, 2012, under International Publication No. WO 2012/073903 A1, and the disclosure of which is incorporated herein by reference.

TECHNICAL FIELD

The present invention relates to a polymer compound and a method for producing the same, to a composition, solution, film and light-emitting device using the polymer compound, and to a surface light source and a display device comprising the light-emitting device.

BACKGROUND ART

High molecular weight light-emitting materials that are soluble in solvents are studied since they are capable of forming organic layers in light-emitting devices according to coating methods. As such light-emitting materials, random copolymers of polyfluorenes are known (Patent Literature 1).

Furthermore, as such a light-emitting material, a composition prepared by doping a phosphorescent light-emitting compound, which emits light from a triplet excitation state as a dopant on a host material, is known. It is important for a host material used in preparing such a composition to have a high lowest triplet excitation energy (hereinafter referred to as "T1 energy").

As an example of the host material having a high T1 energy in relation to a phosphorescent light-emitting compound which emits light having a shorter wavelength than that of red light, a meta-phenylene based polymer compound which comprises a combination of specific constitutional units has been proposed (Patent Literature 2).

CITATION LIST

Patent Literature

Patent Literature 1: Japanese Unexamined Patent Application publication No. 2001-151868
Patent Literature 2: International Publication No. WO2010/084977

SUMMARY OF INVENTION

Technical Problem

However, when the light-emitting material prepared by using the polymer compound described above is applied to an organic layer of a light-emitting device, a satisfactory brightness tends not to be achieved at a low driving voltage.

The present invention has been made in consideration of these circumstances, and it is therefore an object of the present invention to provide a polymer compound capable of achieving a satisfactory brightness even at a low driving voltage when it is applied to an organic layer of a light-emitting device.

It is another object of the present invention to provide a method for producing such a polymer compound; a composition, solution, film and light-emitting device using the polymer compound of the present invention; and a surface light source and display device comprising the light-emitting device.

Solution to Problem

In order to achieve the objects, a polymer compound of the present invention comprises a block (A) comprising a structure comprising two or more first groups and a second group represented by formula (0-0) linking the first groups, wherein the polymer compound comprises at least one of a group represented by formula (0-1) and a group represented by formula (0-2) as the first groups.

[Chemical Formula 1]

(0-0)

(0-1)

(0-2)

In formula (0-0), $Ar^0$ represents an arylene group or a divalent aromatic heterocyclic group having a structure different from that of the first group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; and n represents an average chain length in terms of Ar and is a numerical value of 1.0 or more and 8.0 or less.

In formulas (0-1) and (0-2), $X^{11}$, $X^{12}$, $X^{13}$, $X^{14}$, $X^{15}$, $X^{16}$, $X^{21}$, $X^{22}$, $X^{23}$, $X^{24}$ and $X^{25}$ each independently represent a carbon atom or a nitrogen atom, where two or three of $X^{11}$, $X^{12}$, $X^{13}$, $X^{14}$, $X^{15}$ and $X^{16}$ are a nitrogen atom and three of $X^{21}$, $X^{22}$, $X^{23}$, $X^{24}$ and $X^{25}$ are a nitrogen atom. The group represented by formula (0-1) and the group represented by formula (0-2) may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

Because the polymer compound of the present invention comprises the block (A) having a structure in which the group represented by formula (0-1) or formula (0-2) is linked by the group represented by formula (0-0), a satisfactory brightness can be achieved by low-voltage driving when the polymer compound of the present invention is used as a host material for a phosphorescent light-emitting compound to form an organic layer of a light-emitting device.

Since the above effect can be obtained more satisfactorily, n in the group represented by formula (0-0) is preferably a numerical value of 1.0 or more and 6.5 or less; more preferably a numerical value of 1.5 or more and 5.0 or less.

The block (A) contained in the polymer compound of the present invention preferably comprises multiple constitutional units represented by formula (0). In this case, it becomes easy to achieve a higher brightness even in the case of low-voltage driving.

[Chemical Formula 2]

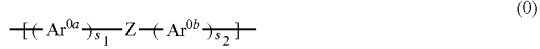
(0)

In formula (0), Z represents the group represented by formula (0-1) or the group represented by formula (0-2). $Ar^{0a}$ and $Ar^{0b}$ each independently have the same definition as $Ar^0$ and are each independently a group having a structure different from that of the group Z. When multiple $Ar^{0a}$ and $Ar^{0b}$ groups are present, the groups may be the same or different. The $s_1$ and $s_2$ each independently represent 1 or 2.

In the constitutional unit represented by formula (0), $Ar^{0a}$ and $Ar^{0b}$ are preferable if they are each independently at least one group selected from the group consisting of a phenylene group, a naphthalene-diyl group, a fluorene-diyl group and a dihydrophenanthrene-diyl group.

More specifically, it becomes easier to achieve the effect when the polymer compound comprises as the constitutional unit represented by formula (0) a constitutional unit represented by formula (2).

[Chemical Formula 3]

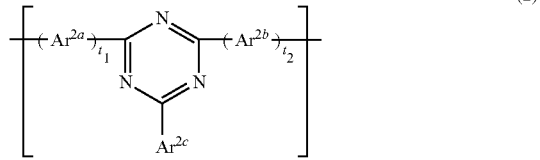
(2)

In formula (2), $Ar^{2a}$ and $Ar^{2b}$ have the same definition as the $Ar^{0a}$ and the $Ar^{0b}$, respectively, where $Ar^{2a}$ and $Ar^{2b}$ are groups different from a 1,3,5-triazine-diyl group. $Ar^{2c}$ represents an aryl group or a monovalent aromatic heterocyclic group, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent. When multiple $Ar^{2a}$ and $Ar^{2b}$ groups are present, the groups may be the same or different. $t_1$ and $t_2$ each independently represent 1 or 2.

Also in the constitutional unit represented by formula (2), $Ar^{2a}$ and $Ar^{2b}$ are preferable when they are each independently at least one group selected from the group consisting of a phenylene group, a naphthalene-diyl group, a fluorene-diyl group and a dihydrophenanthrene-diyl group.

The block (A) more preferably comprises the constitutional unit represented by formula (2) and a constitutional unit represented by formula (I). Because the block (A) described above is contained, it becomes further easier to achieve the aforementioned effect.

[Chemical Formula 4]

(I)

In formula (I), $Ar^1$ represents an arylene group or a divalent aromatic heterocyclic group, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

It is more preferable to contain as the constitutional unit represented by formula (I) at least one constitutional unit selected from the group consisting of a constitutional unit represented by formula (3) and a constitutional unit represented by formula (4) (which is different from the constitutional unit represented by formula (2) and the constitutional unit represented by formula (3)).

[Chemcial Formula 5]

(3)

(4)

In formula (3), $Ar^{3a}$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent. $R^{3a}$ is an alkyl group, an aryl group or a monovalent aromatic heterocyclic group, and is a group substituted at a substitution site neighboring a site forming a bonding to another constitutional unit in $Ar^{3a}$. When multiple $R^{3a}$ groups are present, the groups may be the same or different. A numerical value g is an integer of 1 to 4, preferably 1 or 2, and more preferably 2.

In formula (4), $Ar^{4a}$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent. When multiple $Ar^{4a}$ groups are present, the groups may be the same or different. A numerical value k is an integer of 1 to 3.

When the block (A) comprises the constitutional unit represented by formula (3), the block (A) preferably comprises a structure in which the constitutional units represented by formula (3) are present adjacent to both sides of the constitutional unit represented by formula (2). When the block (A) comprises the constitutional unit represented by formula (3) or formula (4), the block (A) preferably comprises a structure in which the constitutional units represented by formula (2) are present adjacent to both sides of the constitutional unit represented by formula (3) or formula (4).

It is preferable to contain as the constitutional unit represented by formula (3) at least one constitutional unit selected from the group consisting of the constitutional unit represented by formula (1) and a constitutional unit represented by formula (7).

[Chemical Formula 6]

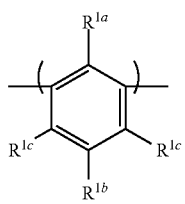
(1)

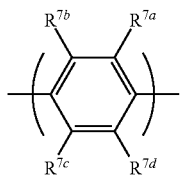
(7)

In formula (1), $R^{1a}$ represents a hydrogen atom, an alkyl group, an aryl group, a monovalent aromatic heterocyclic group, an aralkyl group or a substituted amino group, and $R^{1b}$ and $R^{1c}$ each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group. At least one of $R^{1a}$ and $R^{1c}$ comprises a group other than a hydrogen atom. The two $R^{1c}$ groups may be the same or different.

In formula (7), $R^{7a}$ and $R^{7c}$ each independently represent an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group or a cyano group, and $R^{7b}$ and $R^{7d}$ each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group.

On the other hand, it is preferable to contain as the constitutional unit represented by formula (4) at least one constitutional unit selected from the group consisting of a constitutional unit represented by formula (9), a constitutional unit represented by formula (10) and a constitutional unit represented by formula (11).

[Chemical Formula 7]

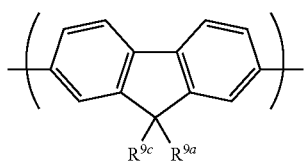
(9)

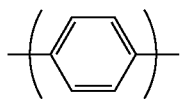
(10)

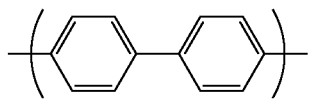
(11)

In formula (9), $R^{9a}$ and $R^{9c}$ each independently represent an alkyl group, an aryl group, a monovalent aromatic heterocyclic group or an aralkyl group, and $R^{9a}$ and $R^{9c}$ may be bonded together to form a ring structure.

The polymer compound of the present invention preferably has structure comprising a combination of the block (A) and a block (B), which has a structure different from that of the block (A).

In this case, when the block (B) is contained in the polymer compound so that a value represented by expression (VII) becomes 0.5 or less, it tends to easily achieve a satisfactory brightness at a low driving voltage.

$$[B]/[A] \quad (VII)$$

In expression (VII), [A] represents a mol % of the constitutional unit represented by formula (0) contained in the block (A); and [B] represents a mol % of the constitutional unit represented by formula (0) in the block (B).

Since the above effect can be more easily achieved, the block (B) more preferably comprises a constitutional unit represented by formula (IB) and/or a constitutional unit represented by formula (II).

[Chemical Formula 8]

$$-\!\!\left(Ar^{1B}\right)\!\!- \quad (IB)$$

$$-\!\!\left(Ar^2\right)\!\!- \quad (II)$$

In formula (IB), $Ar^{1B}$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent. In formula (II), $Ar^2$ represents a divalent aromatic amine residue and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

The block (B) comprises at least one constitutional unit selected from the group consisting of a constitutional unit represented by formula (3B) and a constitutional unit represented by formula (4B) (which is different from the constitutional unit represented by formula (3B)) as a constitutional unit represented by formula (IB), and more preferably comprises a constitutional unit represented by formula (5) as a constitutional unit represented by formula (II).

[Chemical Formula 9]

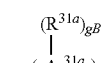
(3B)

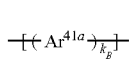
(4B)

-continued

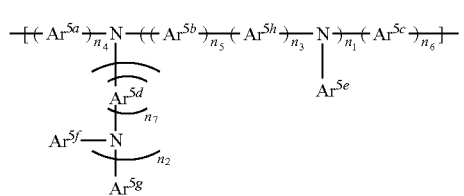

(5)

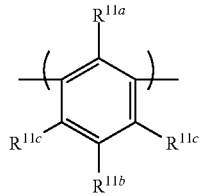

[Chemical Formula 10]

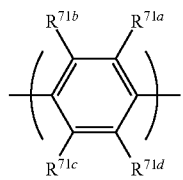 (1B)

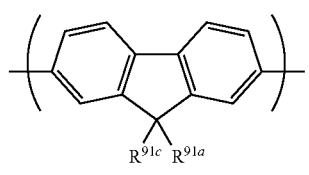 (7B)

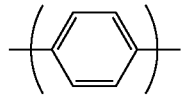 (9B)

(10B)

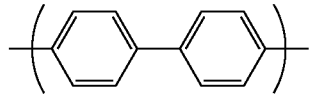 (11B)

In formula (3B), $Ar^{31a}$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent. $R^{31a}$ is an alkyl group, an aryl group or a monovalent aromatic heterocyclic group, and is a group substituted at a substitution site neighboring a site forming a bonding to another constitutional unit in $Ar^{31a}$. When multiple $R^{31a}$ groups are present, the groups may be the same or different. A numerical value $g_B$ is an integer of 1 to 4, preferably 1 or 2, and more preferably 2.

In formula (4B), $Ar^{41a}$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent. When multiple $Ar^{41a}$ groups are present, the groups may be the same or different. A numerical value $k_B$ is an integer of 1 to 3.

In formula (5), $Ar^{5a}$, $Ar^{5b}$, $Ar^{5c}$, $Ar^{5d}$ and $Ar^{5h}$ each independently represent an arylene group or a divalent aromatic heterocyclic group. $Ar^{5e}$, $Ar^{5f}$ and $Ar^{5g}$ each independently represent an aryl group or a monovalent aromatic heterocyclic group. $Ar^{5a}$, $Ar^{5b}$, $Ar^{5c}$, $Ar^{5d}$, $Ar^{5e}$, $Ar^{5f}$, $Ar^{5g}$ and $Ar^{5h}$ may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent. The groups represented by $Ar^{5d}$, $Ar^{5e}$, $Ar^{5f}$ and $Ar^{5g}$ may each form a 5- to 7-membered ring by bonding to a group other than the concerned group which bonds to a nitrogen atom to which the concerned group bonds, directly or via a group represented by —O—, —S—, —C(=O)—, —C(=O)—O—, —N(R$^A$)—, —C(=O)—N(R$^A$)— or —C(R$^A$)$_2$—. R$^A$ in the formulas represents an alkyl group, an aryl group, a monovalent aromatic heterocyclic group or an aralkyl group. When multiple $Ar^{5a}$, $Ar^{5b}$, $Ar^{5c}$, $Ar^{5d}$ and $Ar^{5h}$ groups are present, the groups may be the same or different. Numerical values $n_1$ and $n_2$ are each independently 0 or 1. A numerical value $n_3$ is 0 or a positive integer. Numerical values $n_4$, $n_5$, $n_6$ and $n_7$ are each independently a positive integer.

As the constitutional unit represented by formula (IB), those containing at least one constitutional unit selected from the group consisting of a constitutional unit represented by formula (1B), a constitutional unit represented by formula (7B), a constitutional unit represented by formula (9B), a constitutional unit represented by formula (10B) and a constitutional unit represented by formula (11B) are also preferable.

In formula (IB), $R^{11a}$ represents a hydrogen atom, an alkyl group, an aryl group, a monovalent aromatic heterocyclic group, an aralkyl group or a substituted amino group, and $R^{11b}$ and $R^{11c}$ each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group. The two $R^{11c}$ groups may be the same or different.

In formula (7B), $R^{71a}$ and $R^{71c}$ each independently represent an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group or a cyano group, and $R^{71b}$ and $R^{71d}$ each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group.

In formula (9B), $R^{91a}$ and $R^{91c}$ each independently represent an alkyl group, an aryl group, a monovalent aromatic heterocyclic group or an aralkyl group, and $R^{91a}$ and $R^{91c}$ may be bonded together to form a ring structure.

The polymer compound of the present invention preferably comprises a constitutional unit derived from a phosphorescent light-emitting compound in at least one block selected from the group consisting of the block (A), the block (B), and a block different from the block (A) and the block (B). Such a polymer compound can achieve further excellent light-emitting efficiency and can improve the workability in producing the light-emitting device.

The constitutional unit derived from a phosphorescent light-emitting compound is preferably a constitutional unit derived from a phosphorescent light-emitting compound which comprises at least one metal selected from the group consisting of gold, platinum, iridium, osmium, rhenium and europium as a central metal thereof.

Furthermore, in the polymer compound of the present invention, a proportion of the constitutional unit represented by formula (0) contained in the block (A) is preferably 5 to 40 mol % with respect to all the constitutional units contained in the polymer compound and 5 to 100 mol % with respect to all the constitutional units contained in the block (A). According to such a polymer compound satisfying the aforementioned condition, a satisfactory brightness can be achieved by low-voltage driving and an effect of implementing excellent brightness stability can be achieved.

Since such effect can be obtained more satisfactorily, in the polymer compound, a proportion of the total mass of the constitutional unit represented by formula (0), the constitutional unit represented by formula (3), the constitutional unit represented by formula (4), the constitutional unit represented by formula (3B), the constitutional unit represented by formula (4B) and the constitutional unit represented by formula (5) is preferably 0.9 or more when the total mass of the polymer compound is 1.0. The polymer compound more preferably satisfies a condition such that a value represented by expression (V) is 0.01 or more and 0.8 or less.

[C]/[D] (V)

In expression (V), [C] represents the polystyrene-equivalent weight-average molecular weight of the block (A), and [D] represents the polystyrene-equivalent weight-average molecular weight of the polymer compound.

The present invention also provides a composition containing the polymer compound of the present invention and at least one material selected from the group consisting of a hole transport material, an electron transport material and a light-emitting material. This composition is preferable as a material for foaming a light-emitting layer for a light-emitting device, and a satisfactory brightness of a light-emitting device including the light-emitting layer formed based on the composition can be achieved even by low-voltage driving.

In the composition, it is particularly preferable to contain a phosphorescent light-emitting compound as at least one material selected from the group consisting of a hole transport material, an electron transport material and a light-emitting material. The phosphorescent light-emitting compound is preferably a phosphorescent light-emitting compound comprising at least one metal selected from the group consisting of gold, platinum, iridium, osmium, rhenium and europium as a central metal thereof. Specifically, the phosphorescent light-emitting compound is more preferably a compound comprising a structure represented by formula (8).

[Chemical Formula 11]

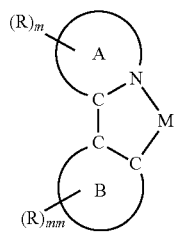

(8)

In formula (8), M represents at least one metal selected from the group consisting of gold, platinum, iridium, osmium, rhenium and europium. Ring A may be a monocyclic ring or a fused ring, and represents a heteroaromatic ring which may have a heteroatom in addition to N in the formula. Ring B represents an aromatic ring which may be a monocyclic ring or a fused ring. R represents a substituent, and when multiple substituents R are present, the substituents may be the same or different. The m and mm each represent 0 or a positive integer.

Furthermore, the present invention provides a solution containing the polymer compound of the present invention and a solvent. According to such a solution, the light-emitting layer described above can be easily formed by a simple method, such as coating.

Furthermore, the present invention provides a film containing the polymer compound of the present invention. The film of the present invention can be satisfactorily applied to an organic layer (particularly a light-emitting layer) of a light-emitting device and the like and is capable of reducing the voltage for achieving a required brightness.

In addition, the present invention provides a light-emitting device including an organic layer comprising the polymer compound of the present invention. Because the light-emitting layer of such a light-emitting device comprises the polymer compound of the present invention, a satisfactory brightness can be achieved even by low-battery driving. The effect can be satisfactorily achieved particularly when the organic layer is a light-emitting layer.

Furthermore, the present invention provides a surface light source and the display device comprising the light-emitting device of the present invention. Because the surface light source and the display device comprise the light-emitting device of the present invention, highly bright illumination and display can be performed at a low driving voltage.

Furthermore, the method for producing a polymer compound of the present invention comprises: a first step of synthesizing a first compound comprising multiple constitutional units represented by formula (0) by condensation-polymerizing a compound represented by formula (R-0) or by condensation-polymerizing a first monomer mixture comprising the compound represented by formula (R-0) and a compound represented by formula (R-1); and a second step of producing a polymer compound having a block (A) having the multiple constitutional units represented by formula (0) by condensation-polymerizing the first compound and a second compound having a structure different from a structure of the first compound and capable of being condensation-polymerized with the first compound. According to such a method for producing a polymer compound, the polymer compound having a block (A) comprising multiple constitutional units represented by formula (0) can be securely produced.

[Chemical Formula 12]

$$W^1\!-\!(\!Ar^{0a}\!)_{s_1}\!-\!Z\!-\!(\!Ar^{0b}\!)_{s_2}\!-\!W^2 \quad (R\text{-}0)$$

$$W^{21}\!-\!Ar^1\!-\!W^{22} \quad (R\text{-}I)$$

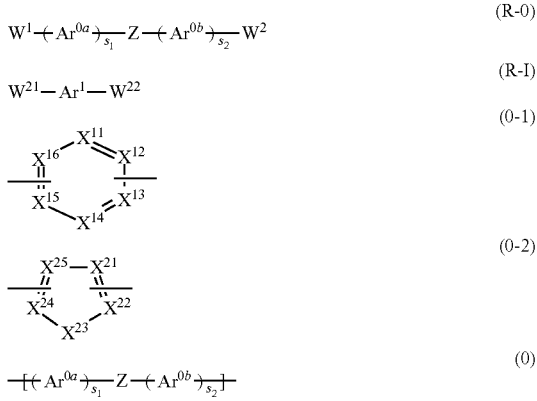

$$-\!(\!(\!Ar^{0a}\!)_{s_1}\!-\!Z\!-\!(\!Ar^{0b}\!)_{s_2}\!)\!- \quad (0)$$

In formulas (R-0) and (0), Z represents a group represented by formula (0-1) or a group represented by formula (0-2). $Ar^{0a}$ and $Ar^{0b}$ each independently represent an arylene group or a divalent aromatic heterocyclic group having a structure different from that of Z and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent. When multiple $Ar^{0a}$ and $Ar^{0b}$ groups are present, the groups may be the same or different. The $s_1$ and $s_2$ each independently represent 1 or 2.

In formula (R-I), $Ar^1$ represents an arylene group or a divalent aromatic heterocyclic group, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

In formulas (0-1) and (0-2), $X^{11}$, $X^{12}$, $X^{13}$, $X^{14}$, $X^{15}$, $X^{16}$, $X^{21}$, $X^{22}$, $X^{23}$, $X^{24}$ and $X^{25}$ each independently represent a carbon atom or a nitrogen atom, where two or three of $X^{11}$, $X^{12}$, $X^{13}$, $X^{14}$, $X^{15}$ and $X^{16}$ are a nitrogen atom and three of $X^{21}$, $X^{22}$, $X^{23}$, $X^{24}$ and $X^{25}$ are a nitrogen atom. The group represented by formula (0-1) and the group represented by formula (0-2) may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

In formulas (R-0) and (R-I), $W^1$, $W^2$, $W^{21}$ and $W^{22}$ are each independently a polymerizable group capable of involving a condensation-polymerization reaction.

In the method for producing a polymer compound of the present invention, in the second step, a second monomer mixture, which comprises the compound represented by formula (R-I) and a compound represented by formula (R-II), is preferably used as the second compound. A satisfactory brightness can be thereby easily achieved by low-voltage driving.

Furthermore, the method for producing a polymer compound of the present invention may comprise: a first step of producing a first compound comprising multiple constitutional units represented by formula (0) by condensation-polymerizing a compound represented by formula (R-0) or by condensation-polymerizing a first monomer mixture comprising the compound represented by formula (R-0) and a compound represented by formula (R-I); a second step of producing a second compound comprising multiple constitutional units represented by formula (II) by condensation-polymerizing a second monomer mixture comprising the compound represented by formula (R-I) and a compound represented by formula (R-II); and a third step of producing a polymer compound having a block (A) comprising multiple constitutional units represented by formula (0) and a block (B) comprising multiple constitutional units represented by formula (II), by condensation-polymerizing the first compound and the second compound. The polymer compound of the present invention can also be easily produced by the production method described above.

[Chemical Formula 13]

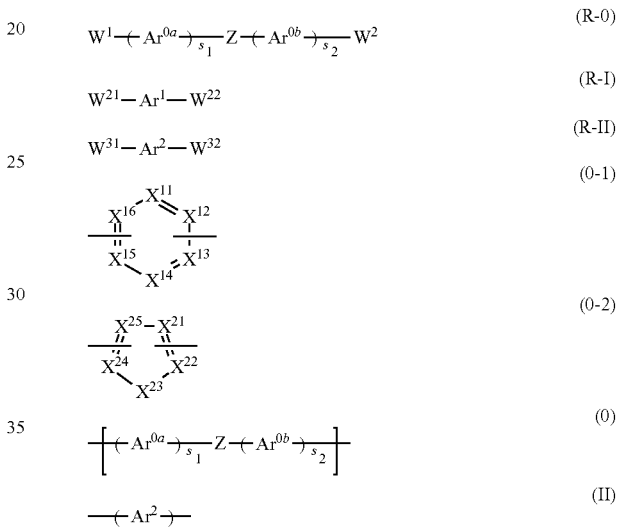

In formulas (R-0) and (0), Z represents a group represented by formula (0-1) or a group represented by formula (0-2). $Ar^{0a}$ and $Ar^{0b}$ each independently represent an arylene group or a divalent aromatic heterocyclic group having a structure different from that of Z and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent. When multiple $Ar^{0a}$ and $Ar^{0b}$ groups are present, the groups may be the same or different. The $s_1$ and $s_2$ each independently represent 1 or 2.

In formula (R-I), $Ar^1$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

In formulas (R-II) and (II), $Ar^2$ represents a divalent aromatic amine residue and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

In formulas (0-1) and (0-2), $X^{11}$, $X^{12}$, $X^{13}$, $X^{14}$, $X^{15}$, $X^{16}$, $X^{21}$, $X^{22}$, $X^{23}$, $X^{24}$ and $X^{25}$ each independently represent a carbon atom or a nitrogen atom, where two or three of $X^{11}$, $X^{12}$, $X^{13}$, $X^{14}$, $X^{15}$ and $X^{16}$ are a nitrogen atom and three of $X^{21}$, $X^{22}$, $X^{23}$, $X^{24}$ and $X^{25}$ are a nitrogen atom. The group represented by formula (0-1) and the group represented by formula (0-2) may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

In formulas (R-0), (R-I) and (R-II), $W^1$, $W^2$, $W^{21}$, $W^{22}$, $W^{31}$ and $W^{32}$ are each independently a polymerizable group capable of involving a condensation-polymerization reaction.

The method for producing a polymer compound of the present invention may also comprise: a first step of synthesizing a first compound by condensation-polymerizing a compound represented by formula (R-I) or by condensation-polymerizing a first monomer mixture comprising the compound represented by formula (R-I) and a compound represented by formula (R-II); and a second step of producing a polymer compound having a block (A) comprising multiple constitutional units represented by formula (0) by condensation-polymerizing the first compound and a compound represented by formula (R-0), or by condensation-polymerizing the first compound and a second monomer mixture comprising the compound represented by formula (R-0) and the compound represented by formula (R-I). The polymer compound having the block (A) comprising multiple constitutional units represented by formula (0) can also be easily produced by the production method described above.

[Chemical Formula 14]

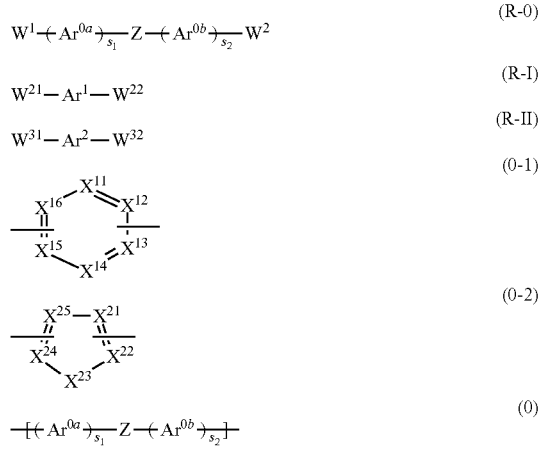

In formulas (R-0) and (O), Z represents a group represented by formula (0-1) or a group represented by formula (0-2). $Ar^{0a}$ and $Ar^{0b}$ each independently represent an arylene group or a divalent aromatic heterocyclic group having a structure different from that of Z and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent. When multiple $Ar^{0a}$ and $Ar^{0b}$ groups are present, the groups may be the same or different. The $s_1$ and $s_2$ each independently represent 1 or 2.

In formula (R-I), $Ar^1$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

In formula (R-II), $Ar^2$ represents a divalent aromatic amine residue and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

In formulas (0-1) and (0-2), $X^{11}$, $X^{12}$, $X^{13}$, $X^{14}$, $X^{15}$, $X^{16}$, $X^{21}$, $X^{22}$, $X^{23}$, $X^{24}$ and $X^{25}$ each independently represent a carbon atom or a nitrogen atom, where two or three of $X^{11}$, $X^{12}$, $X^{13}$, $X^{14}$, $X^{15}$ and $X^{16}$ are a nitrogen atom and three of $X^{21}$, $X^{22}$, $X^{23}$, $X^{24}$ and $X^{25}$ are a nitrogen atom. The group represented by formula (0-1) and the group represented by formula (0-2) may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

In formulas (R-0), (R-I) and (R-II), $W^1$, $W^2$, $W^{21}$, $W^{22}$, $W^{31}$ and $W^{32}$ are each independently a polymerizable group capable of involving a condensation-polymerization reaction.

Advantageous Effects of Invention

According to the present invention, it is possible to provide a polymer compound capable of achieving a satisfactory brightness even at a low driving voltage when it is applied to an organic layer of a light-emitting device. Such a polymer compound is particularly preferable as a host material of a phosphorescent light-emitting compound and can exhibit an excellent charge (which collectively refers to a hole and an electron: the same applies hereunder) transporting property. In a preferred embodiment of the present invention, it is possible to provide a polymer compound which can further exhibit an effect of achieving excellent brightness stability even if the device is driven for long hours.

Furthermore, according to the present invention, it is possible to provide: a method preferable for producing the polymer compound of the present invention; a composition, solution, film and light-emitting device using the polymer compound of the present invention; and a surface light source and display device comprising the light-emitting device.

BRIEF DESCRIPTION OF DRAWING

FIG. 1 is a drawing which schematically shows a cross-sectional configuration of a light-emitting device according to a preferred example.

DESCRIPTION OF EMBODIMENTS

Preferred embodiments of the present invention will now be described in detail.

DESCRIPTION OF TERMS

To begin with, terms used herein will be described. Throughout the present specification, the term "constitutional unit" refers to a unit of which at least one is present in the polymer compound. The constitutional unit is preferably present in the polymer compound as a "repeating unit" (that is, a unit of which 2 or more are present in the polymer compound).

The phrase "n-valent aromatic heterocyclic group" (n is 1 or 2) means an atomic group derived by removing n hydrogen atoms among the hydrogen atoms directly bonded to the aromatic ring or a heterocyclic ring of a heterocyclic compound having aromaticity, and it includes those having a fused ring. The term "heterocyclic compound" refers to compounds having a ring structure that contain, as atoms constituting the ring, heteroatoms such as oxygen atoms, sulfur atoms, nitrogen atoms, phosphorus atoms, boron atoms and silicon atoms, in addition to carbon atoms, among organic compounds having a ring structure.

An "aromatic heterocyclic compound" is a heterocyclic compound containing a heteroatom in which the heterocyclic ring itself is aromatic, such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzosilole or dibenzophosphole, or a compound in which the heterocyclic ring containing a heteroatom itself is not aromatic but an aromatic ring is fused to the heterocyclic ring, such as phenoxazine, phenothiazine, dibenzoborole, dibenzosilole or benzopyran.

In the present specification, Me represents a methyl group, Et represents an ethyl group, i-Pr represents an isopropyl group, n-Bu represents an n-butyl group, and tBu, t-Bu and t-butyl groups represent tert-butyl groups.

In the present specification, a "block" constitutes a part of the polymer compound and comprises a chain structure in a predetermined constitutional unit. Furthermore, a ratio of constitution of a constitutional unit contained in the block has at least one characteristic, in terms of its constitution or arrangement substantially not existing in a portion other than the block.

In polymer compounds having the blocks in the present specification, adjacent blocks have different constitutions (chemical structures). Specifically, adjacent blocks are constituted by constitutional units obtained from different monomers. Or otherwise, when adjacent blocks comprise constitutional units obtained from the same type of monomers, the composition or the distribution of chains thereof are different.

For example, a polymer compound having blocks, it is meant that a specific block and other blocks or a specific block and a group which bonds the specific block have different characteristics in terms of their constitution and arrangement.

In the polymer compound, the constitution of a block may only enable the estimation of a content or an average chain length in terms of a constitutional unit and may not necessarily be determined or identified completely for the block.

[Description of Substituents]

Various substituents to be mentioned in the present specification will be specifically described. In the present specification, substituents are as described below unless otherwise specially described.

(Alkyl Group)

The alkyl group is straight-chain, branched or cyclic, and preferably has 1 to 20 carbon atoms. The hydrogen atoms of the alkyl group may be optionally substituted with fluorine atoms. Examples of the alkyl group include methyl, ethyl, propyl, isopropyl, butyl, sec-butyl, isobutyl, tert-butyl, pentyl, isoamyl, hexyl, cyclohexyl, heptyl, octyl, 2-ethylhexyl, nonyl, decyl, 3,7-dimethyloctyl, dodecyl, trifluoromethyl, pentafluoroethyl, perfluorobutyl, perfluorohexyl and perfluorooctyl groups.

(Aryl Group)

The aryl group is an atomic group derived by removing one hydrogen atom of an aromatic hydrocarbon, and includes those having fused rings. The aryl group has preferably 6 to 60, more preferably 6 to 48, even more preferably 6 to 20, and still more preferably 6 to 14 carbon atoms. The number of carbon atoms of the substituents is not included in this number of carbon atoms. The hydrogen atoms of the aryl group may be substituted with an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group. Examples of an aryl group include a substituted or unsubstituted phenyl group.

(Monovalent Aromatic Heterocyclic Group)

The monovalent aromatic heterocyclic group has usually 2 to 60, preferably 3 to 60, and more preferably 3 to 20 carbon atoms. The number of carbon atoms of the substituents is not included in this number of carbon atoms. Examples of a monovalent aromatic heterocyclic group include 2-oxadiazolyl, 2-thiadiazolyl, 2-thiazolyl, 2-oxazolyl, 2-thienyl, 2-pyrrolyl, 2-furyl, 2-pyridyl, 3-pyridyl, 4-pyridyl, 2-pyrazyl, 2-pyrimidyl, 2-triazyl, 3-pyridazyl, 3-carbazolyl, 2-phenoxazinyl, 3-phenoxazinyl, 2-phenothiazinyl and 3-phenothiazinyl groups. The hydrogen atoms of the monovalent aromatic heterocyclic group may be substituted with an alkyl group, an aryl group, a monovalent aromatic heterocyclic group, an alkoxy group, an aryloxy group, an aralkyl group, an arylalkoxy group, a substituted amino group, a substituted carbonyl groups, a substituted carboxyl groups, a fluorine atoms or a cyano groups.

(Alkoxy Group)

The alkoxy group is straight-chain, branched or cyclic, and preferably has 1 to 20 carbon atoms. Examples of alkyl group portions in an alkoxy group include groups similar to those described above as examples of the alkyl group. Examples of the alkoxy group include methoxy, ethoxy, propyloxy, isopropyloxy, butoxy, sec-butoxy, isobutoxy, t-butoxy (tert-butoxy), pentyloxy, hexyloxy, cyclohexyloxy, heptyloxy, octyloxy, 2-ethylhexyloxy, nonyloxy, decyloxy, 3,7-dimethyloctyloxy, dodecyloxy, trifluoromethoxy, pentafluoroethoxy, perfluorobutoxy, perfluorohexyloxy, perfluorooctyloxy, methoxymethyloxy, 2-methoxyethyloxy and 2-ethoxyethyloxy groups.

(Aryloxy Group)

The aryloxy group preferably has 6 to 60 carbon atoms. Examples of aryl group portions in the aryloxy group include groups similar to those described above as examples of the aryl group. Examples of the aryloxy group include phenoxy, $C_1$-$C_{12}$ alkoxyphenoxy ("$C_1$-$C_{12}$ alkoxy" means that the number of carbons in the alkoxy portion 1 to 12 atoms, the same expression below has the same meaning), $C_1$-$C_{12}$ alkylphenoxy, 1-naphthyloxy, 2-naphthyloxy and pentafluorophenyloxy groups.

(Aralkyl Group)

The aralkyl group preferably has 7 to 60 carbon atoms. Examples of alkyl group portions in the aralkyl group include groups similar to those described above as examples of the alkyl group. Examples of aryl group portions include groups similar to those described above as examples of the aryl group. Examples of aralkyl groups include phenyl-$C_1$-$C_{12}$ alkyl, $C_1$-$C_{12}$ alkoxyphenyl-$C_1$-$C_{12}$ alkyl and $C_1$-$C_{12}$ alkylphenyl-$C_1$-$C_{12}$ alkyl groups.

(Arylalkoxy Group)

The arylalkoxy group preferably has 7 to 60 carbon atoms. Examples of aryl group portions in the arylalkoxy group include groups similar to those described above as examples of the aryl group. Examples of the arylalkoxy group include phenyl-$C_1$-$C_{12}$ alkoxy, $C_1$-$C_{12}$ alkoxyphenyl-$C_1$-$C_{12}$ alkoxy and $C_1$-$C_{12}$ alkylphenyl-$C_1$-$C_{12}$ alkoxy groups.

(Substituted Amino Group)

The substituted amino group preferably has 2 to 60 carbon atoms. Examples of the substituted amino group include amino groups in which a part of or all the hydrogen atoms are substituted with an alkyl group, an aryl group, an aralkyl group or a monovalent aromatic heterocyclic group. The substituted amino group includes groups derived from substituents of amino groups bonded together directly or via a carbon atom, oxygen atom, sulfur atom or the like to form a fused ring. The substituted amino group is preferably a dialkyl-substituted amino group or a diaryl-substituted amino group. Specifically, examples of the substituted amino group include dimethylamino, diethylamino, diphenylamino, di-4-tolylamino, di-4-t-butylphenylamino, bis(3, 5-di-t-butylphenyl)amino, N-carbazolyl, N-phenoxazinyl, N-acridinyl and N-phenothiazinyl groups.

(Substituted Carbonyl Group)

The substituted carbonyl group preferably has 2 to 60 carbon atoms. Examples of the substituted carbonyl group include carbonyl groups in which a part of or all the hydrogen atoms are substituted with an alkyl group, an aryl group, an aralkyl group or a monovalent aromatic heterocyclic group. More specifically, examples of the substituted carbonyl group include acetyl, butyryl and benzoyl groups.

(Substituted Carboxyl Group)

The substituted carboxyl group preferably has 2 to 60 carbon atoms. Examples of the substituted carboxyl group include carboxyl groups in which a part of or all the hydrogen atoms are substituted with an alkyl group, an aryl group, an aralkyl group or a monovalent aromatic heterocyclic group. More specifically, examples of the substituted carboxyl group include methoxycarbonyl, ethoxycarbonyl, butoxycarbonyl, phenoxycarbonyl and benzyloxycarbonyl groups.

(Arylene Group)

The arylene group means an atomic group derived by removing two hydrogen atoms of an aromatic hydrocarbon, and includes those having fused rings.

The arylene group preferably has 6 to 60 carbon atoms. The number of carbon atoms of the substituents is not included in this number of carbon atoms. Examples of the arylene groups include phenylene groups such as 1,4-phenylene (a group represented by the following formula 001; the same applies hereunder), 1,3-phenylene (formula 002) and 1,2-phenylene (formula 003) groups; naphthalenediyl groups such as naphthalene-1,4-diyl (formula 004), naphthalene-1,5-diyl (formula 005) and naphthalene-2,6-diyl (formula 006) groups; dihydrophenanthrenediyl groups such as a 4,5-dihydrophenanthrene-2,7-diyl group (formula 007); fluorenediyl groups such as fluorene-3,6-diyl (formula 008) and fluorene-2,7-diyl (formula 009) groups; 9,9'-spirofluorenediyl groups such as 9,9'-spirofluorene-2,7-diyl (formula 010), 9,9'-spirofluorene-3,6-diyl (formula 011) and 9,9'-spirofluorene-2,2-diyl (formula 012) groups; indenofluorenediyl groups represented by formula 013 or the like; and 5,10-dihydroindenoindenediyl groups represented by formula 014 or the like.

[Chemical Formula 15]

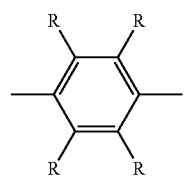
001

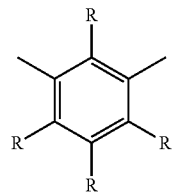
002

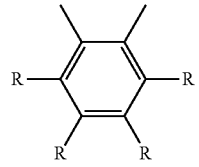
003

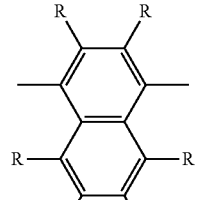
004

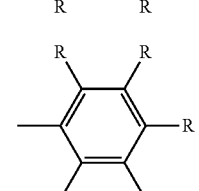
005

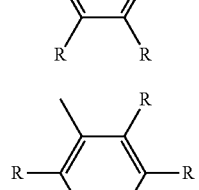
006

[Chemical Formula 16]

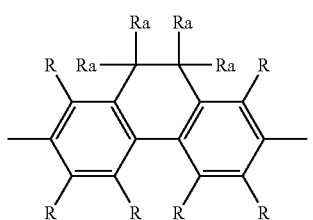
007

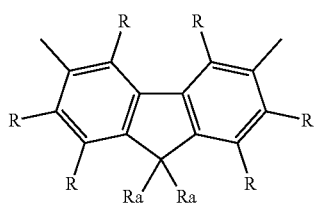
008

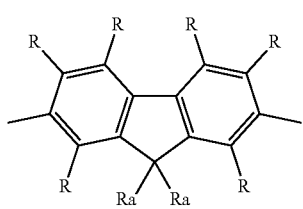
009

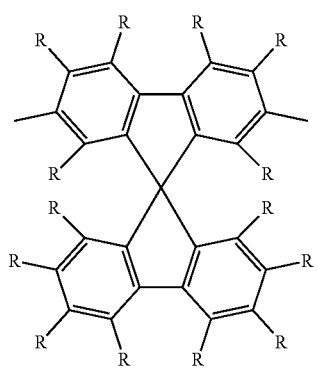
010

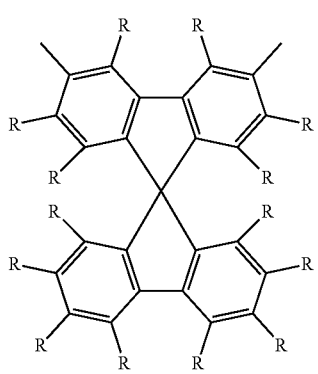
011

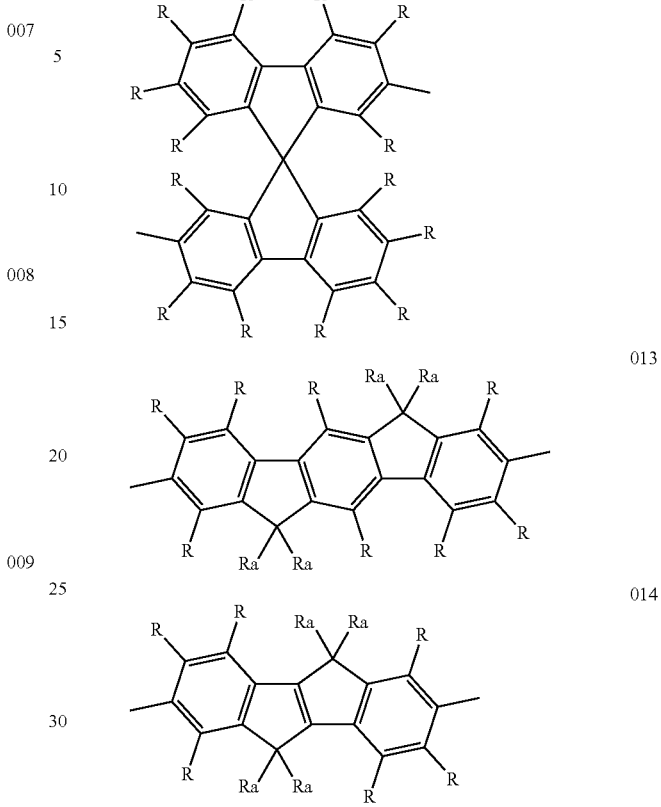

In formulas 001 to 014, R represents a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group. Ra represents an alkyl group, an aryl group, a monovalent aromatic heterocyclic group or an aralkyl group. Multiple R groups in the formulas may be the same or different and multiple Ra groups may be the same or different. When multiple Ra groups are present in the same group, the groups may be bonded together to form a ring structure.

In formulas 001 to 014, R is preferably a hydrogen atom, an alkyl group, an aryl group, a monovalent aromatic heterocyclic group, an alkoxy group, an aryloxy group, an aralkyl group or a substituted amino group, and more preferably a hydrogen atom, an alkyl group or an aryl group.

In formulas 001 to 014, Ra is preferably an aryl group and an alkyl group, and more preferably an unsubstituted aryl group or an aryl group substituted with an alkyl group, an alkoxy group or an aryl group; and an alkyl group.

In formulas 001 to 014, the ring structure formed when multiple Ra groups are present is preferably an unsubstituted cyclopentyl ring or a cyclopentyl ring substituted with an alkyl group, a cyclohexyl ring or a cycloheptyl ring. Examples of the arylene group when groups multiple Ra are present in the same group and form a ring structure include arylene groups having structures represented by the following formulas 015 to 017.

[Chemical Formula 17]

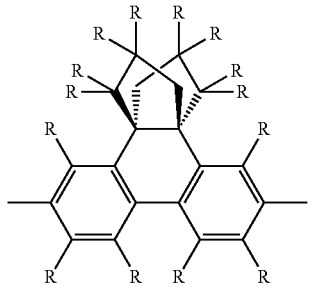
015

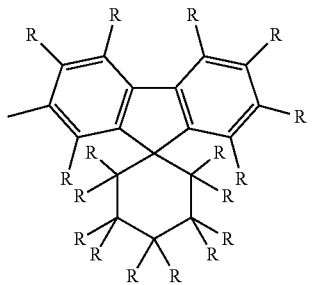
016

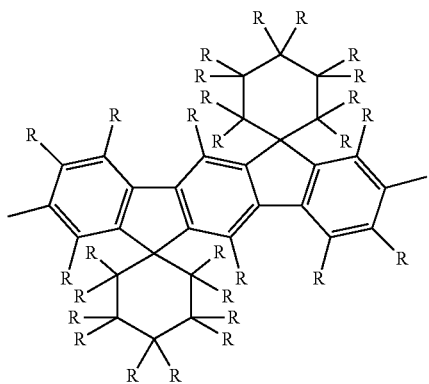
017

The arylene group described above includes groups formed by bonding of two or more independent benzene rings or fused rings by single bonds or via a divalent group, as well as groups having a benzene ring and those having a fused ring. Examples of such an arylene group include a biphenyl-diyl group (e.g., groups represented by the following formulas BP-1 to BP-6) and a terphenyl-diyl group (e.g., groups represented by the following formulas TP-1 to TP-7). In these formulas, R is the same as that described above.

[Chemical Formula 18]

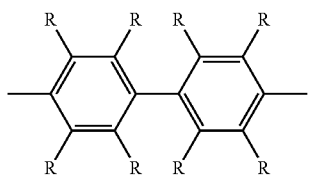
BP-1

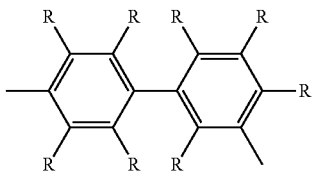
BP-2

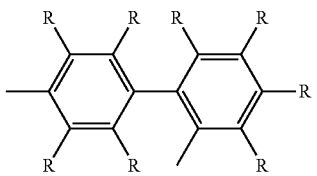
BP-3

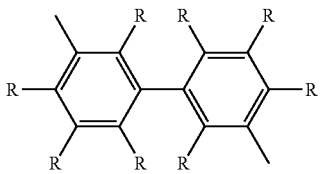
BP-4

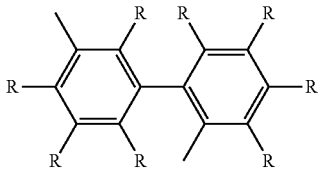
BP-5

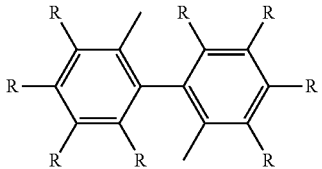
BP-6

[Chemical Formula 19]

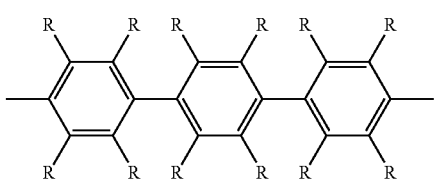
TP-1

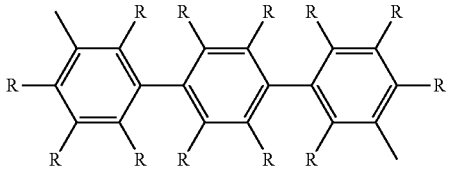
TP-2

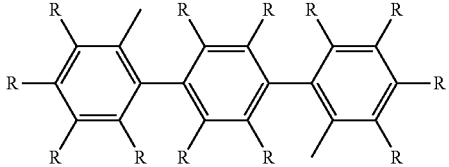
TP-3

-continued

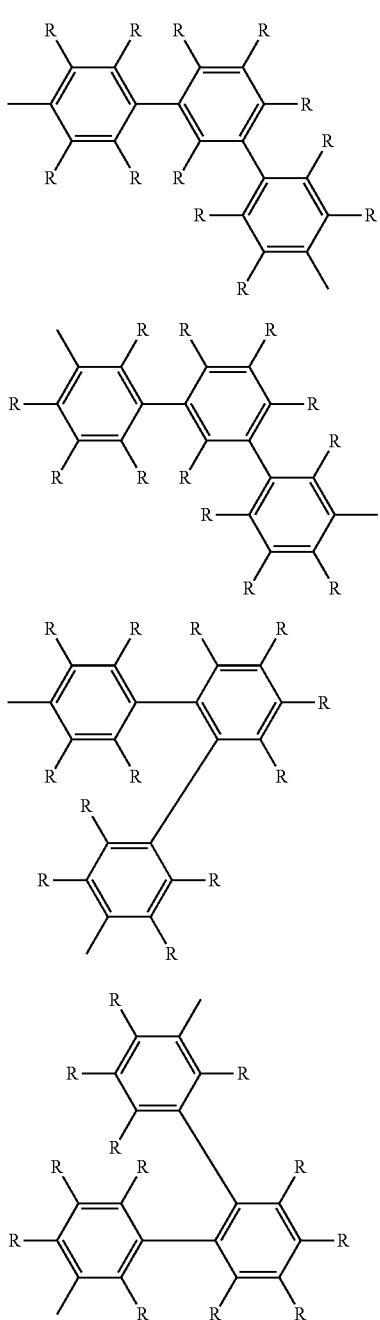

TP-4

TP-5

TP-6

TP-7

(Divalent Aromatic Heterocyclic Group)

A divalent aromatic heterocyclic group is an atomic group derived by removing two hydrogen atoms of an aromatic heterocyclic compound, and includes those having fused rings. The divalent aromatic heterocyclic group usually has 2 to 60 and preferably 3 to 60 carbon atoms. The number of carbon atoms of the substituents is not included in this number of carbon atoms. Examples of divalent aromatic heterocyclic groups include pyridinediyl groups such as pyridine-2,5-diyl (formula 101) and pyridine-2,6-diyl (formula 102) groups; pyrimidinediyl groups such as pyrimidine-4,6-diyl group (formula 103); triazine-2,4-diyl group (formula 104); pyrazinediyl groups such as pyrazine-2,5-diyl group (formula 105); pyridazinediyl groups such as pyridazine-3,6-diyl group (formula 106); quinolinediyl groups such as quinoline-2,6-diyl group (formula 107); isoquinolinediyl groups such as isoquinoline-1,4-diyl group (formula 108); quinoxalinediyl groups such as quinoxaline-5,8-diyl group (formula 109); carbazolediyl groups such as carbazole-3,6-diyl (formula 110) and carbazole-2,7-diyl (formula III) groups; dibenzofurandiyl groups such as dibenzofuran-2,8-diyl (formula 112) and dibenzofuran-3,7-diyl (formula 113) groups; dibenzothiophenediyl groups such as dibenzothiophene-2,8-diyl (formula 114) and dibenzothiophene-3,7-diyl (formula 115) groups; dibenzosiloldiyl groups such as dibenzosilol-2,8-diyl (formula 116) and dibenzosilol-3,7-diyl (formula 117) groups; phenoxazinediyl groups such as those represented by formulas 118 and 119 or the like; phenothiazinediyl groups such as those represented by formulas 120 and 121 or the like; dihydroacridinediyl groups represented by formula 122 or the like divalent groups represented by formula 123; pyrroldiyl groups such as pyrrol-2,5-diyl group (formula 124); furandiyl groups such as furan-2,5-diyl group (formula 125); thiophenediyl groups such as thiophene-2,5-diyl group (formula 126); diazolediyl groups such as a diazol-2,5-diyl group (formula 127); triazolediyl groups such as a triazole-2,5-diyl group (formula 128); oxazolediyl groups such as an oxazole-2,5-diyl group (formula 129); an oxadiazole-2,5-diyl group (formula 130); thiazolediyl groups such as a thiazole-2,5-diyl group (formula 131); and a thiadiazole-2,5-diyl group (formula 132).

In the following formulas 101 to 132, R and Ra mean the same as described above.

[Chemical Formula 20]

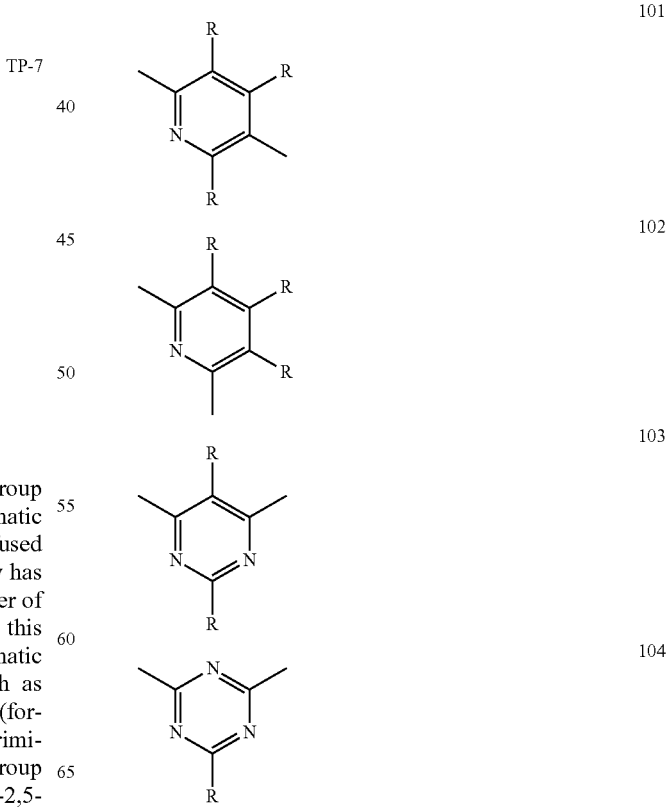

-continued
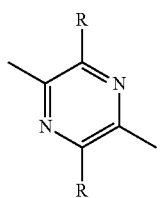
105
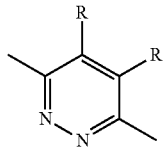
106
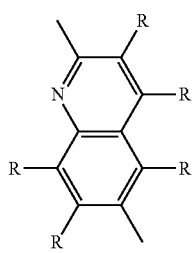
107
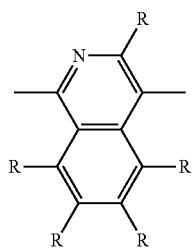
108
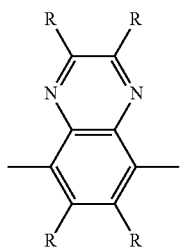
109
[Chemical Formula 21]
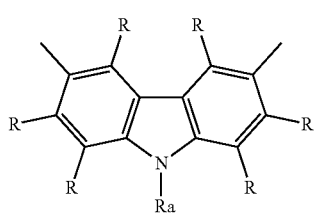
110
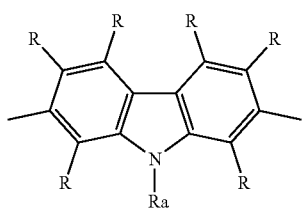
111
-continued
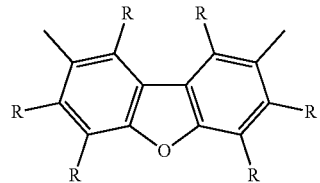
112
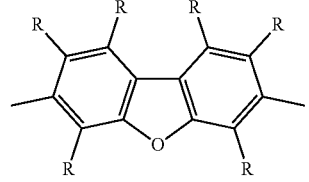
113
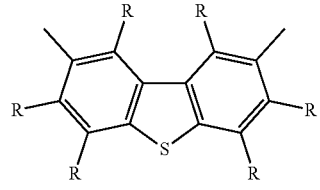
114
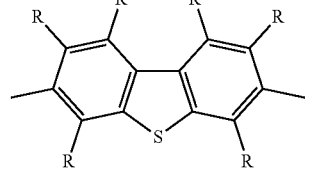
115
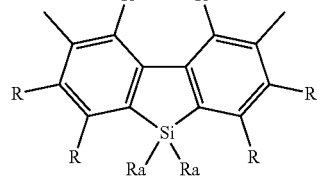
116
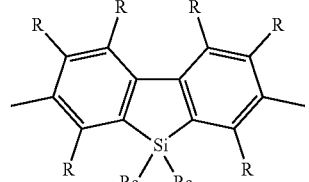
117
[Chemical Formula 22]
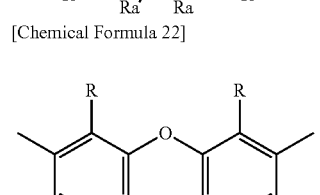
118
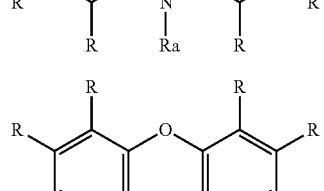
119

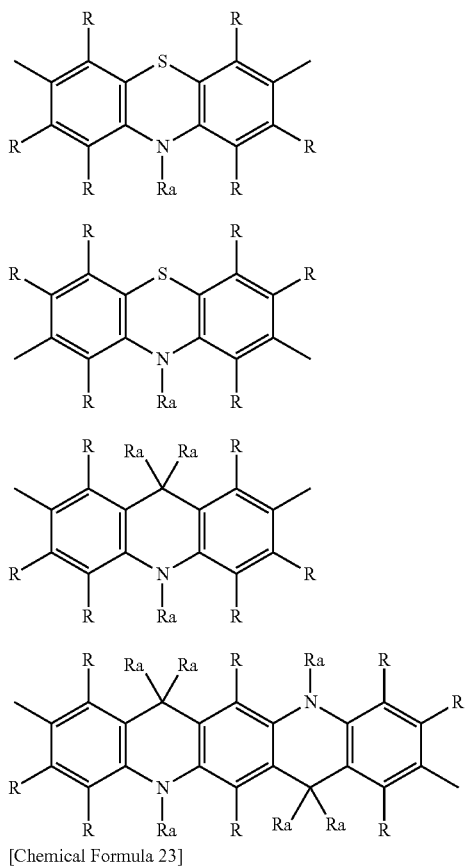

[Chemical Formula 23]

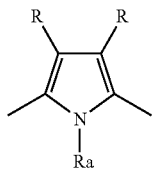

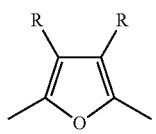

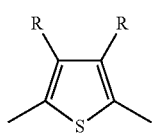

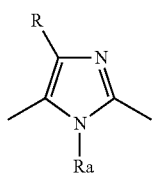

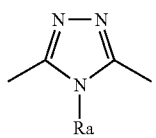

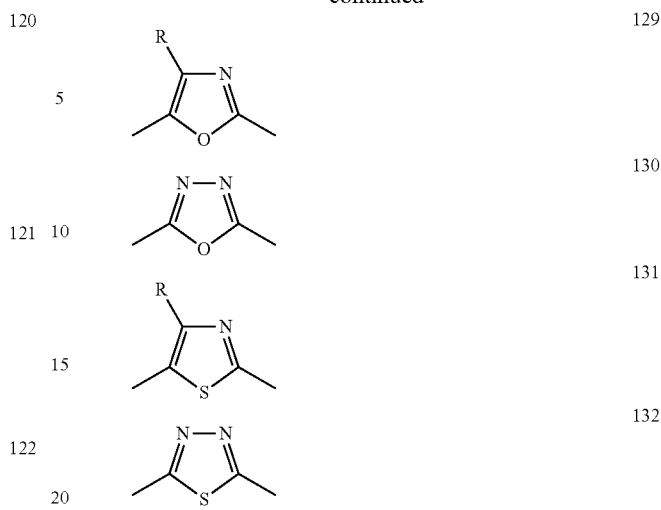

[Polymer Compound]

Now, polymer compounds according to preferred embodiments will be described.

A polymer compound according to this embodiment includes: a structure in which multiple first groups Z are linked by a group represented by formula (0-0); and a block (A) having at least one of a group represented by formula (0-1) and a group represented by formula (0-2) as the first groups Z. The polymer compound may have a block having a structure different from that of the block (A), e.g., a block (B) below and other blocks. Hereinbelow, blocks constituting the polymer compound will be described.

(Block (A))

The block (A) comprises a structure in which multiple first groups Z are linked by the group represented by formula (0-0). Specifically, in the block (A), one or more groups represented by $Ar^0$ are present between two first groups Z. In the formula (0-0), n represents an average chain length in terms of $Ar^0$ and is a numerical value of 1.0 or more and 8.0 or less. The average chain length in terms of $Ar^0$ herein refers to the number of $Ar^0$ groups arranged among groups Z, supposing that the first groups Z and $Ar^0$ constituting the block (A) are uniformly arranged according to abundance ratios of the groups Z and $Ar^0$. In the block (A), n is preferably a numerical value of 1.0 or more and 6.5 or less and more preferably 1.5 or more and 5.0 or less. It tends to become easier to improve the brightness achieved by low-voltage driving as the values of n become more preferable in the range.

<Constitutional Unit Represented by Formula (0)>

The block (A) preferably has a structure including multiple constitutional units represented by formula (0) described above. In formula (0), $Ar^{0a}$ and $Ar^{0b}$ are each preferably at least one arylene group selected from the group consisting of phenylene, naphthalene-diyl, fluorene-diyl and dihydrophenanthrene-diyl groups. Among them, 1,4-phenylene (the aforementioned formula 001) and 4,4'-biphenyl-diyl (the aforementioned formula BP-1) groups are more preferable, and unsubstituted 1,4-phenylene and 4,4'-biphenyl-diyl groups are particularly preferable.

The constitutional unit represented by formula (0) is preferably the constitutional unit represented by formula (2). In formula (2), the groups represented by $Ar^{2a}$ and $Ar^{2b}$ are preferably an arylene group, and phenylene, naphthalene-diyl, fluorene-diyl, and dihydrophenanthrene-diyl groups are particularly preferable. Among them, 1,4-phenylene (the aforementioned formula 001) and 4,4'-biphenyl-diyl (the aforementioned formula BP-1) groups are more preferable, and unsubstituted 1,4-phenylene and unsubstituted 4,4'-biphenyl-diyl groups are particularly preferable.

In formula (2), the group represented by $Ar^{2c}$ is preferably an aryl group, and more preferably a phenyl group substituted with an alkyl group or an aryl group. In formula (2), both $t_1$ and $t_2$ are preferably 1 or 2 to easily synthesize the polymer compound. Only one or two or more of the constitutional units represented by formula (2) may be contained in the polymer compound.

The constitutional unit represented by formula (2) is preferably a constitutional unit represented by the following formula 2-1 or 2-2.

[Chemical Formula 24]

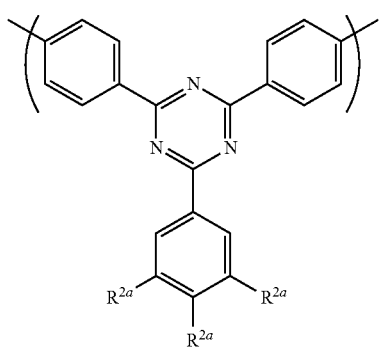

2-1

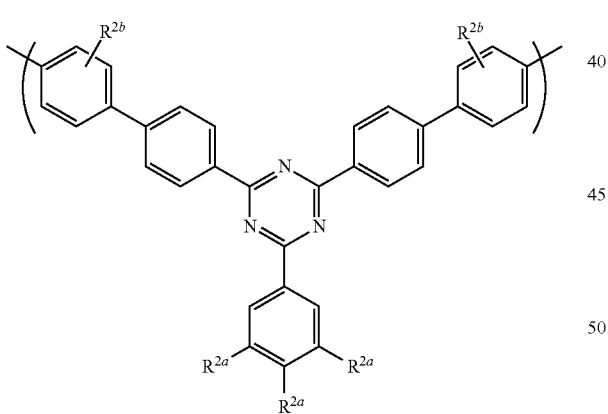

2-2

In formula 2-1, $R^{2a}$ represents a hydrogen atom, an alkyl group or an aryl group. Multiple $R^{2a}$ groups may be the same or different. However, at least one $R^{2a}$ represents a group other than a hydrogen atom. In formula 2-2, $R^{2a}$ represents a hydrogen atom, an alkyl group or an aryl group. Multiple $R^{2a}$ groups may be the same or different. However, at least one $R^{2a}$ represents a group other than a hydrogen atom. $R^{2b}$ represents a hydrogen atom, an alkyl group or an aryl group. Multiple $R^{2b}$ groups may be the same or different.

The constitutional unit represented by formula 2-1 is preferably constitutional units represented by the following formulas 2-001 to 2-008.

[Chemical Formula 25]

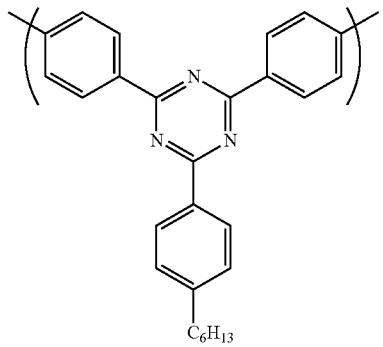

2-001

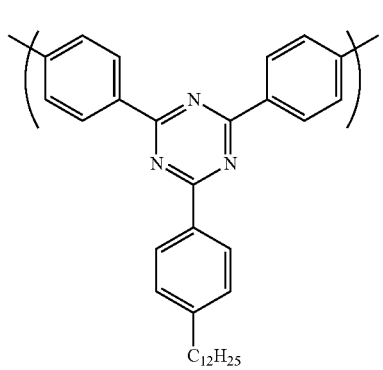

2-002

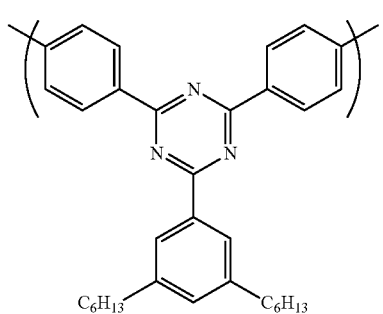

2-003

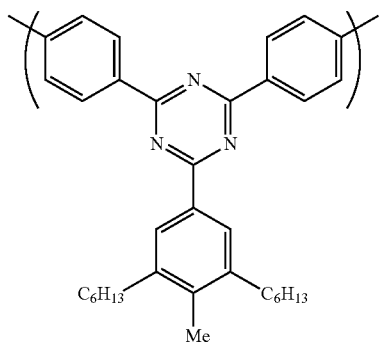

2-004

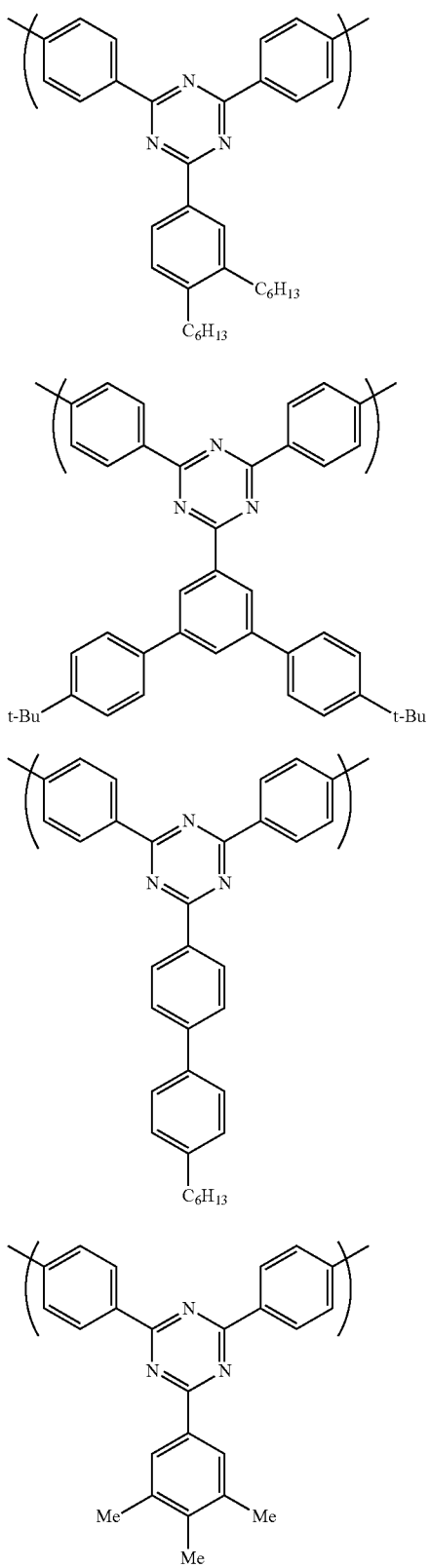
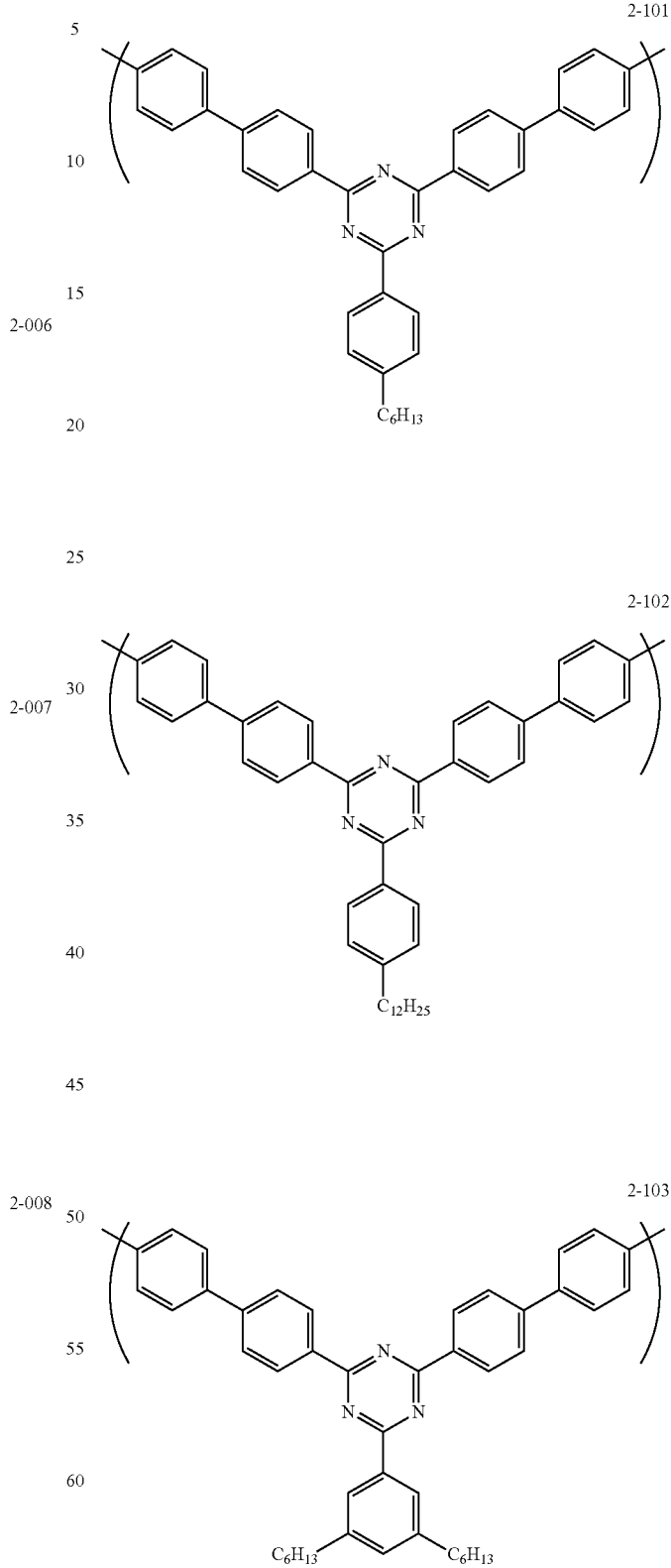
[Chemical Formula 26]
The constitutional unit represented by formula 2-2 is preferably constitutional units represented by the following formulas 2-101 to 2-106.

-continued

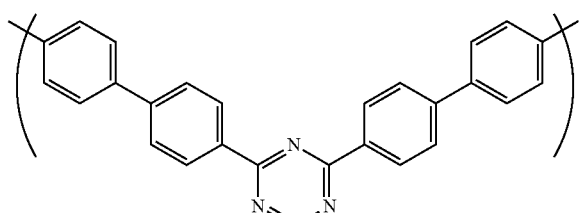
2-104

2-105

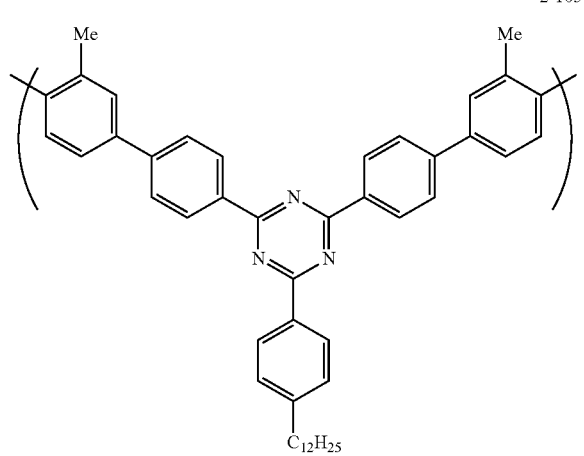
2-106

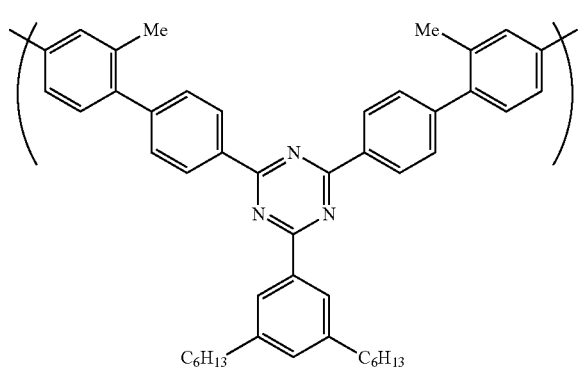

<Constitutional Unit Represented by Formula (I)>

The block (A) preferably has a structure comprising a combination of the constitutional unit represented by formula (0) (preferably the constitutional unit represented by formula (2)) and other constitutional units. Examples of the constitutional unit other than formula (0) include the constitutional unit represented by formula (I). In other words, the block (A) particularly preferably comprises the constitutional unit represented by formula (2) and the constitutional unit represented by formula (I). With this configuration, it becomes easy to achieve a high brightness by low-voltage driving when the light-emitting device is formed with the polymer compound of this embodiment.

The constitutional unit represented by formula (I) preferably comprises either one or both of the constitutional units represented by formulas (3) and (4).

The groups represented by $R^{3a}$ in the constitutional unit represented by formula (3) is preferably an alkyl group or an aryl group; an alkyl group or a phenyl group substituted with an alkyl group; and a propyl group, an isopropyl group, a butyl group, a sec-butyl group, an isobutyl group, a tert-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group or a dodecyl group.

In formula (3), the groups represented by $Ar^{3a}$ are preferably an arylene groups, and among them, more preferably a 1,4-phenylene group (the aforementioned formula 001), a 1,3-phenylene group (the aforementioned formula 002) and a fluorene-2,7-diyl group (the aforementioned formula 009). Only one or two or more of the constitutional units represented by formula (3) may be contained in the polymer compound. Only one or two or more of the constitutional units represented by formula (3) may be contained in the block (A).

On the other hand, in the constitutional unit represented by formula (4), the group represented by $Ar^{4a}$ is preferably arylene groups, and among them, more preferably a 1,4-phenylene group (formula 001), a 1,3-phenylene group (formula 002), a 4,4'-biphenyl-diyl group (formula BP-1), a 4,4''-terphenyl-diyl group (formula TP-1), a naphthalene-2,6-diyl group (formula 006), 4,5-dihydrophenanthrene-2,7-diyl group (formula 007), a fluorene-3,6-diyl group (formula 008) and a fluorene-2,7-diyl group (formula 009), and particularly preferably a 1,4-phenylene group (formula 001) and a fluorene-2,7-diyl group (formula 009). In formula (4), k is preferably 1.

In the constitutional unit represented by formula (4), examples of a preferable 4,4'-biphenyl-diyl group (formula BP-1) include constitutional units represented by the following formulas BP-1-1 to BP-1-10.

[Chemical Formula 27]

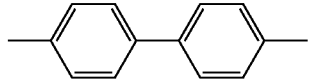
BP-1-1

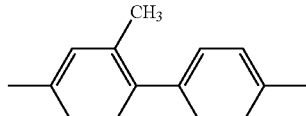
BP-1-2

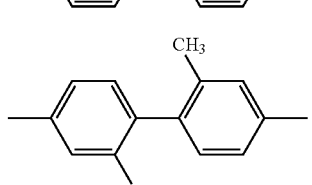
BP-1-3

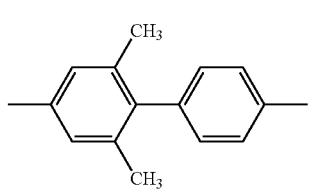
BP-1-4

BP-1-5 

BP-1-6 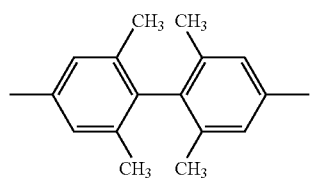

BP-1-7 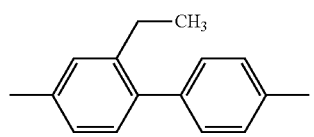

BP-1-8 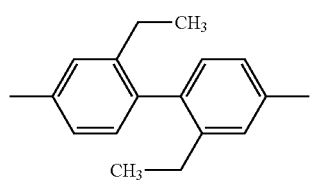

BP-1-9 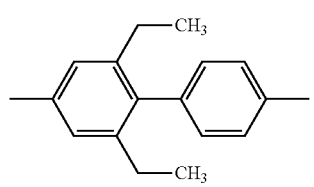

BP-1-10 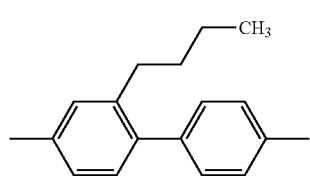

TP-1-3 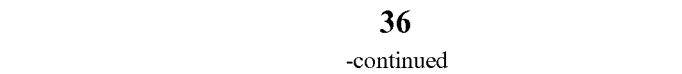

TP-1-4 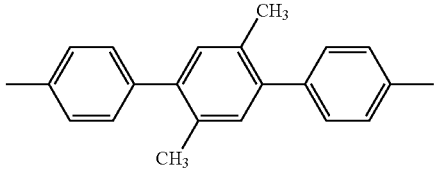

TP-1-5 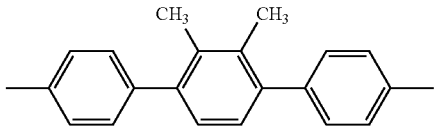

TP-1-6 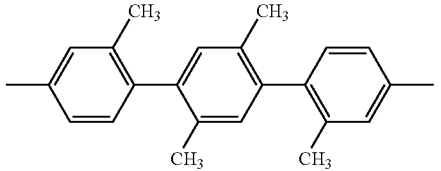

TP-1-7 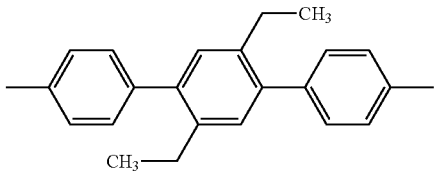

TP-1-8 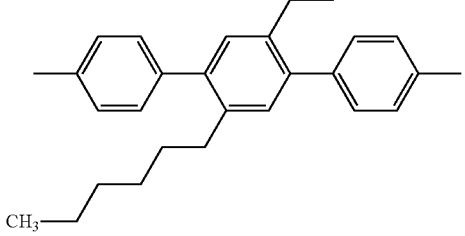

In the constitutional unit represented by formula (4), examples of a preferable 4,4"-terphenyl-diyl group (formula TP-1) include constitutional units represented by the following formulas TP-1-1 to TP-1-8.

[Chemical Formula 28]

TP-1-1 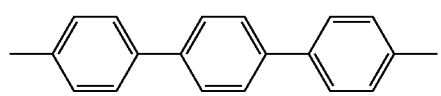

TP-1-2 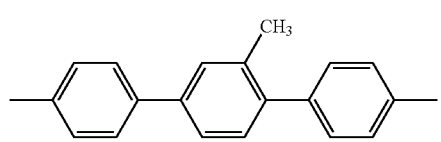

Only one or two or more of the constitutional units represented by formula (4) may be contained in the polymer compound. Only one or two or more of the constitutional units represented by formula (4) may be contained in the block (A).

In the block (A) contained in the polymer compound, it is preferable that constitutional units represented by formula (3) be arranged to be directly bonded to both sides of the constitutional unit represented by formula (2). A light-emitting device obtained with the polymer compound comprising such a block (A) has an excellent brightness stability and a long life.

Similarly, for an excellent brightness stability and a long life of the obtained light-emitting device, it is preferable to arrange the constitutional units represented by formula (2) to be directly bonded to both sides of the constitutional unit represented by formula (3) or the constitutional unit represented by formula (4).

The block (A) comprising the constitutional units represented by formulas (2), (3) and (4) is preferably conjugated for the entire portion of the block, i.e., block (A) preferably comprises no disconjugated site with the block (A) having the aforementioned structure, the light-emitting device obtained with the polymer compound has an excellent brightness stability and long life.

The constitutional unit represented by formula (3) preferably comprises either one or both of the constitutional units represented by formulas (1) and (7). When the constitutional unit represented by formula (3) contained in the block (A) is the constitutional unit represented by formula (1), it tends to easily obtain a light-emitting device having a high light-emitting efficiency. When the constitutional unit represented by formula (3) contained in the block (A) is the constitutional unit represented by formula (7), it tends to easily obtain a light-emitting device having an excellent brightness stability and long life.

In the constitutional unit represented by formula (1), the group represented by $R^{1a}$ is preferably an alkyl group, an aryl group or an aralkyl group. For satisfactory reactivity of a monomer which is a raw material of the constitutional unit in polymerization, the group represented by $R^{1a}$ is more preferably an alkyl group, and even more preferably a methyl group, an ethyl group, a propyl group, a butyl group, a pentyl group and a hexyl group, and particularly preferably a methyl group.

In formula (1), for an improved balance between the heat resistance and solubility of the polymer compound in an organic solvent, the group represented by $R^{1b}$ is preferably a hydrogen atom, an alkyl group, an aryl group, a monovalent aromatic heterocyclic group and a substituted amino group, and more preferably a hydrogen atom; an alkyl group; an unsubstituted aryl group or an aryl group substituted with an alkyl group, an aryl group, a monovalent aromatic heterocyclic group or a substituted amino group; an unsubstituted monovalent aromatic heterocyclic group or a monovalent aromatic heterocyclic group substituted with an alkyl group, an aryl group or a monovalent aromatic heterocyclic group; and a diaryl-substituted amino group, and even more preferably a hydrogen atom, an alkyl group, and an unsubstituted aryl group or an aryl group substituted with an alkyl group or an aryl group, and particularly preferably a hydrogen atom, an alkyl group, and an unsubstituted phenyl group or a phenyl group substituted with an alkyl group or an aryl group.

In formula (1), for a satisfactory driving voltage for the light-emitting device obtained with the polymer compound, the group represented by $R^{1b}$ is preferably a hydrogen atom, an alkyl group, an aryl group, a monovalent aromatic heterocyclic group, and a substituted amino group, and more preferably an unsubstituted aryl group or an aryl group substituted with an alkyl group, an aryl group, a monovalent aromatic heterocyclic group or a substituted amino group; an unsubstituted monovalent aromatic heterocyclic group or a monovalent aromatic heterocyclic group substituted with an alkyl group, an aryl group or a monovalent aromatic heterocyclic group; and a diaryl-substituted amino group, even more preferably an aryl group substituted with a monovalent aromatic heterocyclic group or a substituted amino group; an unsubstituted monovalent aromatic heterocyclic group or a monovalent aromatic heterocyclic group substituted with an alkyl group, an aryl group or a monovalent aromatic heterocyclic group; and a diaryl-substituted amino group, and particularly preferably a phenyl group substituted with a monovalent aromatic heterocyclic group or a substituted amino group; a pyridyl group substituted with an alkyl group, an aryl group or a monovalent aromatic heterocyclic group; a pyrazyl group substituted with an alkyl group, an aryl group or a monovalent aromatic heterocyclic group; a pyridazyl group substituted with an alkyl group, an aryl group or a monovalent aromatic heterocyclic group; a pyrimidyl group substituted with an alkyl group, an aryl group or a monovalent aromatic heterocyclic group; a 1,3,5-triazin-2-yl group substituted with an alkyl group, an aryl group or a monovalent aromatic heterocyclic group; a pyridyl group and a diarylamino group.

In formula (1), for satisfactory reactivity of a monomer which is a raw material in polymerization, the group represented by $R^{1c}$ is preferably a hydrogen atom, an alkyl group, an aryl group or a monovalent aromatic heterocyclic group, and more preferably a hydrogen atom.

Examples of the constitutional unit represented by formula (1) include constitutional units represented by the following formulas 1-001 to 1-017, 1-101 to 1-113 and 1-201 to 1-208.

[Chemical Formula 29]

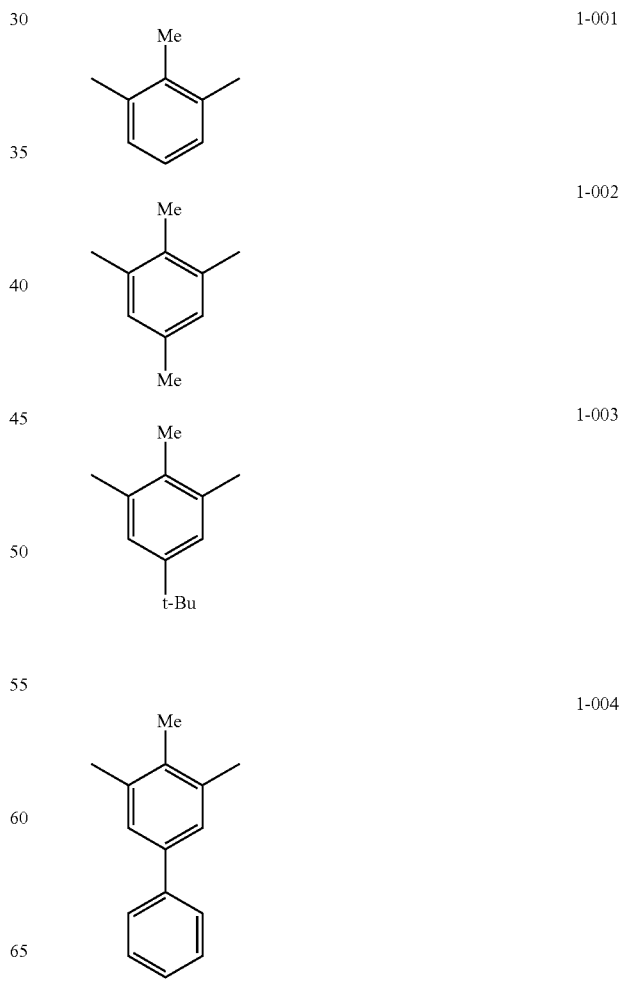

1-005 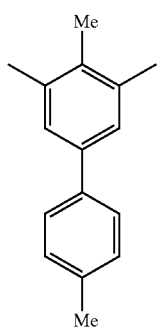 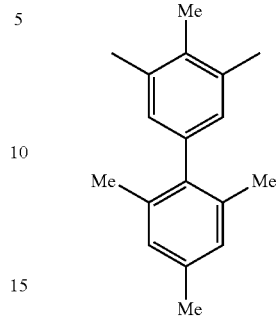 1-009
1-006 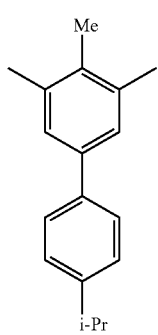 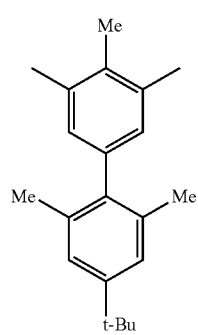 1-010
1-007 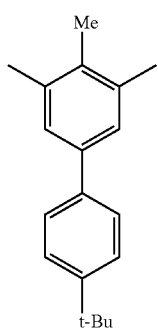 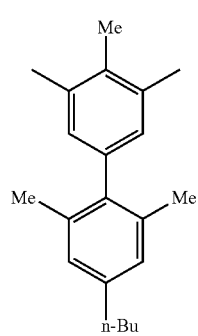 1-011
1-008 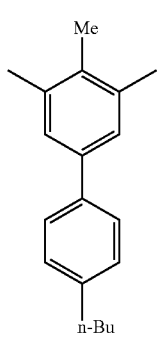 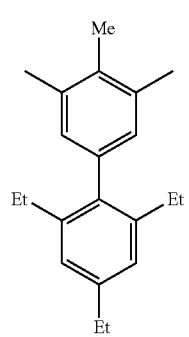 1-012
[Chemical Formula 30]

-continued
1-013 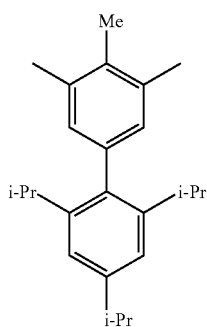
1-014 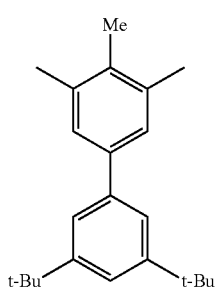
1-015 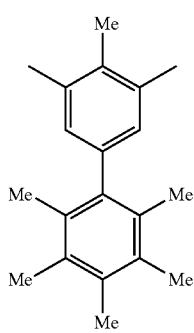
1-016 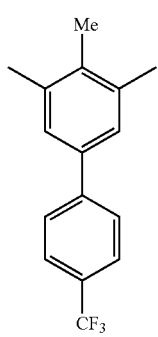
1-017 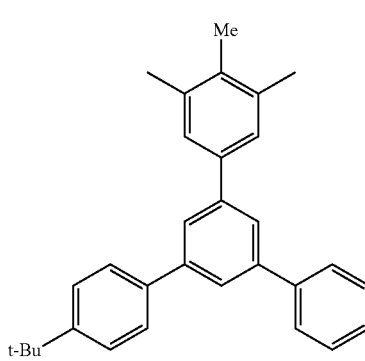
-continued
[Chemical Formula 31]
1-101 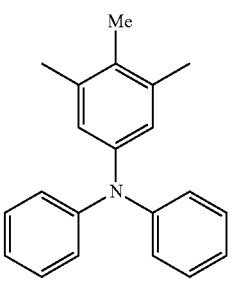
1-102 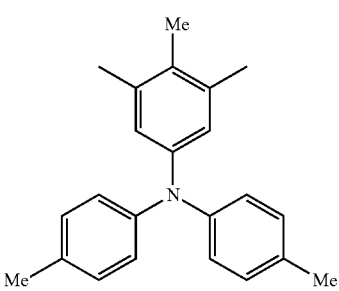
1-103 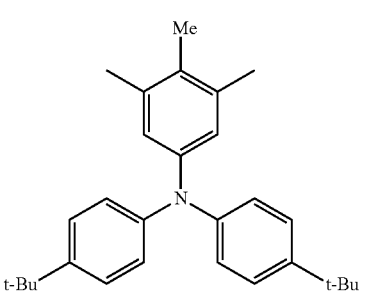
1-104 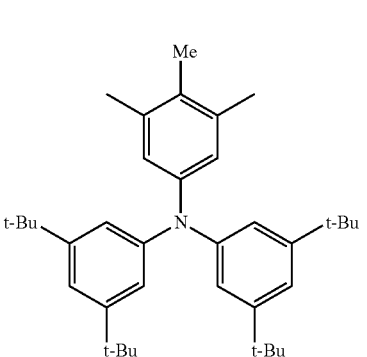
1-105 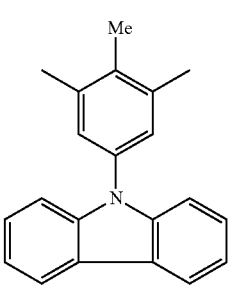

1-106
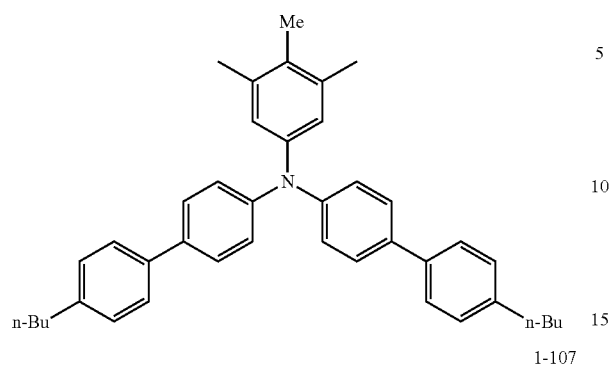
1-107
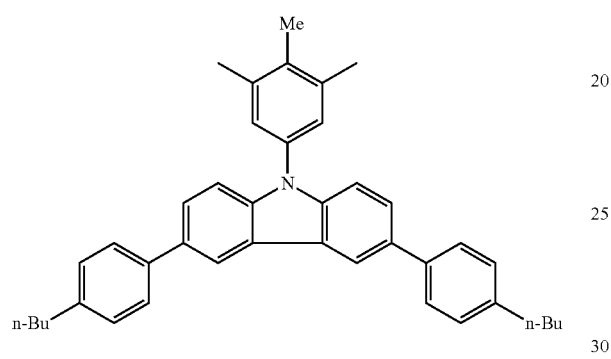
[Chemical Formula 32]
1-108
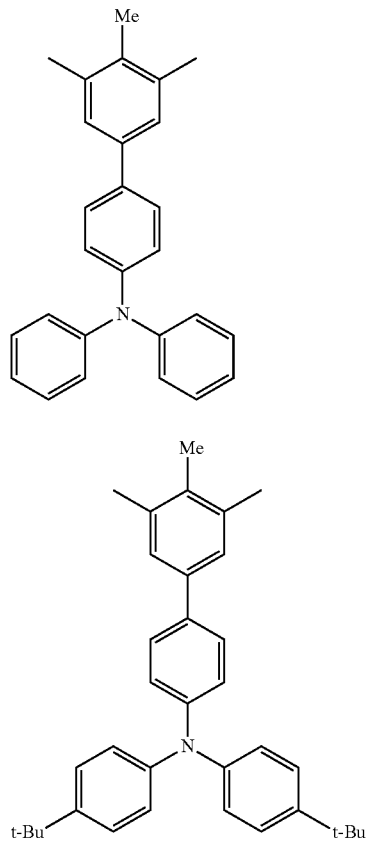
1-109
1-110
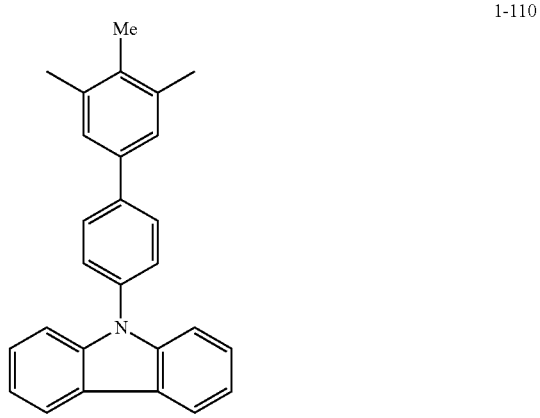
1-111
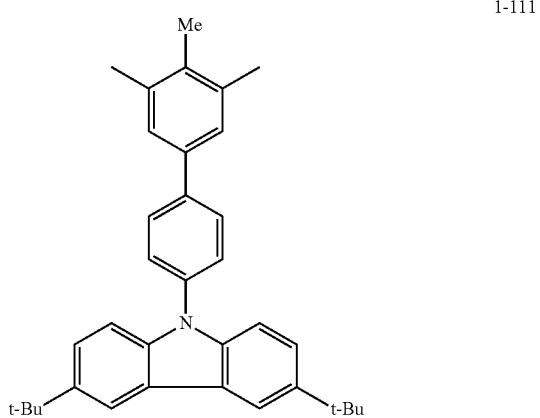
1-112

1-113
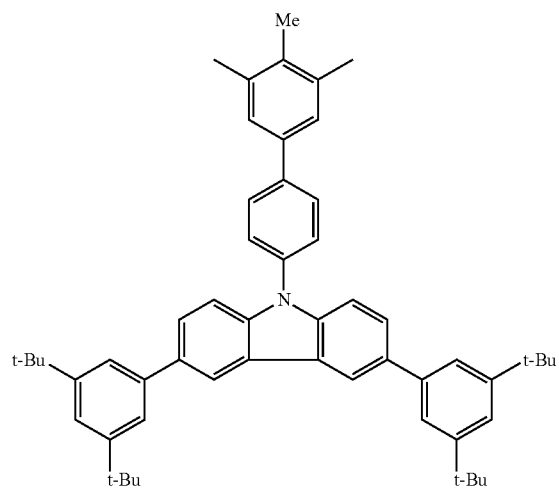
[Chemical Formula 33]
1-201
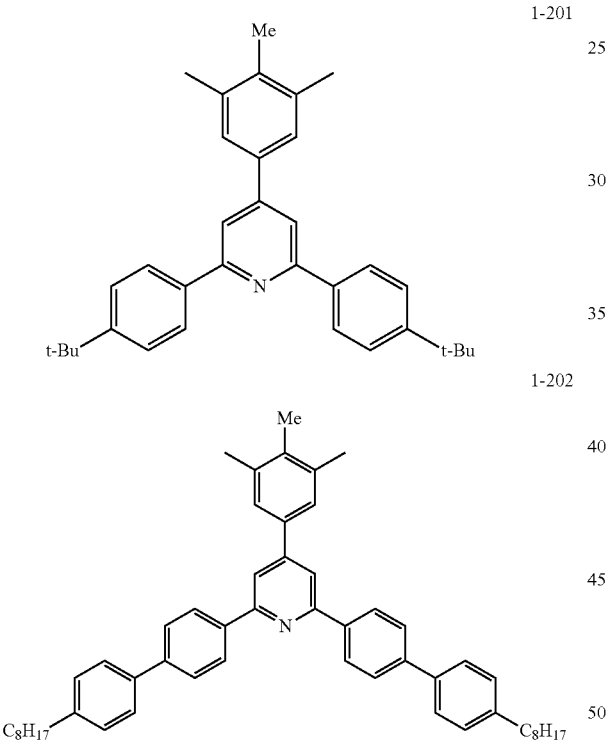
1-202
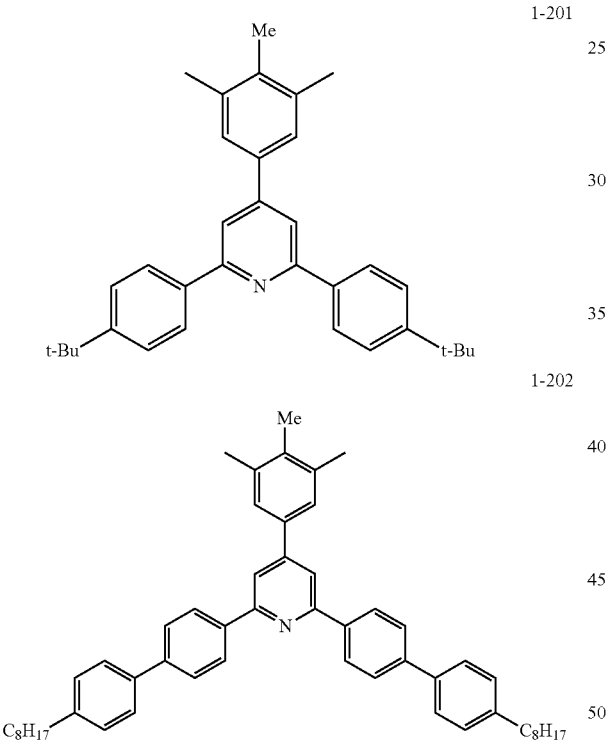
1-203
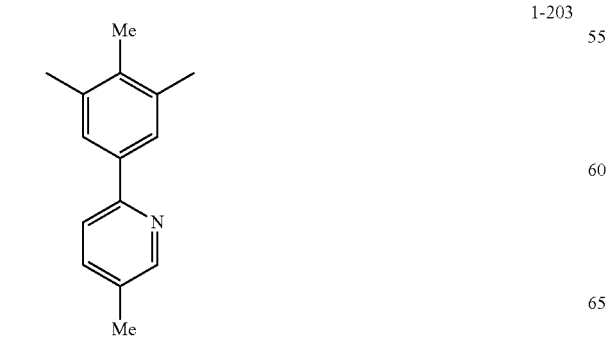
1-204
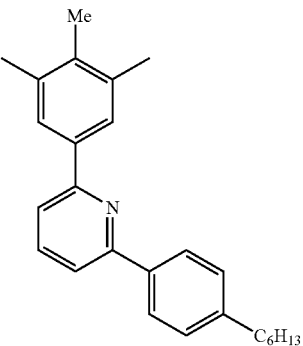
1-205
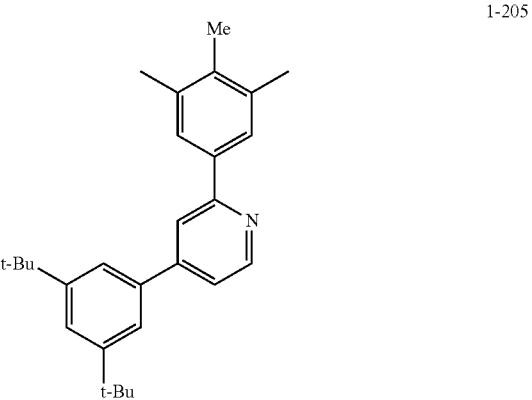
[Chemical Formula 34]
1-206
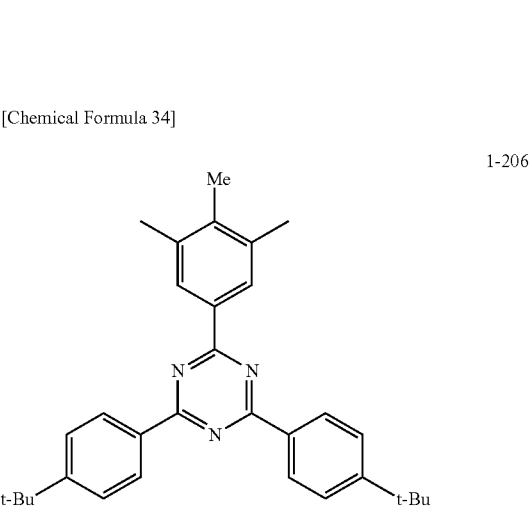
1-207
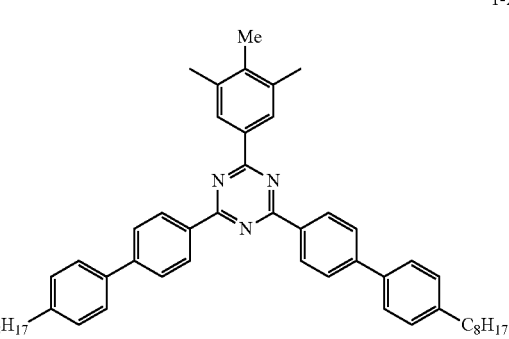

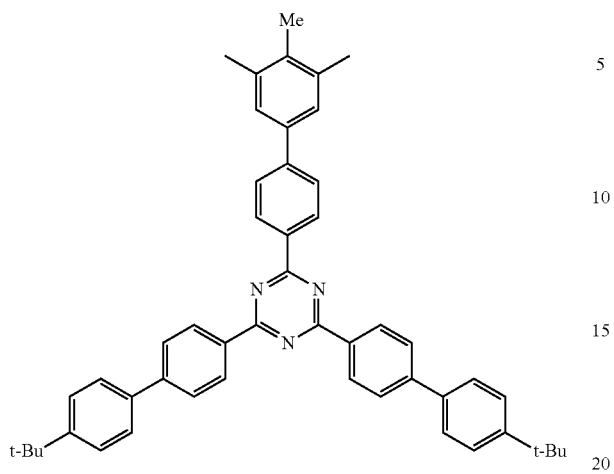

1-208

Among them, the constitutional unit represented by formula (1) is preferably constitutional units represented by formulas 1-001 to 1-017, more preferably a constitutional unit represented by formula 1-001 or 1-017, and particularly preferably a constitutional unit represented by formula 1-001.

Only one or two or more of the constitutional units represented by formula (1) may be contained in the polymer compound.

In the constitutional unit represented by formula (7), for an improved balance between the heat resistance and solubility of the polymer compound in an organic solvent, the groups represented by $R^{7a}$ and $R^{7c}$ are preferably an alkyl group, an aryl group, a monovalent aromatic heterocyclic group, an alkoxy group, an aryloxy group, an aralkyl group or a substituted amino group, more preferably an alkyl group or an aralkyl group, even more preferably an alkyl group, and particularly preferably a propyl group, an isopropyl group, a butyl groups, a sec-butyl groups, an isobutyl groups, a pentyl groups, an isoamyl groups, a hexyl groups, a cyclohexyl groups, a heptyl groups, an octyl groups, 2-ethylhexyl groups, a cyclohexylmethyl groups, a nonyl groups, a decyl groups, 3,7-dimethyloctyl groups or a dodecyl groups.

In formula (7), for satisfactory heat resistance and solubility of the polymer compound to an organic solvent and satisfactory reactivity of a monomer which is a raw material in polymerization, the groups represented by $R^{7b}$ and $R^{7d}$ are preferably a hydrogen atom, an alkyl group, an alkoxy group, an aryl group, a monovalent aromatic heterocyclic group or an aralkyl group, more preferably a hydrogen atom or an alkyl group, and particularly preferably a hydrogen atom.

The constitutional unit represented by formula (7) is preferably constitutional units represented by the following formulas 7-001 to 7-019 and 7-101 to 7-105. Among them, the constitutional unit represented by formula (7) is more preferably constitutional units represented by formulas 7-001 to 7-019.

[Chemical Formula 35]

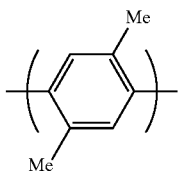

7-001

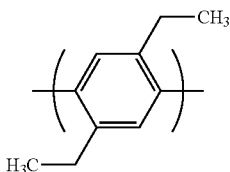

7-002

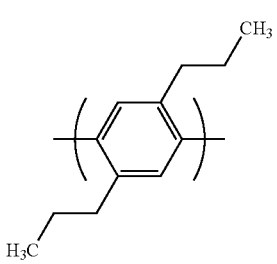

7-003

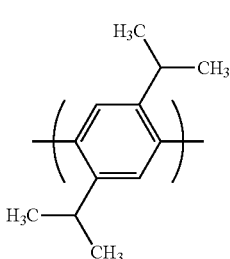

7-004

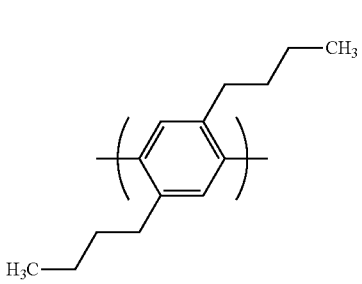

7-005

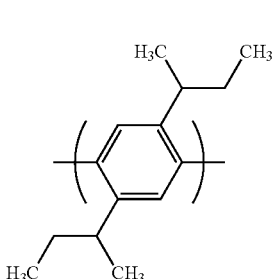

7-006

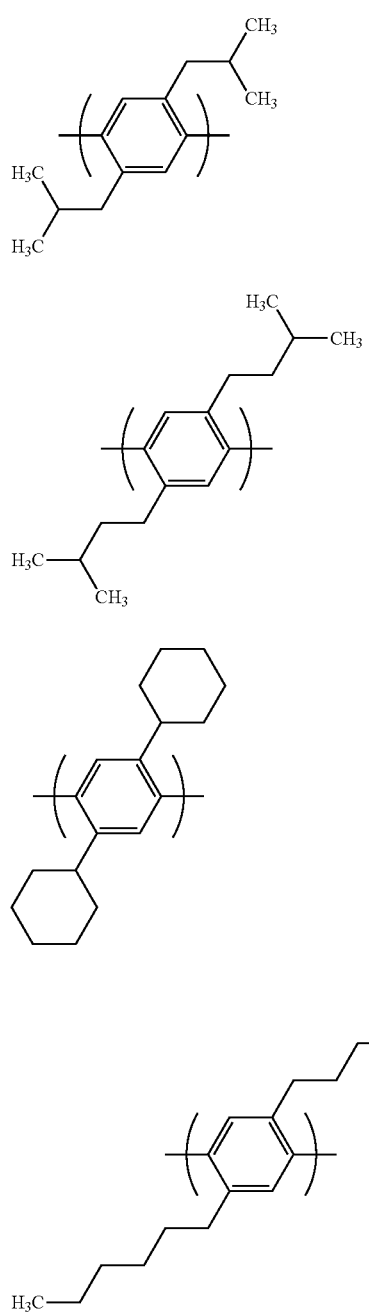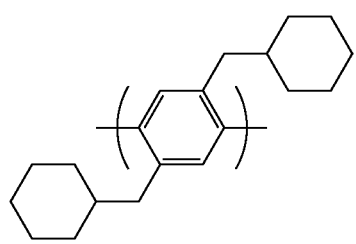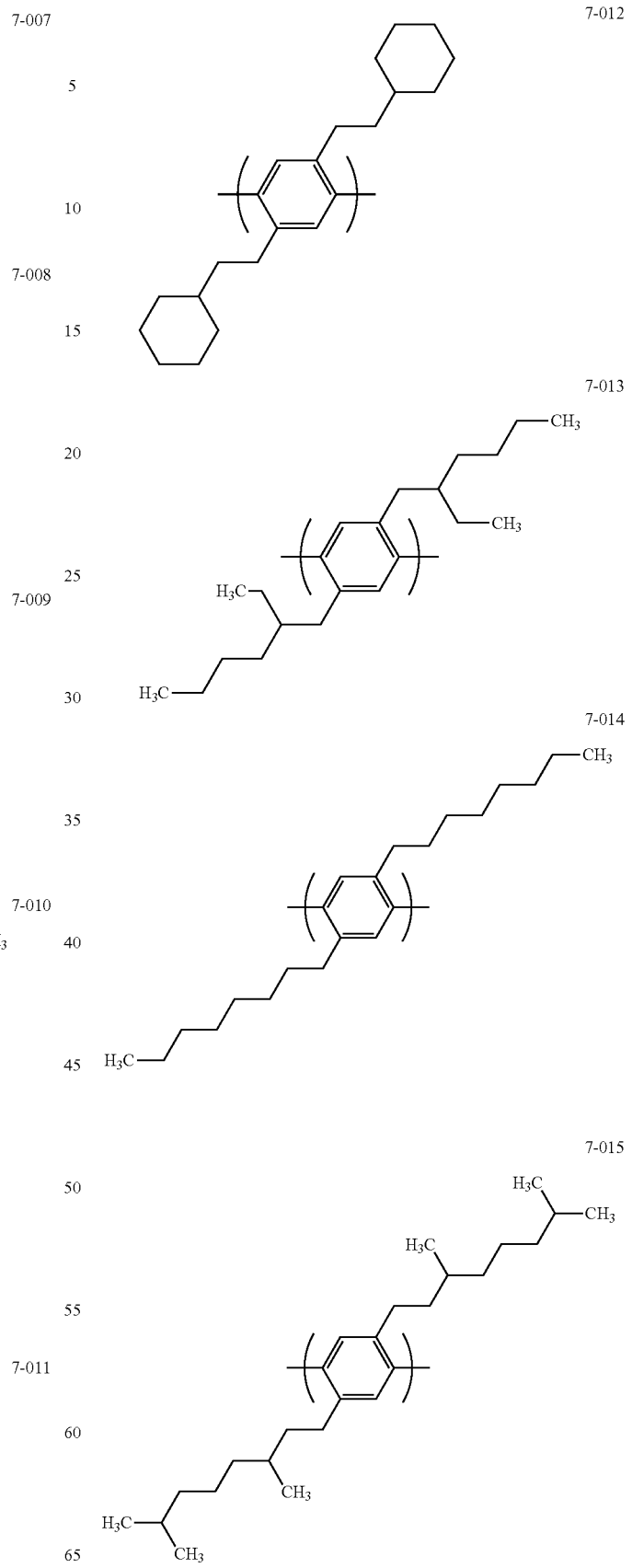

[Chemical Formula 37]

7-016 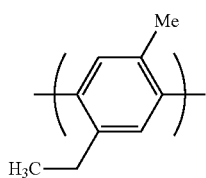

7-017 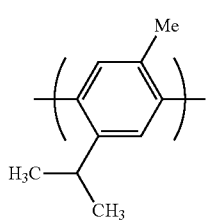

7-018 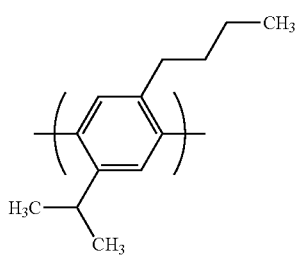

7-019 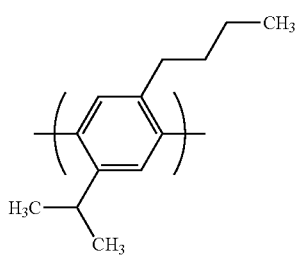

7-101 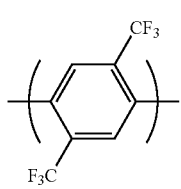

7-102 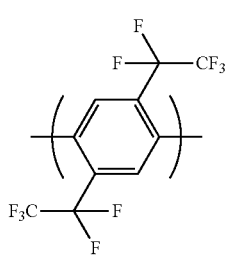

7-103 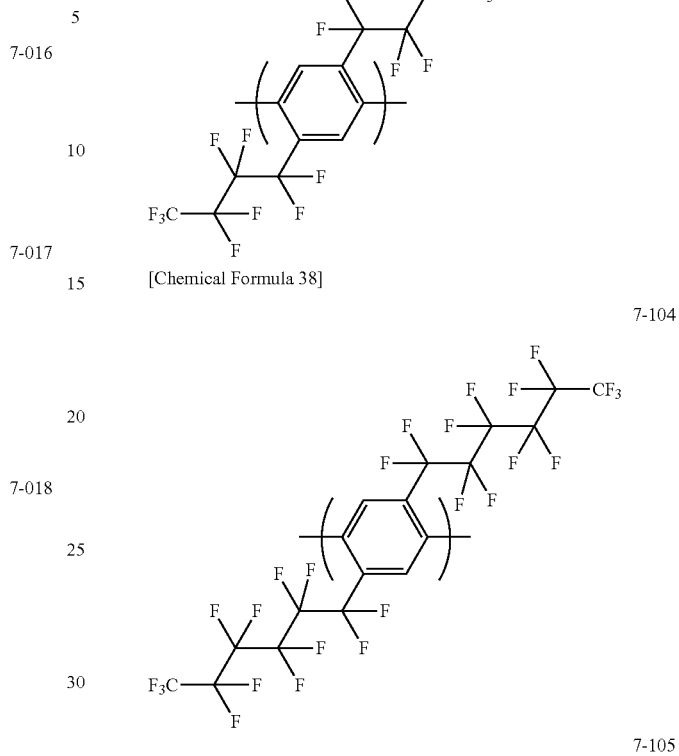

[Chemical Formula 38]

7-104 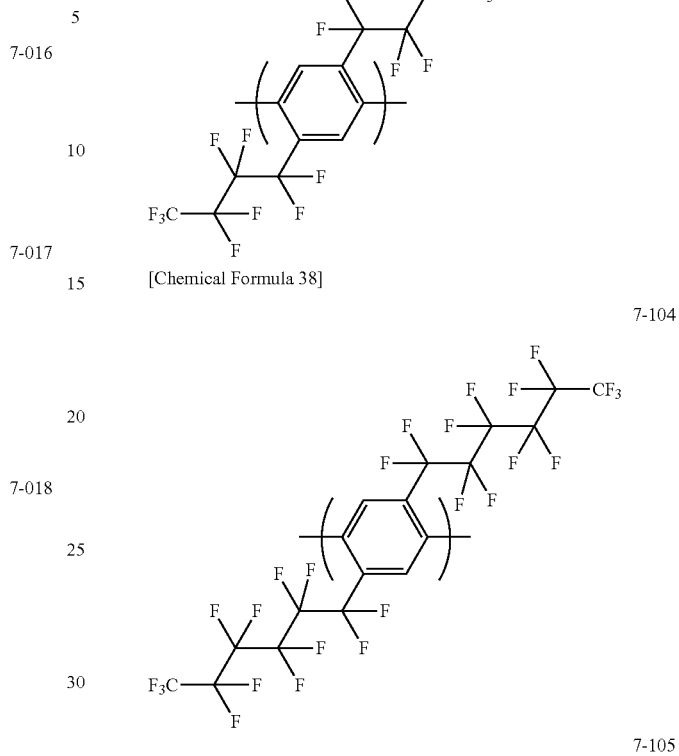

7-105 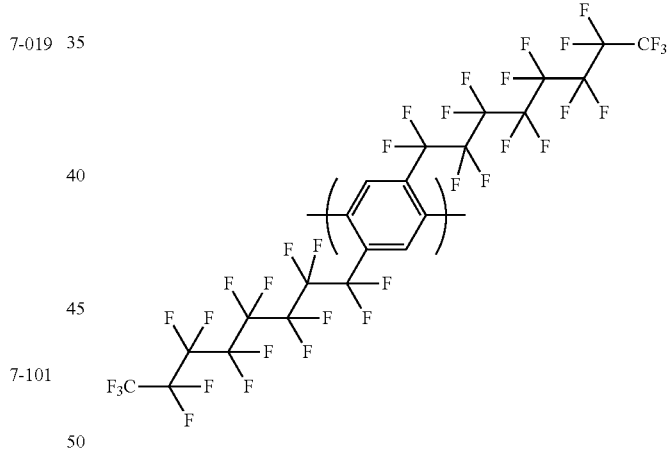

On the other hand, the constitutional unit represented by formula (4) preferable as the constitutional unit represented by formula (I) preferably comprises at least one of the constitutional units represented by formulas (9), (10) and (11). In formula (9), for an improved balance between characteristics such as the heat resistance and solubility of the polymer compound in an organic solvent, the groups represented by $R^{9a}$ and $R^{9c}$ are preferably an aryl group or an alkyl group, and more preferably an unsubstituted aryl group or an aryl group substituted with an alkyl group, an alkoxy group, an aryl group or a substituted amino group, or an alkyl group.

The constitutional unit represented by formula (9) is preferably constitutional units represented by the following formulas 9-001 to 9-020. Among them, the constitutional unit represented by formula (9) is more preferably constitutional units represented by formulas 9-001 to 9-012 and 9-017 to 9-020.
[Chemical Formula 39]
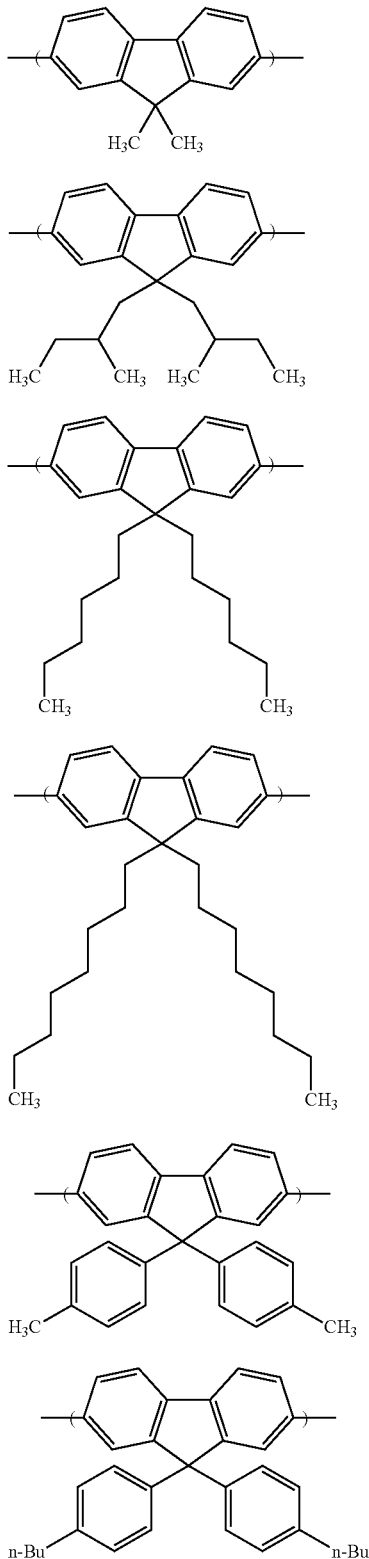
9-001
9-002
9-003
9-004
9-005
9-006
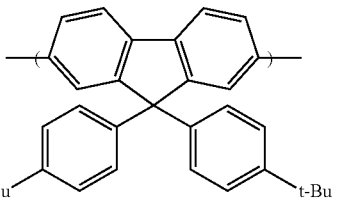
9-007
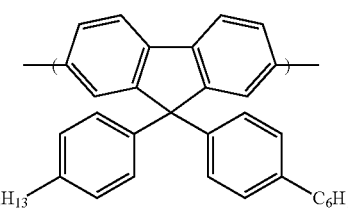
9-008
[Chemical Formula 40]
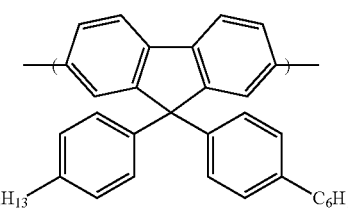
9-009
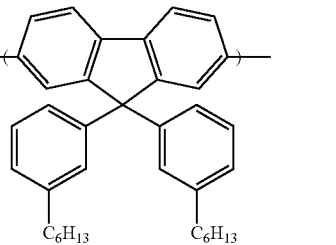
9-010
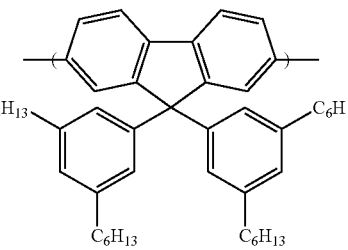
9-011
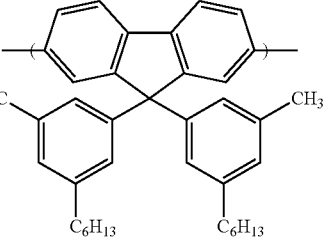
9-012
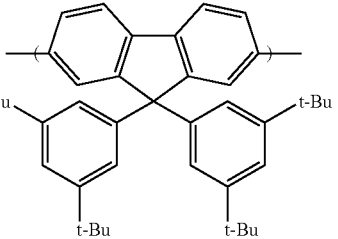

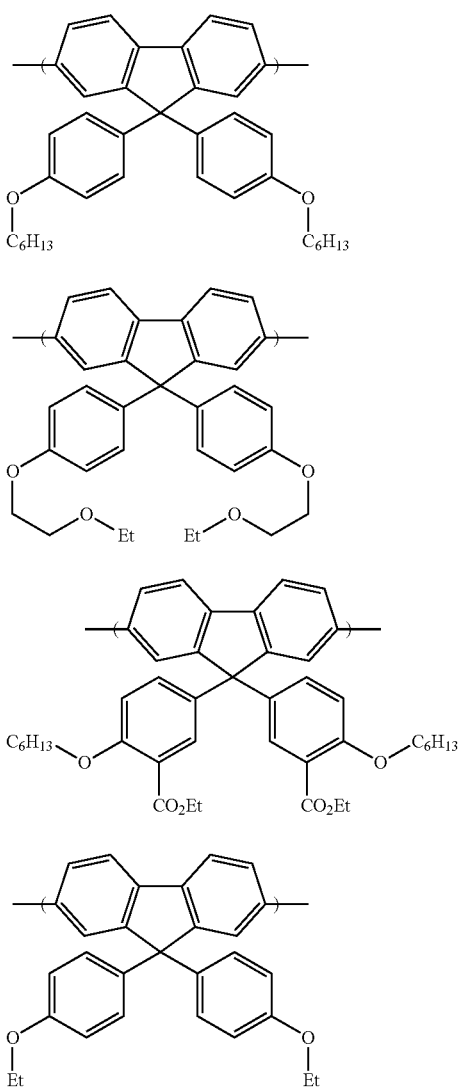

[Chemical Formula 41]

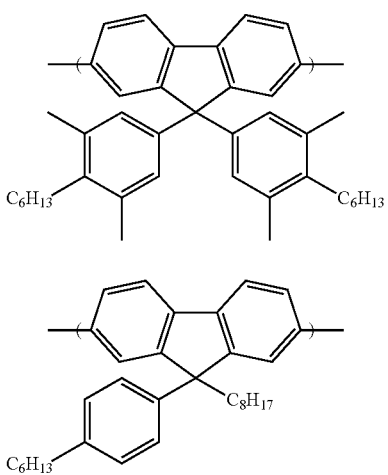

(Block (B))

The polymer compound according to this embodiment may have the block (A) described above and a block (B), which has a structure different from that of the block (A). With the block having the structure as shown below as the block (B), the heat resistance of the polymer compound can be improved.

The block (B) may comprise the constitutional unit represented by formula (0) as the block (A). However, for the polymer compound, a proportion of the constitutional unit represented by formula (0) contained in the blocks preferably satisfies the following condition. More specifically, for the polymer compound, a value represented by the following expression (VII) is preferably 0.5 or less. Thereby the driving voltage required for the desired brightness can be further reduced and the life of the device can be improved. For the satisfactory effect described above, the value represented by expression (VII) is more preferably 0.4 or less.

$$[B]/[A] \quad (VII)$$

In expression (VII), [A] represents a mol % of the constitutional unit represented by formula (0) contained in the block (A); and [B] represents a mol % of the constitutional unit represented by formula (0) in the block (B).

The block (B) preferably comprises one of the constitutional unit represented by formula (IB) and the constitutional unit represented by formula (II), and more preferably comprises both the constitutional unit represented by formula (IB) and the constitutional unit represented by formula (II).

<Constitutional Unit Represented by Formula (IB)>

The constitutional unit represented by formula (IB) preferably comprises either one or both of the constitutional units represented by formulas (3B) and (4B). More specifically, the constitutional unit represented by formula (3B) is preferably at least one of the constitutional units represented by formulas (1B) and (7B). The constitutional unit represented by formula (4B) is preferably at least one of the constitutional units represented by formulas (9B), (10B) and (11B).

The constitutional unit represented by formula (IB) is preferably a constitutional unit similar to that represented by formula (I). Specifically, the constitutional units represented by formulas (3B), (4B), (1B), (7B), (9B), (10B) and (11B)

are preferably constitutional units similar to those represented by formulas (3), (4), (1), (7), (9), (10) and (11), respectively.

<Constitutional Unit Represented by Formula (II)>

The constitutional unit represented by formula (II) contained in the block (B) is preferably the constitutional unit represented by formula (5). With the block (B) having the constitutional unit represented by formula (5), the heat resistance of the polymer compound tends to improve and the obtained light-emitting device tends to exhibit a satisfactory brightness even at a low driving voltage. Only one or two or more of the constitutional units represented by formula (5) may be contained in the polymer compound.

In formula (5), the groups represented by $Ar^{5a}$, $Ar^{5b}$, $Ar^{5c}$, $Ar^{5d}$ and $Ar^{5h}$ are preferably arylene groups, and among them, more preferably a 1,4-phenylene group (the aforementioned formula 001) or a fluorene-2,7-diyl group (the aforementioned formula 009), and particularly preferably a 1,4-phenylene group (the aforementioned formula 001).

In formula (5), the groups represented by $Ar^{5e}$, $Ar^{5f}$ and $Ar^{5g}$ are preferably an aryl group, and more preferably phenyl groups substituted with an alkyl group. The groups represented by $Ar^{5d}$, $Ar^{5e}$, $Ar^{5f}$ and $Ar^{5g}$ may each form a 5- to 7-membered ring by bonding to a group other than the concerned group which bonds to a nitrogen atom to which the concerned group bonds, directly or via a group represented by —O—, —S—, —C(=O)—, —C(=O)—O—, —N($R^A$)—, —C(=O)—N($R^A$) or —C($R^A$)$_2$—. $R^A$ in these groups represents an alkyl group, an aryl group, a monovalent aromatic heterocyclic group or an aralkyl group, and is preferably an alkyl group.

In formula (5), with respect to $n_1$, $n_2$, $n_3$, $n_4$, $n_5$, $n_6$ and $n_7$, $n_1$ and $n_2$ are preferably each independently 0 or 1, $n_3$ is preferably 0 or 1, and $n_4$, $n_5$, $n_6$ and $n_7$ are preferably each independently 0, 1 or 2, and $n_1$ and $n_2$ are more preferably each independently 0 or 1, $n_3$ is more preferably 0, $n_4$ and $n_6$ are more preferably each independently 1, and $n_5$ and $n_7$ are more preferably each independently 1 or 2.

The constitutional unit represented by formula (5) is preferably constitutional units represented by formulas 5-001 to 5-004. In the following formulas, R has the same definition as above.

[Chemical Formula 42]

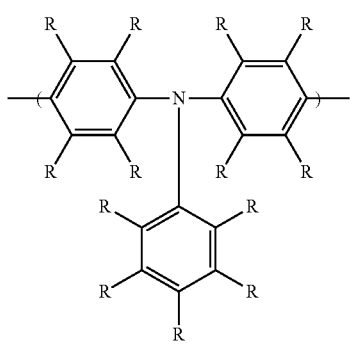

5-001

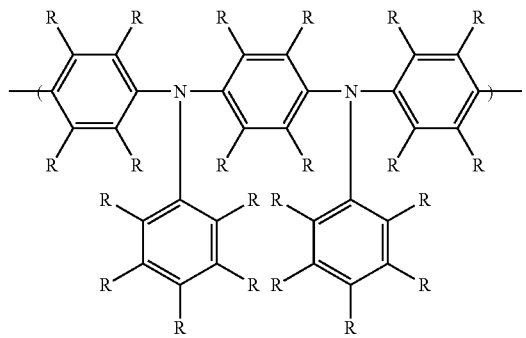

5-002

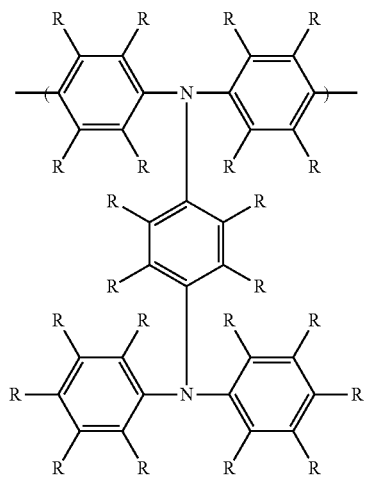

5-003

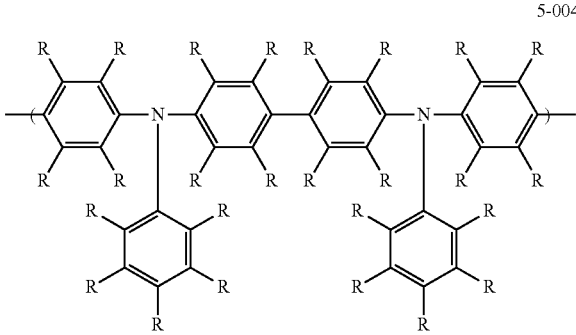

5-004

For improved light-emitting efficiency of the light-emitting device using the polymer compound, the constitutional unit represented by formula (5) is particularly preferably constitutional units represented by formula 5-001 or 5-002.

In the block (B), for more improved light-emitting efficiency of the light-emitting device, at least one of the constitutional units represented by formulas (3B) and (4B) is arranged to be directly bonded to both sides of the constitutional unit represented by formula (5).

(Constitutional Unit Derived from Phosphorescent Light-Emitting Compound)

The polymer compound according to this embodiment comprises the block (A) described above and also the block (B) described above and blocks other than these as necessary. In this polymer compound, constitutional units derived from phosphorescent light-emitting compounds may be contained in the block (A), the block (B), and blocks other than these.

Constitutional units derived from phosphorescent light-emitting compounds are constitutional units having a structure derived from phosphorescent light-emitting compounds. Examples of such constitutional units include: a residue derived by removing one hydrogen atom of a phosphorescent light-emitting compound; an arylene group or a divalent aromatic heterocyclic group including a residue derived by removing one hydrogen atom of a phosphorescent light-emitting compound as a substituent; a residue derived by removing two hydrogen atoms of a phosphorescent light-emitting compound; and a residue derived by removing three hydrogen atoms of a phosphorescent light-emitting compound. When the constitutional unit derived from a phosphorescent light-emitting compound is a residue derived by removing three hydrogen atoms of a phosphorescent light-emitting compound, the polymer compound has a branched structure in this constitutional unit.

Examples of phosphorescent light-emitting compounds capable of forming the constitutional unit derived from a phosphorescent light-emitting compound include the following compounds. Examples of applicable phosphorescent light-emitting compounds include known compounds, such as triplet emitting complexes, and compounds conventionally utilized as light-emitting materials for low-molecular organic electroluminescence (EL) devices. Examples of phosphorescent light-emitting compounds include the compounds represented by formula (8).

Examples of phosphorescent light-emitting compounds also include compounds described in Nature, (1998), 395, 151, Appl. Phys. Lett. (1999), 75(1), 4, Proc. SPIE-Int. Soc. Opt. Eng. (2001), 4105 (Organic Light-Emitting Materials and Devices IV), 119, J. Am. Chem. Soc., (2001), 123, 4304, Appl. Phys. Lett., (1997), 71(18), 2596, Syn. Met., (1998), 94(1), 103, Syn. Met., (1999), 99(2), 1361, Adv. Mater., (1999), 11(10), 852, Inorg. Chem., (2003), 42, 8609, Inorg. Chem., (2004), 43, 6513, Journal of the SID 11/1, 161 (2003), WO2002/066552, WO2004/020504, WO2004/020448 and the like.

For a high light-emitting efficiency, compounds of which the sum of a square of an orbital coefficient of the outermost shell d-orbital of the central metal in the highest occupied molecular orbital (HOMO) of a metal complex occupies not less than ⅓ of the sum of a square of orbital coefficients of all atoms are particularly preferably applied as the phosphorescent light-emitting compounds. Examples of such compounds include ortho-metalated complexes, which are transition metals having a central metal belonging to the 6th period.

Examples of a central metal of the triplet emitting complexes include metals, which are metal atoms of atomic numbers of 50 or more, having a spin-orbital interaction with the complex and capable of involving the intersystem crossing between a singlet state and a triplet state. The central metal is preferably gold, platinum, iridium, osmium, rhenium, tungsten, europium, terbium, thulium, dysprosium, samarium, praseodymium, gadolinium and ytterbium; more preferably gold, platinum, iridium, osmium, rhenium and europium; even more preferably gold, platinum, iridium and rhenium; particularly preferably gold and iridium; and notably preferably iridium.

Examples of the ligand of the triplet emitting complex with iridium as the central metal include ligands bonded to an iridium atom of 8-quinolinol and a derivative thereof, benzoquinolinol and a derivative thereof or the like by a nitrogen atom and an oxygen atom by coordinate bonding or covalent bonding, ligands bonded via a nitrogen atom and a carbon atom of 2-phenyl-pyridine and a derivative thereof or the like by coordinate bonding or covalent bonding, ligands bonded via a nitrogen atom and a carbon atom of 1-phenyl-isoquinoline and a derivative thereof or the like by coordinate bonding or covalent bonding, and ligands bonded via an oxygen atom of acetylacetone and a derivative thereof or the like by coordinate bonding or covalent bonding. The ligand of the triplet emitting complex with iridium as the central metal is more preferably 2-phenyl-pyridine and a derivative thereof, 1-phenyl-isoquinoline and a derivative thereof, and acetylacetone and a derivative thereof, and even more preferably 2-phenyl-pyridine and a derivative thereof and 1-phenyl-isoquinoline and a derivative thereof.

For a satisfactory solubility, the phosphorescent light-emitting compound is preferably a compound having a substituent such as an alkyl group, an alkoxy group, an optionally substituted aryl group, an optionally substituted monovalent aromatic heterocyclic group and a halogen atom. The substituents preferably have a total of 3 or more atoms, except for a hydrogen atom, more preferably 5 or more, even more preferably 7 or more, and particularly preferably 10 or more atoms. Furthermore, the substituents are preferably present for each ligand. In this case, the type of the substituents may be the same or different for each ligand.

Examples of such phosphorescent light-emitting compounds include the following compounds.

[Chemical Formula 43]

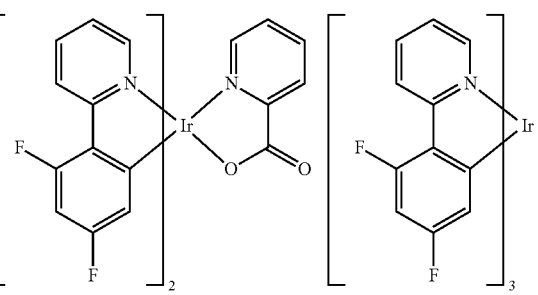

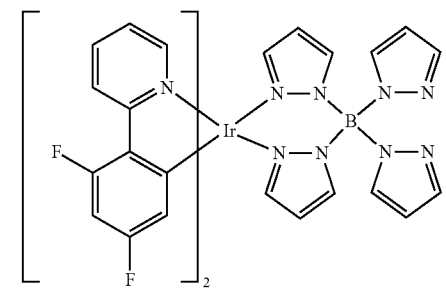

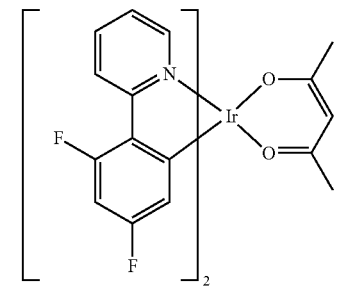

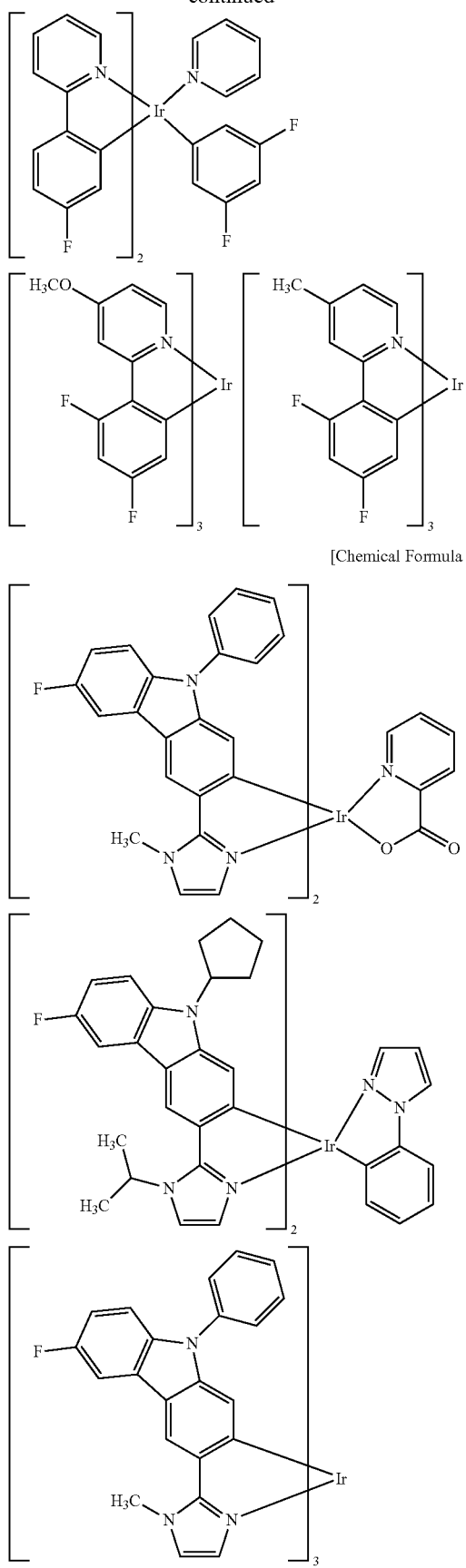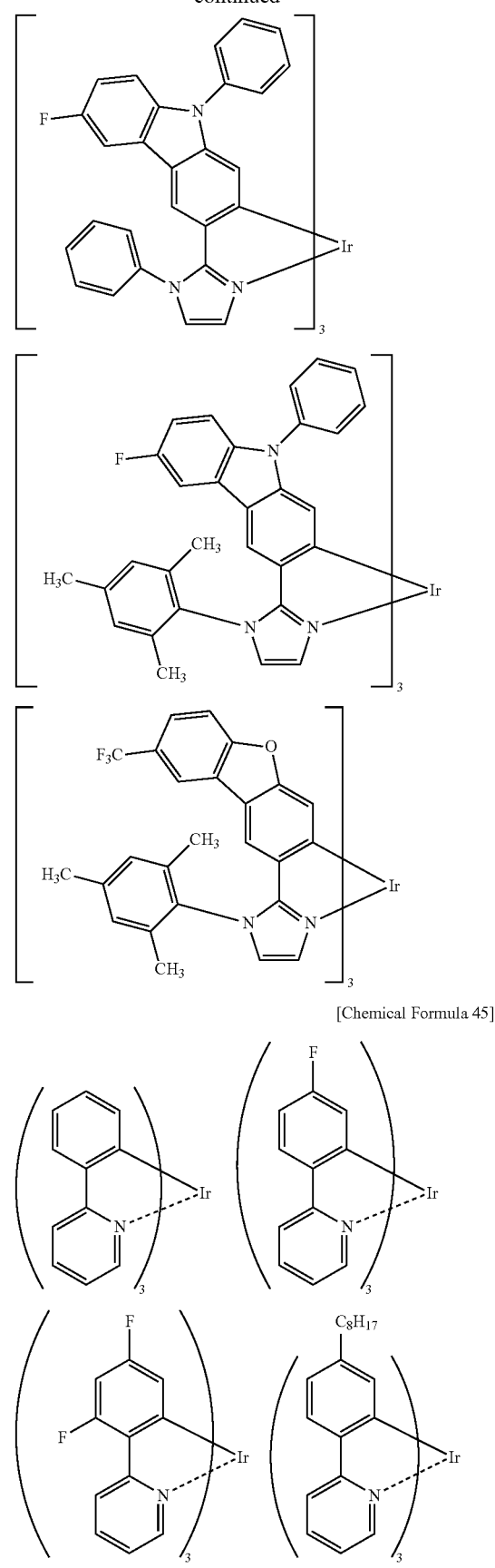

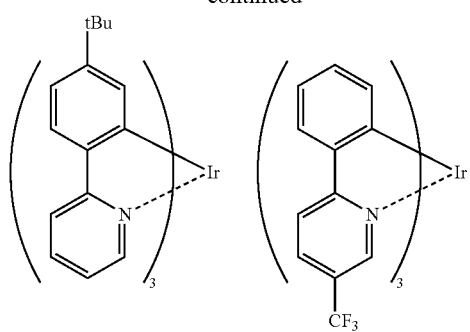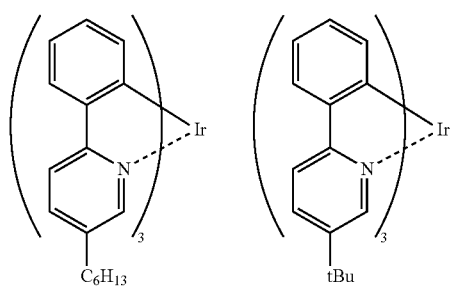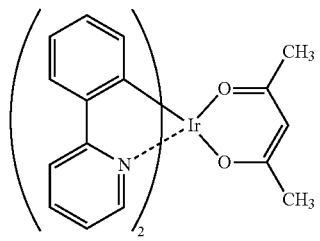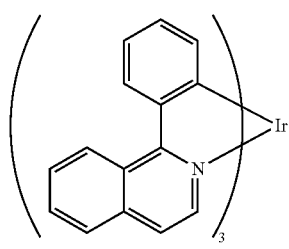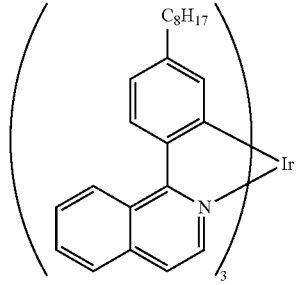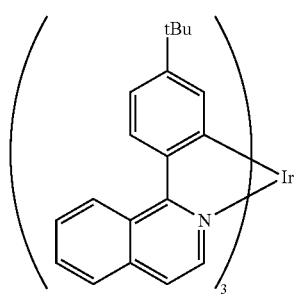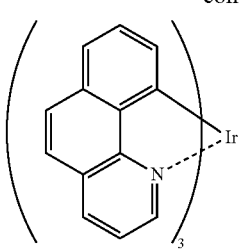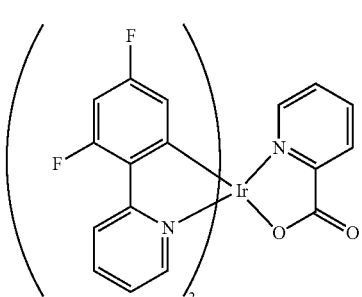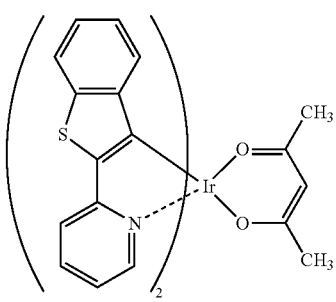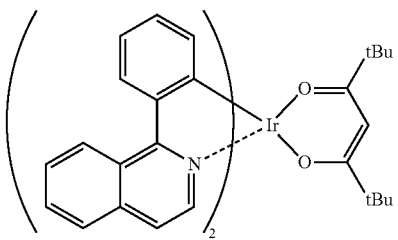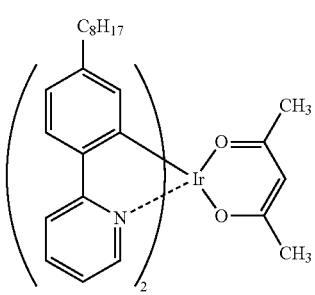

[Chemical Formula 46]
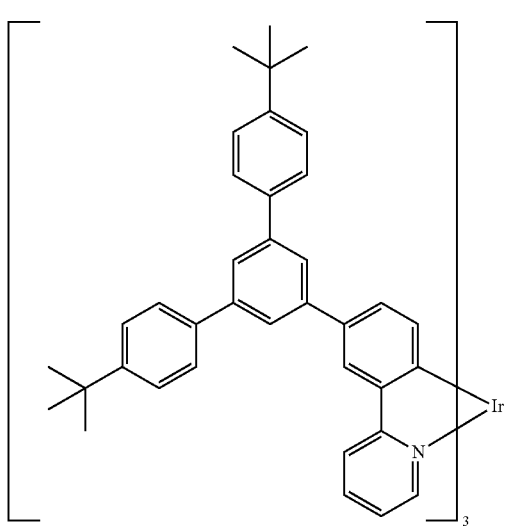
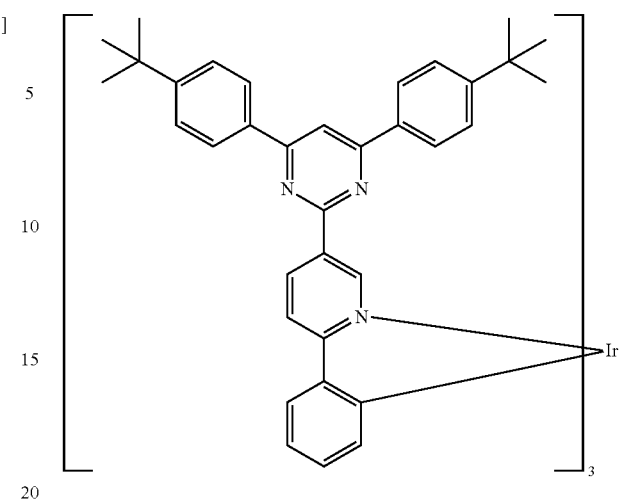
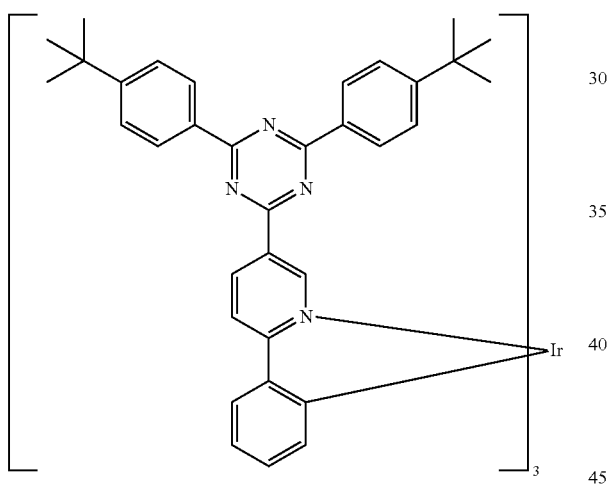
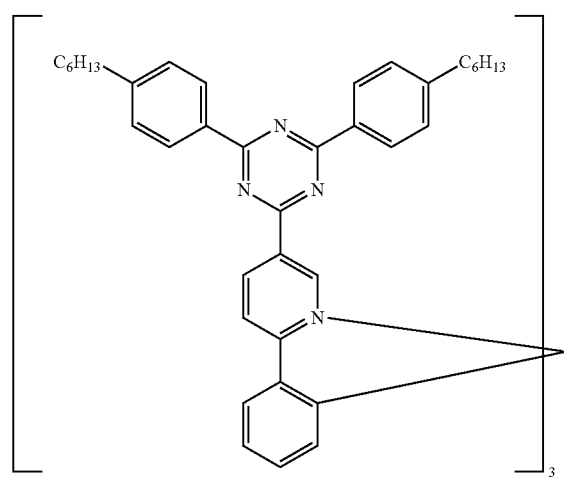
Examples of the constitutional unit derived from the phosphorescent light-emitting compound which may be contained in the polymer compound according to a preferred embodiment include the following constitutional units.

[Chemical Formula 47]
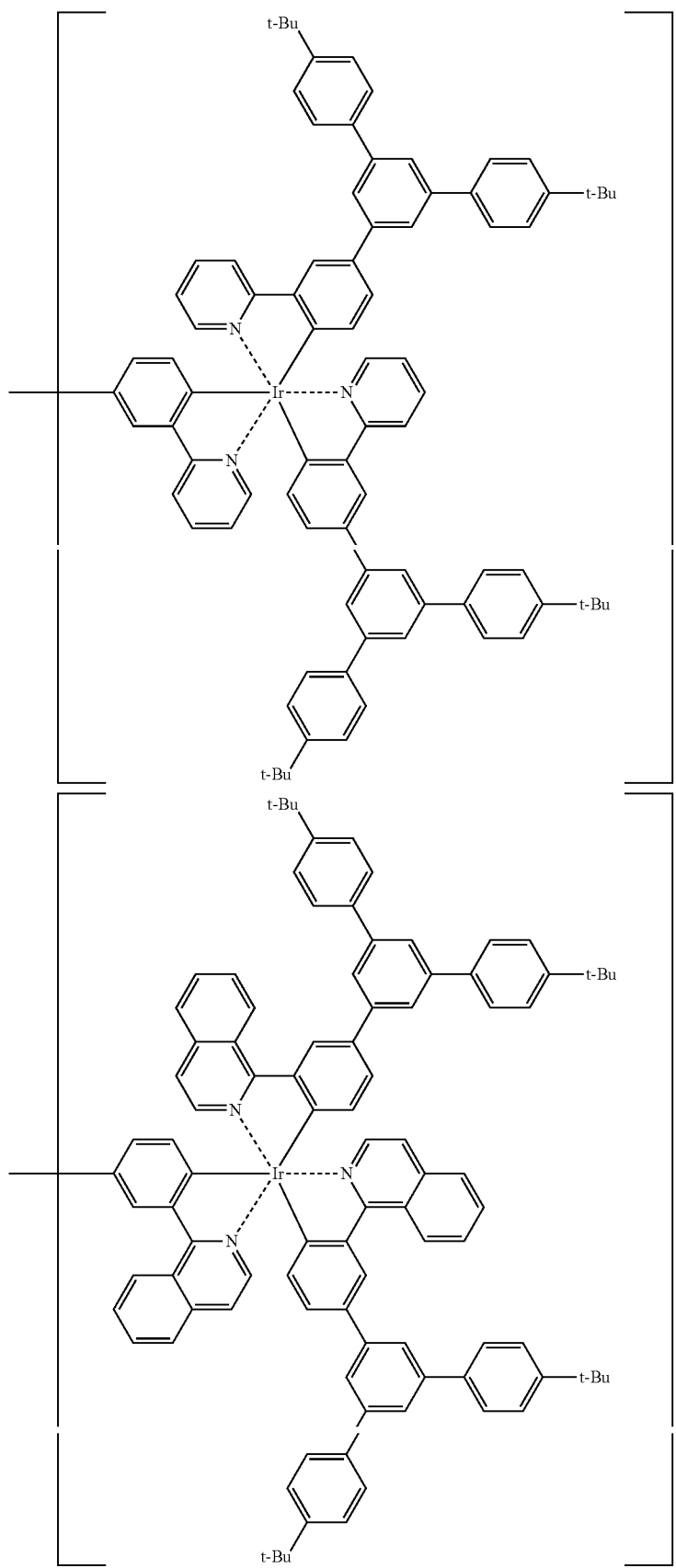

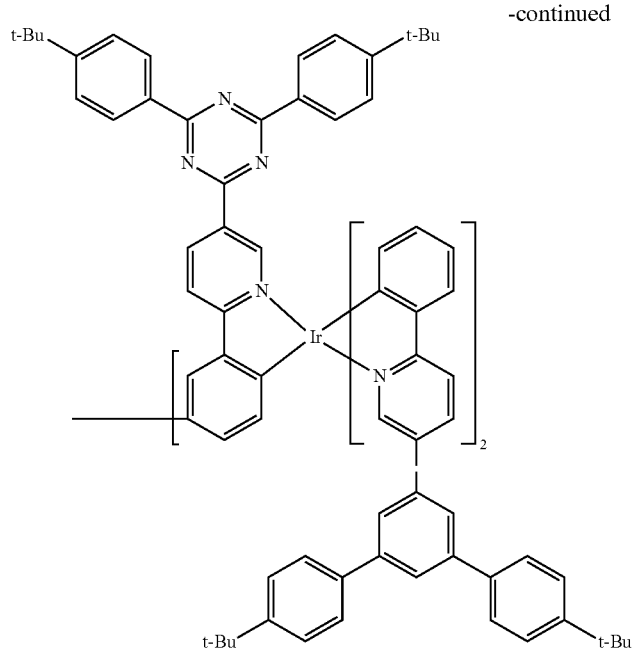
[Chemical Formula 48]
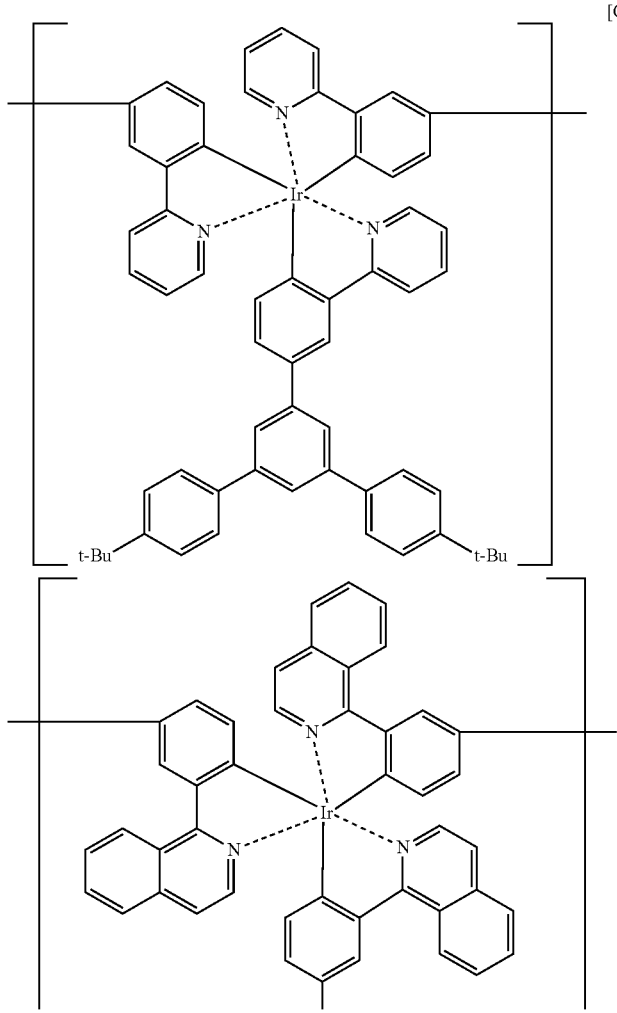

-continued
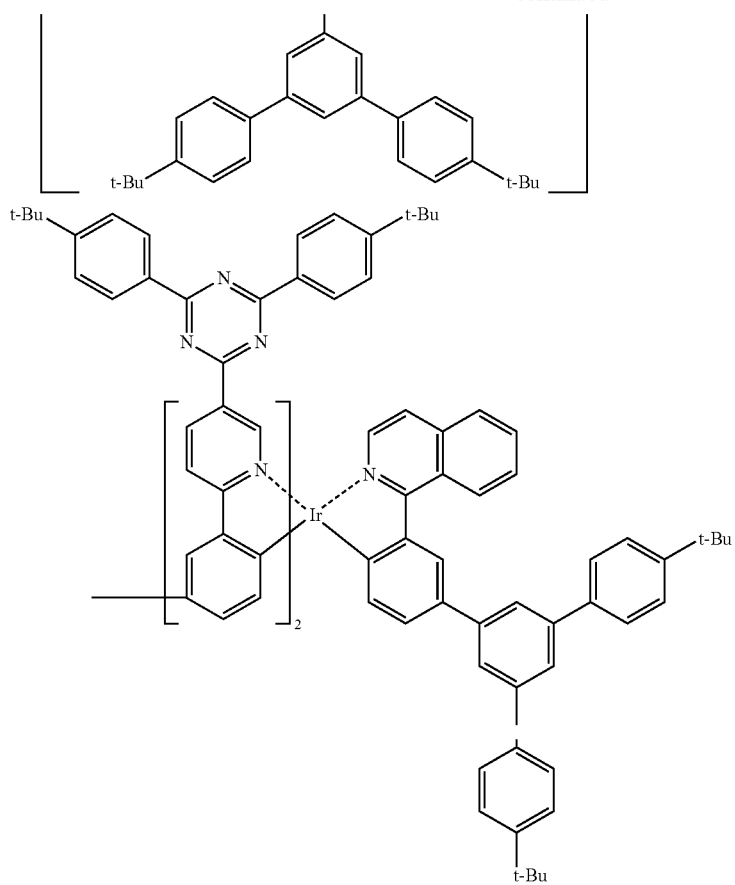
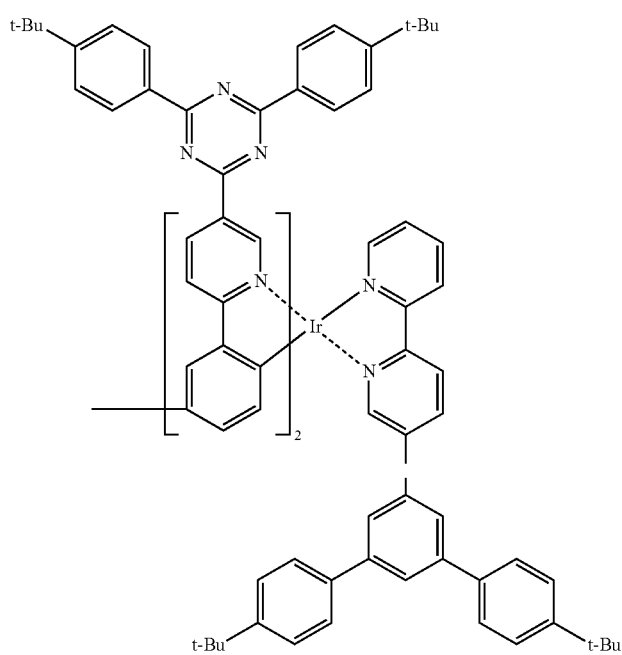

[Chemical Formula 49]

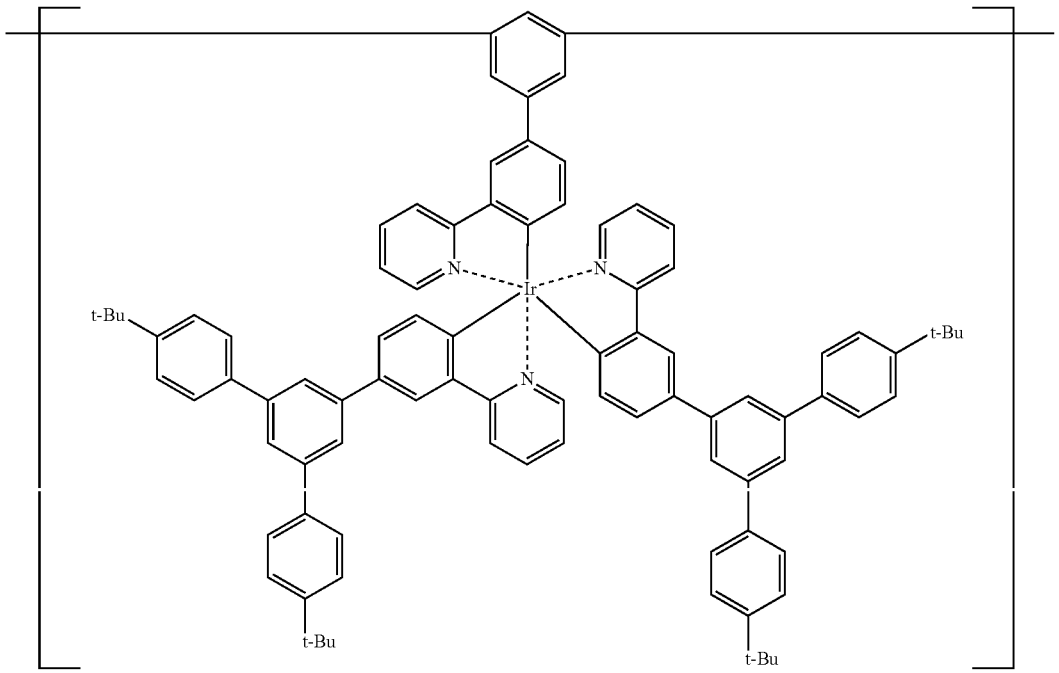

[Chemical Formula 50]

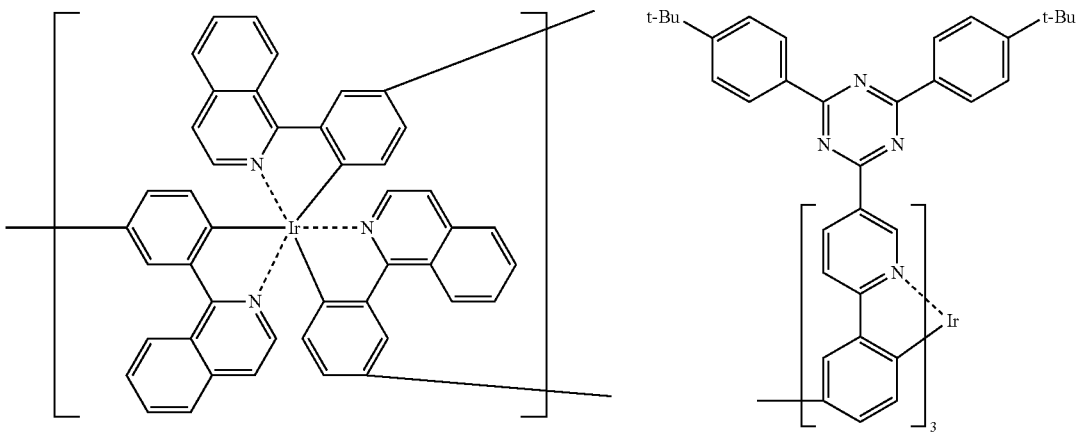

The polymer compound comprising the constitutional unit derived from a phosphorescent light-emitting compound is preferable from a viewpoint of easy preparation of solution containing the polymer compound used in producing the light-emitting device. In addition, the polymer compound comprising the constitutional unit derived from a phosphorescent light-emitting compound is preferable from a viewpoint that the current can be easily allowed to flow in the light-emitting device.

(Structure of Polymer Compound)

The polymer compound of the present invention comprises the block (A) described above and may have a structure comprising the block (B) and blocks other than the block (A) and the block (B) as a block other than the block (A). Examples of the polymer compound include a compound having a structure in which blocks are linked directly or via a hydrocarbon group and a group having heteroatoms. Examples of the structure by linking the blocks include the following groups. In the following formulas, R has the same definition as above and Ar represents a trivalent or tetravalent hydrocarbon group having 6 to 60 carbon atoms.

[Chemical Formula 51]

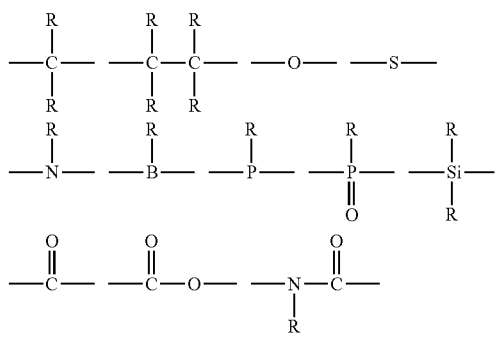

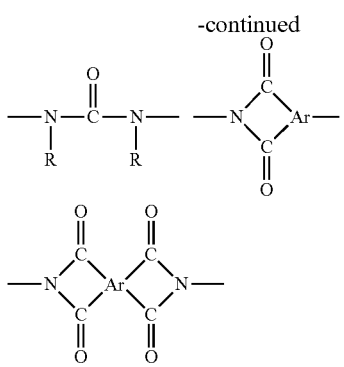

When the polymer compound comprises no constitutional unit derived from a phosphorescent light-emitting compound, the polymer compound wholly preferably comprises the constitutional units represented by formula (0) (preferably formula (2)), formula (3), formula (4), formula (3B), formula (4B) and formula (5) at a ratio of 0.9 or more of the total mass of these constitutional units when the total mass of the polymer compound is 1. When the polymer compound comprises a constitutional unit derived from a phosphorescent light-emitting compound, a ratio of the total mass of the constitutional units represented by formula (0), (3), (4), (3B) (4B) and (5) and the constitutional unit derived from a phosphorescent light-emitting compound is preferably 0.9 or more when the total mass of the polymer compound is 1 The light-emitting device using the polymer compound is thereby enabled to exhibit a high brightness and imparted with excellent brightness stability when the light-emitting device is driven at a low voltage.

Furthermore, when the polymer compound comprises the constitutional units derived from phosphorescent light-emitting compounds, a proportion of the total number of moles of the constitutional units derived from phosphorescent light-emitting compounds is preferably 0.0001 to 0.4 with respect to the total number of moles of all the constitutional units, more preferably 0.001 to 0.3, and even more preferably 0.001 to 0.25.

The end structure of the polymer compound is not particularly limited. However, if an end group is a polymerizable group, characteristics of the light-emitting device, such as the driving voltage, light-emitting efficiency, and life, obtained when the polymer compound is used in fabricating the light-emitting device may degrade. The end groups are therefore preferably stable groups that are not polymerizable groups. The end groups are preferably groups bonded to the main chain of the polymer compound by conjugated bonding. Examples of the end groups include end groups bonded to an aryl group or a monovalent aromatic heterocyclic group by carbon-carbon bonding. The aryl group and the monovalent aromatic heterocyclic group are preferably substituted or unsubstituted phenyl groups, and more preferably phenyl groups substituted with an alkyl group or an aryl group or unsubstituted phenyl groups.

With respect to the molecular weight of the polymer compound, the polystyrene-equivalent number-average molecular weight (Mn) by gel permeation chromatography (hereinafter, referred to as "GPC") is preferably $1\times10^3$ to $1\times10^8$, more preferably $5\times10^3$ to $1\times10^6$, and even more preferably $5\times10^3$ to $5\times10^5$. The polystyrene-equivalent weight-average molecular weight (Mw) of the polymer compound by GPC is preferably $1\times10^3$ to $1\times10^8$, and to achieve satisfactory film formability and satisfactory light-emitting efficiency, it is more preferably $1\times10^4$ to $5\times10^6$, even more preferably $1\times10^4$ to $1\times10^6$, and particularly preferably $1\times10^4$ to $5\times10^5$.

Furthermore, in the polymer compound, the polystyrene-equivalent number-average molecular weight (Mn) of the block (A) by GPC is preferably $1\times10^3$ to $2\times10^5$, more preferably $3\times10^3$ to $1\times10^5$, and even more preferably $5\times10^3$ to $5\times10^4$ to lower the driving voltage and improving the light-emitting efficiency of the light-emitting device. The polystyrene-equivalent weight-average molecular weight (Mw) of the block (A) by GPC is preferably $1\times10^3$ to $3\times10^5$, more preferably $3\times10^3$ to $2\times10^5$, and even more preferably $5\times10^3$ to $1\times10^5$ to lower the driving voltage and improving the light-emitting efficiency of the light-emitting device.

The polymer compound preferably satisfies a condition such that a value represented by the following expression (V) is 0.01 or more and 0.8 or less and more preferably 0.05 or more and 0.5 or less. With this configuration, the effects of lowering the driving voltage and improving the brightness stability of the light-emitting device can be more satisfactorily achieved.

$$[C]/[D] \tag{V}$$

In expression (V), [C] represents the polystyrene-equivalent weight-average molecular weight of the block (A), and [D] represents the polystyrene-equivalent weight-average molecular weight of the polymer compound.

When the molecular weight distribution of the polymer compound and the block (A) is multimodal, the preferable range of the molecular weight is applied to a component having the largest molecular weight.

For satisfactory durability in processes for fabrication of light-emitting devices and the like, satisfactory stability against heat release during operation of light-emitting devices, and satisfactory heat resistance, the glass transition temperature of the polymer compound is preferably 70° C. or more, more preferably 80° C. or more, and the upper limit thereof is preferably 200° C.

The polymer compound according to this embodiment having the structure described above is useful as a material of light-emitting devices (e.g., light-emitting materials and charge transport materials). A light-emitting device using the polymer compound is a high-performance light-emitting device capable of being driven with high light-emitting efficiency. Consequently, the light-emitting device is useful for a backlight of liquid crystal display, curved or flat light source for illumination, segment type display device, a display apparatus such as dot matrix flat panel display or the like.

In addition, the polymer compound of this embodiment is also useful as a laser pigment, an organic solar cell material, an organic semiconductor for an organic transistor, a material for a conductive film such as an electric conductive film or organic semiconductor film or a light-emitting film material that emits fluorescence or phosphorescence.

[Method for Producing Polymer Compound]

The polymer compound of the present invention has a structure comprising the block (A) described above. In order that the polymer compound securely comprises the block (A), the polymer compound is preferably synthesized by methods such as; a method in which compounds capable of forming a high molecular block (A) are synthesized, then a compound that is a group for linking the compounds is added, and then the reaction of the mixture is involved; a method in which compounds capable of forming a high molecular block (A) are synthesized and then monomers for forming a block (B) is added to involve polymerization; a method in which compounds capable of forming a high molecular block (B) are synthesized and then monomers for forming a block (A) is added to involve polymerization thereof; or a method in which compounds capable of forming a high molecular block (A) and compounds capable of forming a high molecular block (B) are each previously synthesized and then the reaction of the mixture is run.

In the method in which compounds capable of forming a block (A) and compounds capable of forming a block (B) are each synthesized and then the mixture is reacted, both compounds may be directly bonded, or otherwise may undergo a reaction with a compound to be added thereto, which is a group for linking the compounds and with compounds to be added thereto, which are capable of forming blocks other than the blocks (A) and (B), to obtain a structure in which the block (A) and the block (B) are bonded via the linking group or other blocks.

More specifically, the following methods (i) to (v), (iii-2) and (iv-2) are preferable as the method for producing a polymer compound. The compounds represented by formulas (R-0), (R-I) and (R-II) and constitutional units represented by formulas (0), (I) and (II) in the following methods (i) to (v), (iii-2) and (iv-2) are as follows. In the formulas, signs representing elements such as groups and numerical values have the same definitions as those with the same signs described above. Furthermore, $W^1$, $W^2$, $W^{21}$, $W^{22}$, $W^{31}$ and $W^{32}$ are each independently a polymerizable group capable of involving a condensation-polymerization reaction.

[Chemical Formula 52]

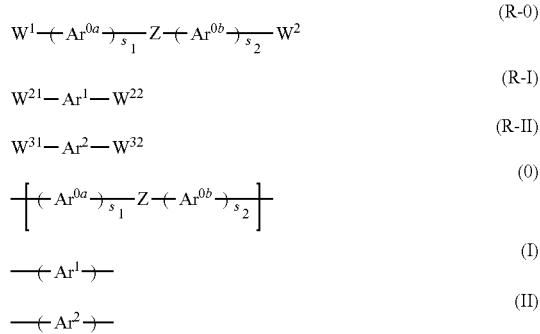

The compound represented by formula (R-0) is a compound for forming the constitutional unit represented by formula (0) (starting monomer), the compound represented by formula (R-I) is a compound for forming the constitutional unit represented by formula (I) (starting monomer), and the compound represented by formula (R-II) is a compound for forming the constitutional unit represented by formula (II) (starting monomer).

In the following methods, compounds other than the compounds represented by formulas (R-0), (R-I) and (R-II) and capable of involving condensation-polymerization reactions with the compounds represented by these formulas can also be used. Such compounds will hereafter be referred to as "other condensation-polymerizable compounds." The methods (i) to (v), (iii-2) and (iv-2) for producing a polymer compound using such compounds will be described.

(i) A method comprising: a first step of synthesizing a compound A comprising multiple constitutional units represented by formula (0) (first compound) by condensation-polymerizing a compound represented by formula (R-0) only or by condensation-polymerizing a monomer mixture containing a compound represented by formula (R-0) and a compound represented by formula (R-I) (monomer mixture A); and a second step of producing a polymer compound having a block (A) comprising the multiple constitutional units represented by formula (0) by condensation-polymerizing the compound A and a compound having a structure different from that of the compound A and capable of being condensation-polymerized with the compound A (other condensation-polymerizable compounds can be further added to the monomer mixture A).

(ii) A method comprising: a first step of synthesizing a compound A comprising multiple constitutional units represented by formula (0) by condensation-polymerizing a compound represented by formula (R-0) only or by condensation-polymerizing a monomer mixture containing a compound represented by formula (R-0) and a compound represented by formula (R-I) (monomer mixture A); and a second step of producing a polymer compound having a block (A) comprising multiple constitutional units represented by formula (0) by condensation-polymerizing a mixture containing the compound A and a monomer mixture which comprises a compound represented by formula (R-I) and a compound represented by formula (R-II) (monomer mixture B) (other condensation-polymerizable compounds can be further added to each of the monomer mixture A and the monomer mixture B).

(iii) A method comprising: a first step of producing a compound A comprising multiple constitutional units represented by formula (0) by condensation-polymerizing a compound represented by formula (R-0) or by condensation-polymerizing a monomer mixture containing a compound represented by formula (R-0) and a compound represented by formula (R-I) (monomer mixture A); a second step of producing a compound B comprising multiple constitutional units represented by formula (II) (second compound) by condensation-polymerizing a monomer mixture containing a compound represented by formula (R-I) and a compound represented by formula (R-II) (monomer mixture B); and a third step of producing a polymer compound having a block (A), which comprises multiple constitutional units represented by formula (O), and a block (B), which comprises multiple constitutional units represented by formula (II), by condensation-polymerizing the compound A and the compound B (other condensation-polymerizable compounds can be further added to each of the monomer mixture A and the monomer mixture B).

(iv) A method comprising: a first step of producing a compound. C by condensation-polymerizing other condensation-polymerizable compounds; and a second step of producing a polymer compound having a block (A) comprising multiple constitutional units represented by formula (0) by condensation-polymerizing the compound C and a compound represented by formula (R-0) or by condensation-polymerizing a mixture containing the compound C and a monomer mixture containing a compound represented by formula (R-0) and a compound represented by formula (R-I) (monomer mixture C) (other condensation-polymerizable compounds can be further added to the monomer mixture C).

(v) A method comprising: a first step of producing a compound B comprising multiple constitutional units represented by formula (II) by condensation-polymerizing a monomer mixture containing a compound represented by formula (R-I) and a compound represented by formula (R-II) (monomer mixture B); and a second step of producing a polymer compound having a block (A), which comprises multiple constitutional units represented by formula (0), and a block (B), which comprises multiple constitutional units represented by formula (II), by condensation-polymerizing the compound B and a compound represented by formula (0) or by condensation-polymerizing a mixture containing the compound B and a monomer mixture containing a compound represented by formula (R-0) and a compound represented by formula (R-I) (monomer mixture A) (other condensation-polymerizable compounds can be further added to each of the monomer mixture A and the monomer mixture B).

(iii-2) A method comprising: a first step of producing a compound A comprising multiple constitutional units represented by formula (0) (first compound) by condensation-polymerizing a compound represented by formula (R-0) or by condensation-polymerizing a monomer mixture containing a compound represented by formula (R-0) and a compound represented by formula (R-I) (monomer mixture A); a second step of producing a compound B comprising multiple constitutional units represented by formula (1) (second compound) by condensation-polymerizing a compound represented by formula (R-I); and a third step of producing a polymer compound having a block (A), which comprises multiple constitutional units represented by formula (0), and a block (B), which comprises multiple constitutional units represented by formula (I), by condensation-polymerizing the first compound and the second compound (other condensation-polymerizable compounds can be further added to each of the first and the second monomer mixtures).

(iv-2) A method comprising: a first step of producing a compound B comprising multiple constitutional units represented by formula (I) by condensation-polymerizing a compound represented by formula (R-I); and a second step of producing a polymer compound having a block (A) comprising multiple constitutional units represented by formula (0) by condensation-polymerizing the compound B and a compound represented by formula (R-0) or by condensation-polymerizing a mixture containing a monomer mixture which comprises a compound represented by formula (R-0) and a compound represented by formula (R-I) (monomer mixture A) (other condensation-polymerizable compounds can be further added to the monomer mixture A).

In producing the polymer compounds, the molecular weight of the block (A) and the block (B) can be controlled by adjusting conditions, such as the stoichiometric amount of the compounds used in the condensation polymerization, the type of the catalyst, the catalyst quantity, whether a base and an acid is to be added, the reaction temperature, the type of the solvent or the concentration of the solution.

Furthermore, the polymer compound according to the aforementioned embodiment can be produced by methods other than the methods (i) to (v), (iii-2) and (iv-2); for example by reacting a combination of compounds having specific polymerizable groups capable of converting starting monomers, as various types of starting monomers for forming the constitutional units, to be selectively reactable or non-reactable. Examples of such methods include the following methods (vi) and (vii).

(vi) A method comprising: a first step of producing a compound E having substituents $Y^1$ on both ends thereof by reacting compounds represented by formula (R-0) and having polymerizable groups as groups $W^1$ and $W^2$, which are capable of reacting with each other to form a bond, and a compound D having both a polymerizable group $W^3$ capable of reacting with $W^1$ and $W^2$ to form a bond, and substituents $Y^1$, which do not react with $W^1$ and $W^2$; and a second step of producing a polymer compound having a block (A) comprising multiple constitutional units represented by formula (0) by reacting the compound E under conditions for involving a reaction between the substituents $Y^1$.

(vii) A method comprising: a first step of producing a compound E having substituents $Y^1$ on both ends thereof by reacting compounds represented by formula (R-0) and having polymerizable groups as groups $W^1$ and $W^2$, which are capable of reacting with each other to form a bond, and a compound D having both a polymerizable group $W^3$ capable of reacting with $W^1$ and $W^2$ to form a bond, and substituents $Y^1$, which do not react with $W^1$ and $W^2$; and a second step of producing a polymer compound having a block (A) comprising multiple constitutional units represented by formula (0) by reacting the compound E with a compound F, which has two substituents $Y^2$ and $Y^3$ capable of reacting with $Y^1$ to form a bond, under conditions for involving a reaction among $Y^1$, $Y^2$ and $Y^3$.

In these methods, the compounds represented by formulas (R-I) and (R-II) and other condensation-polymerizable compounds having $W^3$ as a polymerizable group (e.g., $W^{21}$, $W^{22}$, $W^{31}$ and $W^{32}$) and $Y^1$, $Y^2$ and $Y^3$ can be applied as the compound D and the compound F. The phrase "do not react with $W^1$ or $W^2$" means that no reaction with $W^1$ or $W^2$ occurs under conditions for involving a reaction with $W^1$ or $W^2$.

In these methods, the compound A (the first compound), the compound B (the second compound), the compound C and the compound E may proceed to the next step immediately after being synthesized; or otherwise may proceed to the next step after once extracted to undergo various purification operations to synthesize a polymer compound.

The polymer compound of the embodiment described above can comprise constitutional units derived from phosphorescent light-emitting compounds in either one or multiple blocks thereof. When such constitutional units derived from phosphorescent light-emitting compounds are introduced, compounds prepared by introducing polymerizable groups to ligands of the aforementioned phosphorescent light-emitting compounds can be applied as the starting monomers. By adding the starting monomers by appropriate steps in the aforementioned methods, constitutional units derived from phosphorescent light-emitting compounds can be introduced to desired sites.

The following compounds are preferable as the compounds represented by formulas (R-0), (R-I) and (R-II) for forming constitutional units of the polymer.

The compounds represented by formula (R-0) are preferably compounds represented by formula (13), and more preferably compounds represented by formula (14). By using the compounds represented by formula (14), constitutional units represented by formula (2) can be easily introduced to the block (A).

[Chemical Formula 53]

(13)

(14)

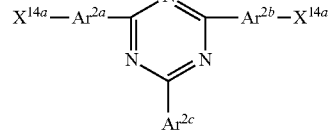

In formulas (13) and (14), Z, $Ar^{0a}$, $Ar^{0b}$, $Ar^{2a}$, $Ar^{2b}$ and $Ar^{2c}$ each have the same definitions as above. $X^{13a}$ and $X^{14a}$ are polymerizable groups capable of involving a condensation-polymerization reaction as $W^1$ and $W^2$ described above, and are preferably groups selected from the following substituent group (a) and substituent group (b).

(Substituent Group (a))

A chlorine atom, a bromine atom, an iodine atom and a group represented by —O—S(=O)$_2$R$_{20}$, where R$_{20}$ represents an alkyl group or an aryl group optionally substituted with an alkyl group, an alkoxy group, a nitro group, a fluorine atom or a cyano group.

(Substituent Group (b))

A group represented by —B(OR$^{21}$)$_2$, where R$^{21}$ represents a hydrogen atom or an alkyl group, and the two R$^{21}$ groups may be the same or different and may be bonded together to form a ring, a group represented by —BF$_3$Q$^1$, where Q$^1$ represents a monovalent cation of lithium, sodium, potassium, rubidium or cesium, a group represented by —Sn(R$^{22}$)$_3$, where R$^{22}$ represents a hydrogen atom or an alkyl group, and the three R$^{22}$ groups may be the same or different and may be bonded together to form a ring, a group represented by —MgY$^1$, where Y$^1$ represents a chlorine atom, a bromine atom or an iodine atom, and a group represented by —ZnY$^2$, where Y$^2$ represents a chlorine atom, a bromine atom or an iodine atom.

Compounds represented by formula (R-I) are preferably a compound represented by formula (15) and a compound represented by formula (16).

[Chemical Formula 54]

A compound represented by formula (15) is a compound for forming a constitutional unit represented by formula (3), and a compound represented by formula (16) is a compound for forming a constitutional unit represented by formula (4). In these formulas, $R^{3a}$, $Ar^{3a}$, $Ar^{4a}$, g and k each have the same definition as above. $X^{15a}$ and $X^{16a}$ are a group selected from the substituent group (a) and the substituent group (b).

The compound represented by formula (R-II) is preferably a compound represented by formula (17).

[Chemical Formula 55]

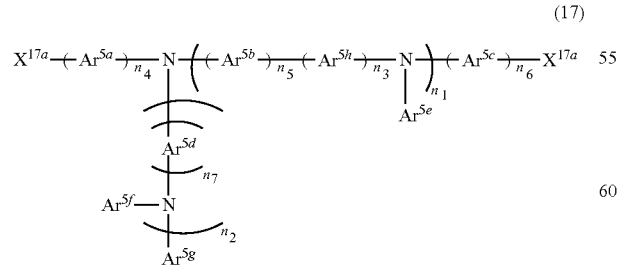

A compound represented by formula (17) is a compound for forming a constitutional unit represented by formula (5). In formula (17), $Ar^{5a}$, $Ar^{5b}$, $Ar^{5c}$, $Ar^{5d}$, $Ar^{5e}$, $Ar^{5f}$, $Ar^{5g}$, $Ar^{5h}$ and $n^1$ to $n^7$ each have the same definition as above. $X^{17a}$ is a group selected from the substituent group (a) and the substituent group (b).

In producing the polymer compound, the total number of moles of compounds represented by formula (13) (preferably formula (14)), formula (15), formula (16) and formula (17) is preferably 60 to 100 and more preferably 70 to 100 with respect to the total number of moles of all the starting monomers being 100.

$X^{13a}$, $X^{14a}$, $X^{5a}$, $X^{16a}$ and $X^{17a}$, which are polymerizable groups contained in the compounds represented by formulas (13), (14), (15), (16) and (17), respectively, are preferably the following combinations to further improve the light-emitting efficiency of the light-emitting device using the polymer compound to be produced.

More specifically, $X^{13a}$, $X^{14a}$, $X^{16a}$ and $X^{17a}$ are a group preferably selected from the substituent group (a) and $X^{15a}$ and/or $X^{16a}$ are a group preferably selected from the substituent group (b); or otherwise, $X^{13a}$, $X^{14a}$, $X^{16a}$ and $X^{17a}$ are a group preferably selected from the substituent group (b) and $X^{15a}$ and/or $X^{16a}$ are a group selected from the substituent group (a). Among these combinations, the former combination is more preferable, in which $X^{13a}$, $X^{14a}$, $X^{16a}$ and $X^{17a}$ are a group selected from the substituent group (a) and $X^{15a}$ and/or $X^{16a}$ are a group selected from the substituent group (b).

The alkyl group, which is an example of $R^{20}$, $R^{21}$ and $R^{22}$ in the group represented by —O—S(=O)$_2$R$^{20}$ in the substituent group (a), the group represented by —B(OR$^{21}$)$_2$ in the substituent group (b), and the group represented by —Sn(R$^{22}$)$_3$, respectively, preferably has 1 to 20, more preferably 1 to 15, and even more preferably 1 to 10 carbon atoms. The aryl group, which is an example of $R^{20}$ and optionally substituted with an alkyl group, an alkoxy group, a nitro group, a fluorine atom or a cyano group, is preferably a phenyl group, a 4-tolyl group, a 4-methoxyphenyl group, a 4-nitrophenyl group, a 3-nitrophenyl group, a 2-nitrophenyl group or a 4-trifluoromethylphenyl group. When $R^{20}$, $R^{21}$ and $R^{22}$ are these groups, the reactivity in polymerization of a monomer tends to become satisfactory and the synthesis of polymer compounds tends to become easy.

Examples of the group represented by —O—S(=O)$_2$R$^{20}$ in the substituent group (a) include methanesulfonyloxy, trifluoromethanesulfonyloxy, phenylsulfonyloxy, 4-methylphenylsulfonyloxy and 4-trifluoromethylphenylsulfonyloxy groups.

Examples of the groups represented by —B(OR$^{21}$)$_2$ in the substituent group (b) include groups represented by the following formulas.

[Chemical Formula 56]

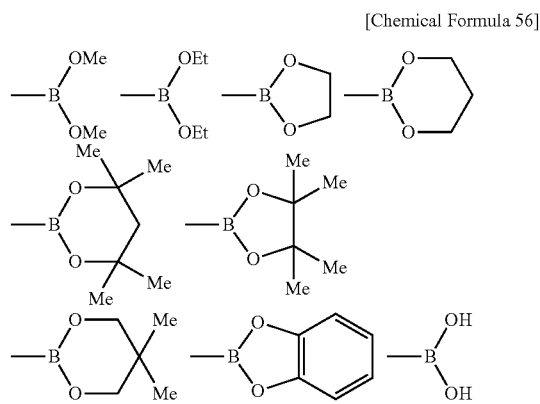

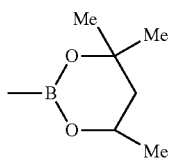

Examples of the groups represented by —BF$_3$Q$^1$ in the substituent group (b) include a group represented by —BF$_3^-$K$^+$. Furthermore, examples of the groups represented by —Sn(R$^{22}$)$_3$ in the substituent group (b) include trimethylstannyl, triethylstannyl and tributylstannyl groups.

When the compounds represented by formulas (13), (14), (15), (16) and (17) are used as the starting monomers to be polymerized to form the polymer compound, the compounds are preferably highly purified to produce a high-purity polymer compound prior to the polymerization. By forming the light-emitting device with high-purity polymer compounds, the light-emitting device tends to be enabled to be driven at a satisfactory driving voltage and excellent light-emitting efficiency tends to be achieved.

The high-purification of the compounds represented by formulas (13), (14), (15), (16) and (17) can be carried out by methods such as distillation, sublimation purification and recrystallization. The compounds become more desirable as the purity of the compounds becomes higher. For example, in an analysis by high-performance liquid chromatography (HPLC) with a UV detector (detection wavelength: 254 nm), an area percentage value indicated by the peak for the compounds is preferably 98.5% or more, more preferably 99.0% or more, and even more preferably 99.5% or more.

For polymerization (condensation-polymerization) reactions caused by using the compounds represented by formulas (13), (14), (15), (16) and (17), examples of methods using an aryl coupling reaction include a method of polymerization by Suzuki coupling reaction (Chem. Rev. Vol. 95, p. 2457-2483 (1995)), a method of polymerization by Grignard reaction (Bull. Chem. Soc. Jpn., Vol. 51, p. 2091 (1978)), a method of polymerization with a Ni(0) catalyst (Progress in Polymer Science, Vol. 17, p. 1153-1205, 1992) or a method with Stille coupling reaction (European Polymer Journal Vol. 41, p. 2923-2933 (2005)).

Among these methods, the method of polymerization by Suzuki coupling reaction and the method of polymerization with a Ni(0) catalyst are preferred for ease of starting monomer synthesis and simpleness of the polymerization reaction procedure, while for easier control of the polymer compound structure, methods of polymerization by a cross-coupling reaction such as Suzuki coupling reaction, Grignard reaction or Stille coupling reaction are more preferred, and a polymerization reaction by Suzuki coupling reaction is particularly preferred.

For the groups represented by X$^{13a}$, X$^{14a}$, X$^{15a}$, X$^{16a}$ and X$^{17a}$, which are polymerizable groups contained in the compounds represented by formulas (13), (14), (15), (16) and (17), appropriate groups may be selected according to the type of the polymerization reaction. For example, when polymerization is carried out by Suzuki coupling reaction, the groups are preferably bromine atoms, iodine atoms, chlorine atoms and groups represented by —B(OR$^{21}$)$_2$, and more preferably bromine atoms or groups represented by —B(OR$^{21}$)$_2$. When these groups are contained as polymerizable groups, the synthesis of the compounds represented by formulas (13), (14), (15), (16) and (17) becomes simple and the ease of handling the compounds during polymerization becomes satisfactory.

Examples of the polymerization method include a method of reacting the compounds represented by formula (13) (preferably formula (14)), formula (15), formula (16) and formula (17) (monomer mixture) and the like having the substituent group (a) and the substituent group (b) as the polymerizable groups, with an appropriate catalyst or base as necessary. When a method of polymerization by a cross-coupling reaction such as Suzuki coupling reaction, Grignard reaction or Stille coupling reaction is selected, the ratio of the number of moles of the group contained in the substituent group (a) and the number of moles of the group contained in the substituent group (b) in the entire compound may be adjusted to obtain a polymer compound with the desired molecular weight. For preferable cases, the ratio of the total number of moles of the group contained in the substituent group (b) to the total number of moles of the group contained in the substituent group (a) is preferably 0.90 to 1.10, more preferably 0.95 to 1.05, and even more preferably 0.98 to 1.02.

However, in a step for synthesizing the compound for forming a block (A) (the aforementioned compound A), the ratio of the total number of moles of the group contained in the substituent group (b) to the total number of moles of the group contained in the substituent group (a) is preferably 0.50 to 2.00, more preferably 0.55 to 1.45, and even more preferably 0.60 to 1.40, so as to provide the block (A) with a satisfactory structure.

For polymerization by Suzuki coupling reaction, examples of the catalyst include a transition metal complex, for example, a palladium complex such as palladium [tetrakis(triphenylphosphine)], [tris(dibenzylideneacetone)]dipalladium, palladium acetate or dichlorobistriphenylphosphinepalladium or a catalyst in which a ligand such as triphenylphosphine, tri(t-butyl)phosphine, tris(o-methoxyphenyl)phosphine or tricyclohexylphosphine is coordinated with these transition metal complexes as necessary.

These catalysts may be synthesized beforehand or prepared in the reaction system and used directly. These catalysts may be used singly or in combinations of two or more.

When a catalyst is used, the amount of catalyst used may be an amount that is effective as a catalyst. For example, the amount of catalyst with respect to the total number of moles of the monomers to be used is preferably 0.00001 to 3 mol equivalents, more preferably 0.00005 to 0.5 mol equivalents, and even more preferably 0.0001 to 0.2 mol equivalents in terms of the transition metal.

For polymerization by Suzuki coupling reaction, it is preferred to use a base as the catalyst. Examples of the base include inorganic bases such as sodium carbonate, potassium carbonate, cesium carbonate, potassium fluoride, cesium fluoride and tripotassium phosphate, and organic bases such as tetrabutylammonium fluoride, tetrabutylammonium chloride, tetrabutylammonium bromide, tetraethylammonium hydroxide and tetrabutylammonium hydroxide. The bases can be used as aqueous solutions.

When a base is used, it is preferable to set the amount of base with respect to the total number of moles of the starting monomer to be used, and the amount of base is preferably 0.5 to 20 mol equivalents and more preferably 1 to 10 mol equivalents.

The polymerization (condensation polymerization) reaction may be carried out in the absence of a solvent or in the presence of a solvent, but it will preferably be carried out in the presence of an organic solvent. Examples of the organic solvent include toluene, xylene, mesitylene, tetrahydrofuran, 1,4-dioxane, dimethoxyethane, N,N-dimethylacetamide or N,N-dimethylformamide. In order to suppress side reactions, the solvent is preferred to be subjected to a deoxidizing treatment. Such organic solvents may be used singly or in combinations of two or more.

The amount of organic solvent used is preferably an amount to make a total concentration of the total starting monomers in the solution at 0.1 to 90% by mass, more preferably 1 to 50% by mass, and even more preferably 2 to 30% by mass.

The reaction temperature for the polymerization reaction is preferably 0 to 200° C., more preferably 20 to 150° C., and even more preferably 20 to 120° C. The reaction time is preferably 0.5 hours or longer, and more preferably 2 to 500 hours.

When a group represented by —$MgY^1$ is to be applied as a group contained in the substituent group (b), the polymerization reaction is preferably carried out under dehydrating conditions. On the other hand, when the polymerization reaction is Suzuki coupling reaction, the base may be used as an aqueous solution, and water may be added to the organic solvent, for use as the solvent.

In order to prevent polymerizable groups (such as $X^{13a}$, $X^{14a}$, $X^{15a}$, $X^{16a}$ and $X^{17a}$) from remaining at the ends of the polymer compound to be produced, a compound represented by formula (19) may be further used as a chain terminator in the polymerization reaction. By a reaction with the aforementioned compound added, a polymer compound in which the ends are substituted with aryl or a monovalent aromatic heterocyclic group can be obtained. The chain terminator represented by formula (19) may be used singly or in combinations of two or more in polymerization for producing a polymer compound.

[Chemical Formula 57]

$$X^{19a}\text{—}Ar^{19a} \quad (19)$$

In formula (19), $Ar^{19a}$ represents an optionally substituted aryl group or an optionally substituted monovalent aromatic heterocyclic group, and $X^{19a}$ represents a group selected from the substituent group (a) and the substituent group (b).

In formula (19), the aryl group and the monovalent aromatic heterocyclic group represented by $Ar^{19a}$ are preferably an aryl group, more preferably an unsubstituted aryl group or an aryl group substituted with an alkyl group, an aryl group, a monovalent aromatic heterocyclic group or a substituted amino group, even more preferably an unsubstituted aryl group or an aryl group substituted with an alkyl group or an aryl group, and particularly preferably an unsubstituted phenyl group or a phenyl group substituted with an alkyl group or an aryl group.

Post-treatment after the polymerization reaction may be carried out by a known method. For example, such post-treatment may be carried out by methods such as adding the reaction solution obtained by the polymerization reaction to a lower alcohol such as methanol and filtering and drying the deposited precipitate.

When the purity of the polymer compound obtained in the aforementioned manner is low, it may be purified by a method such as recrystallization, continuous extraction with a Soxhlet extractor or column chromatography. When the polymer compound is to be used in a light-emitting device, the purity affects the performance of the device, including its luminescence property, and therefore the condensation polymerization is preferably followed by purification treatment, such as reprecipitation purification or fractionation by chromatography.

The polymer compound of this embodiment has a structure at least comprising a block (A) represented by formula (0) and further comprising a block (B) or other blocks as necessary. Such polymer compounds can be synthesized so as to have a desired structure by involving a polymerization reaction by using a starting monomer having a substituent appropriate for the applied polymerization reaction at an appropriate proportion In the present invention, the average chain length in terms of the block (A) can be determined based on the structure of a starting monomer constituting a block (A), of starting monomers for synthesizing the polymer compound. For example, when the starting monomers constituting a block (A) comprises those represented by formulas (R-0) and (R-I) and when $Ar^{0a}$, $Ar^{0b}$ and $Ar^1$ are monocyclic starting monomers (the cycle includes a fused ring), the average chain length n in formula (0-0) positioned between formulas (0-1) and (0-2) can be determined by the following expression.

$$n = \frac{\text{Molar ratio of formula }(R-I)}{\text{Molar ratio of formula }(R-0)} + S_1 + S_2 \quad [\text{Expression 1}]$$

In the expression, the "molar ratio of formula (R-0)" and the "molar ratio of formula (R-0)" represent the molar ratio with respect to all the starting monomers for synthesizing the polymer compound.

When formula (R-I) is a starting monomer comprising multiple monocycles or fused rings, the average chain length is determined by using a molar ratio obtained by adding molar ratios of all the multiple monocycles contained in formula (R-I) as the molar ratio of formula (R-I) in the aforementioned expression.

Hereinbelow, preferable examples will be described regarding preferable starting monomers for obtaining a preferable polymer compound, types of substituents contained in the starting monomer and involved in a polymerization reaction, and proportion of the starting monomers used in the polymerization reaction.

<Purpose of Use in Blue Phosphorescence>

Examples of polymer compounds with which a high brightness can be achieved even by low-voltage driving when applied as host materials for blue phosphorescent light-emitting compounds include the following compounds. More specifically, polymer compounds preferable in this case are preferably a polymer compound EP-1B and a polymer compound EP-2B shown in the following Table 1. These polymer compounds are obtained by carrying out the various production methods described above on a combination of various types of starting monomers shown in Table 1 at the proportions of the number of moles shown therein.

In Table 1, the "type of starting monomer" column represents which of the compounds represented by formulas (13), (14), (15), (16) and (17) described above is used as the starting monomer. "(OTHER)" denotes that the compound is different from any of the compounds represented by formulas (13), (14), (15), (16) and (17). Furthermore, (a) and (b) in the "polymerizable group" column denotes which of a group included in the substituent group (a) and a group included in the substituent group (b) is included in each compound (starting monomer) as a polymerizable group (group represented by $X^{13a}$, $X^{14a}$, $X^{15a}$, $X^{16a}$ or $X^{17a}$).

In these polymer compounds, the compound represented by formula (16) may have a structure corresponding to the formation of the constitutional units represented by formula (9). However, in this case, the constitutional units repre-

TABLE 1

| Polymer compound | Starting monomer | | | | | | | |
|---|---|---|---|---|---|---|---|---|
| EP-1B | Type | (13), (14) | (15) | (15) | (16) | (17) | (OTHER) | (OTHER) |
| | Polymerizable group | (a) | (a) | (b) | (a) | (a) | (a) | (b) |
| | Number of moles | 0.2-49.8 | 0-49.8 | 40-55 | 0-49.8 | 0-49.8 | 0-20 | 0-20 |
| EP-2B | Type | (13), (14) | (15) | (15) | (16) | (17) | (OTHER) | (OTHER) |
| | Polymerizable group | (b) | (b) | (a) | (b) | (b) | (b) | (a) |
| | Number of moles | 0.2-49.8 | 0-49.8 | 40-55 | 0-49.8 | 0-49.8 | 0-20 | 0-20 |

However, the polymer compound used for the phosphorescence blue purpose preferably comprises no constitutional unit represented by formula (9) for satisfactory emission due to its T1 energy higher than that of a phosphorescent light-emitting compound. Therefore, the compound represented by formula (16) is preferably not a compound having a structure corresponding to the formation of the constitutional units represented by formula (9). Accordingly, the compound represented by formula (16) is preferably a compound having a monocyclic arylene group or a monocyclic divalent aromatic heterocyclic group as $Ar^{4a}$.

Furthermore, the compound represented by formula (16) is preferably polymerized so that compounds represented by formula (15) are bonded on both sides thereof for high T1 energy of the polymer compound. Similarly, the compound represented by formula (13) (preferably formula (14)) is preferably polymerized so that compounds represented by formula (15) are bonded on both sides thereof for high T1 energy of the polymer compound.

<Purpose of Use in Green Phosphorescence>

Examples of polymer compounds with which a high brightness can be achieved even by low-voltage driving when applied as host materials for green phosphorescent light-emitting compounds include the following compounds. More specifically, polymer compounds preferable in this case are preferably a polymer compound EP-1G and a polymer compound EP-2G shown in the following Table 2. These polymer compounds are obtained by using a combination of various types of starting monomers shown in Table 2 at the proportions of the number of moles shown therein. The descriptions in Table 2 each mean the same as those in Table 1.

sented by formula (9) are preferably arranged so that they are not continuously arranged in the obtained polymer compound, for satisfactory emission due to its T1 energy higher than that of a phosphorescent light-emitting compound. Therefore, in this case, the compound represented by formula (16) for forming the constitutional unit represented by formula (9) is preferably polymerized so that compounds represented by formula (15) are bonded on both sides thereof. Similarly, the compound represented by formula (13) (preferably formula (14)) is preferably polymerized so that compounds represented by formula (15) are bonded on both sides thereof for high T1 energy of the polymer compound.

<Purpose of Use in Red Phosphorescence>

Examples of polymer compounds with which a high brightness can be achieved even by low-voltage driving when applied as host materials for red phosphorescent light-emitting compounds include the following compounds. More specifically, polymer compounds preferable in this case are preferably a polymer compound. EP-1R and a polymer compound EP-2R shown in the following Table 3. These polymer compounds are obtained by polymerizing a monomer mixture prepared by combining various types of starting monomers shown in Table 3 at the proportions of the number of moles shown therein. The descriptions in Table 3 each mean the same as those in Table 1.

TABLE 2

| Polymer compound | Starting monomer | | | | | | | |
|---|---|---|---|---|---|---|---|---|
| EP-1G | Type | (13), (14) | (15) | (15) | (16) | (17) | (OTHER) | (OTHER) |
| | Polymerizable group | (a) | (a) | (b) | (a) | (a) | (a) | (b) |
| | Number of moles | 0.2-49.8 | 0-49.8 | 40-55 | 0-49.8 | 0-49.8 | 0-20 | 0-20 |
| EP-2G | Type | (13), (14) | (15) | (15) | (16) | (17) | (OTHER) | (OTHER) |
| | Polymerizable group | (b) | (b) | (a) | (b) | (b) | (b) | (a) |
| | Number of moles | 0.2-49.8 | 0-49.8 | 40-55 | 0-49.8 | 0-49.8 | 0-20 | 0-20 |

TABLE 3

| Polymer compound | | Starting monomer | | | | | | | |
|---|---|---|---|---|---|---|---|---|---|
| EP-1R | Type | (13), (14) | (15) | (15) | (16) | (16) | (17) | (OTHER) | (OTHER) |
| | Polymerizable group | (a) | (a) | (b) | (a) | (b) | (a) | (a) | (b) |
| | Number of moles | 0.2-49.8 | 0-49.8 | 45-55 | 0-49.8 | 45-55 | 1-49.8 | 0-20 | 0-20 |
| EP-2R | Type | (13), (14) | (15) | (15) | (16) | (16) | (17) | (OTHER) | (OTHER) |
| | Polymerizable group | (b) | (b) | (a) | (b) | (a) | (b) | (b) | (a) |
| | Number of moles | 0.2-49.8 | 0-49.8 | 45-55 | 0-49.8 | 45-55 | 1-49.8 | 0-20 | 0-20 |

In these polymer compounds also, the compound represented by formula (16) can have a corresponding structure to form the constitutional unit represented by formula (9). Even in this case, the constitutional units represented by formula (9) can be continuously arranged in the obtained polymer compound. The compound represented by formula (13) (preferably formula (14)) is preferably polymerized so that at least one of a compound represented by formula (15) or a compound represented by formula (16) are bonded on both sides thereof for high T1 energy of the polymer compound.

The polymer compounds for purposes of use in phosphorescence blue, green, and red as described above are particularly preferably EP-2B, EP-2G and EP-2R, respectively, to achieve an easy control of the polymerization reaction in forming the polymer compound.

[Composition]

A composition of the present invention contains the polymer compound described above and at least one material selected from the group consisting of hole transport materials, electron transport materials and light-emitting materials. Such a composition can be used as a light-emitting material, a hole transport material or an electron transport material. In the composition of the present invention, the polymer compound, the hole transport material, the electron transport material, and the light-emitting material may be each used singly or in combinations of two or more.

In the composition, a ratio between "at least one material selected from the group consisting of hole transport materials, electron transport materials, and light-emitting materials" and a polymer compound is preferable if the following conditions are satisfied when the composition is used as the light-emitting material. More specifically, the proportion of "at least one material selected from the group consisting of hole transport materials, electron transport materials, and light-emitting materials" with respect to 100 mass parts of the polymer compound is preferably 0.01 to 400 mass parts and more preferably 0.05 to 200 mass parts for each material.

Materials known as hole transport materials for light-emitting devices can be applied as the hole transport material. Examples of hole transport materials include polyvinylcarbazole and derivatives thereof, polysilane and derivatives thereof, polysiloxane derivatives having aromatic amines on side chains or the main chain, pyrazoline derivatives, arylamine derivatives, stilbene derivatives, polyaniline and derivatives thereof, polythiophene and derivatives thereof, polyarylamine and derivatives thereof, polypyrrole and derivatives thereof, poly(p-phenylenevinylene) and derivatives thereof, and poly(2,5-thienylenevinylene) and derivatives thereof. The derivatives may have an arylene group or a divalent aromatic heterocyclic group as copolymerization components (constitutional units).

Materials known as electron transport materials for light-emitting devices can be applied as the electron transport material. Examples of electron transport materials include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, triaryltriazine and derivatives thereof, polyquinoline and derivatives thereof, polyquinoxaline and derivatives thereof, and polyfluorene and derivatives thereof. The derivatives may have an arylene group or a divalent aromatic heterocyclic group as copolymerization components (constitutional units).

The light-emitting material is preferably a material including the aforementioned phosphorescent light-emitting compound for an excellent light-emitting efficiency. In addition, a fluorescent light-emitting compound can be used as the light-emitting material. The fluorescent light-emitting compounds include a low molecular fluorescent material and a high molecular fluorescent material. Low molecular fluorescent materials usually have a maximum peak of emission of fluorescence in the wavelength range of 400 to 700 nm The molecular weight of the low molecular fluorescent material is preferably less than 3,000, more preferably 100 to 2,000, and even more preferably 100 to 1,000.

Materials known as light-emitting materials for light-emitting devices can be applied as the low molecular fluorescent material. Examples include pigment materials such as naphthalene derivatives, anthracene and derivatives thereof, perylene and derivatives thereof, quinacridone derivatives, xanthene-based pigments, coumarin-based pigments, cyanine-based pigments, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds and oligothiophene derivatives; and metal complex materials such as metal complexes having Al, Zn and Be or rare earth metals such as Tb, Eu and Dy as central metals such as alumiquinolinol complexes, beryllium benzoquinolinol complexes, benzoxazolyl zinc complexes, benzothiazole zinc complexes, azomethyl zinc complexes, porphyrin zinc complexes and europium complexes, and having oxadiazole, thiadiazole, phenylpyridine, phenylbenzoimidazole and quinoline structures as ligands.

Examples of high molecular fluorescent materials include materials prepared by polymerizing the pigment based light-emitting materials and metal complex based light-emitting materials described above as examples of the low molecular fluorescent materials, such as polyparaphenylenevinylene derivatives, polythiophene derivatives, polyparaphenylene derivatives, polysilane derivatives, polyacetylene derivatives, polyfluorene derivatives and polyvinylcarbazole derivatives.

The composition preferably includes a phosphorescent light-emitting compound as at least one material selected from the group consisting of a hole transport material, an electron transport material and a light-emitting material. When the composition includes a phosphorescent light-emitting compound, the proportion of the phosphorescent light-emitting compound is preferably 0.01 to 80 mass parts and more preferably 0.1 to 50 mass parts with respect to 100 mass parts of the polymer compound.

Furthermore, the composition according to the preferred embodiment may contain, in addition to the aforementioned polymer compounds, at least one selected from the group consisting of another polymer compound having only a repeating unit of the block (A) contained in the aforementioned polymer compound, another polymer compound having only a repeating unit of the block (B) contained in the aforementioned polymer compound or a polymer compound including no repeating unit of the block (A) or the block (B). Another polymer compound having a repeating unit of the block (A) only refers to a copolymer constituted by constitutional units of the block (A). Similarly, another polymer compound having a repeating unit of the block (B) only refers to a copolymer constituted by constitutional units of the block (B).

[Solution]

A solution of the present invention contains a polymer compound and a solvent. The solution also includes a mixture of the aforementioned composition and a solvent. The solution described above is advantageous in applying to printing methods and the like, and may be generally referred to as an ink or an ink composition. The solution of the present invention may contain a hole transport material, an electron transport material, a light-emitting material, a stabilizer, a thickener (a high molecular compound for increasing viscosity), a low molecular weight compound for decreasing the viscosity, a high molecular compound other than the polymer compound of the aforementioned embodiment, such as a surfactant and an antioxidant and the like. The components contained in the solution may be contained singly or in combinations of two or more.

The proportion of the polymer compound of the present invention in the solution is preferably 0.1 to 99 mass parts, more preferably 0.5 to 40 mass parts, and even more preferably 0.5 to 20 mass parts, with respect to 100 mass parts of the whole solution.

The viscosity of the solution may be adjusted according to the type of a printing method to be applied and the like. For example, when the solution is applied to a method such as an ink jet printing method, in which the solution is to be passed through a discharge device, the viscosity at 25° C. is preferably 1 to 20 mPa·s to prevent clogging or curving trajectory during discharge. The viscosity can be adjusted by controlling the content of the solvent and the like.

The solvent constituting the solution is preferably capable of dissolving or uniformly dispersing a solid content to become a solute. Examples of the solvent include a chlorine-based solvent such as chloroform, methylene chloride, 1,2-dichloroethane, 1,1,2-trichloroethane, chlorobenzene or o-dichlorobenzene; an ether-based solvent such as tetrahydrofuran, dioxane or anisole; an aromatic hydrocarbon-based solvent such as toluene or xylene; an aliphatic hydrocarbon-based solvent such as cyclohexane, methylcyclohexane, n-pentane, n-hexane, n-heptane, n-octane, n-nonane or n-decane; a ketone-based solvent such as acetone, methyl ethyl ketone, cyclohexanone, benzophenone or acetophenone; an ester-based solvent such as ethyl acetate, butyl acetate, ethyl cellosolve acetate, methyl benzoate and phenyl acetate; a polyhydric alcohol such as ethylene glycol, ethyleneglycol monobutyl ether, ethyleneglycol monoethyl ether, ethyleneglycol monomethyl ether, dimethoxyethane, propylene glycol, diethoxymethane, triethyleneglycol monoethyl ether, glycerin or 1,2-hexanediol or a derivative thereof; an alcohol-based solvent such as methanol, ethanol, propanol, isopropanol or cyclohexanol; a sulfoxide-based solvent such as dimethyl sulfoxide; or an amide-based solvent such as N-methyl-2-pyrrolidone or N,N-dimethylformamide. These solvents may be used singly or in combinations of two or more.

It is preferable to use two or more types of the solvents in combination, for satisfactory film formability and device characteristics. In particular, it is more preferable to use two or three types in combination and particularly preferable to use two types in combination.

When the solution contains two types of solvents, one type of them can be in a solid state at 25° C. The boiling point of at least one solvent is preferably 180° C. or more and more preferably 200° C. or more for satisfactory film formability. Furthermore, for preferable viscosity, both of the two types of solvents are preferably capable of dissolving the polymer compound of the aforementioned embodiment at 60° C. at the concentration of 1% by mass or more. At least one of the two types of solvents is preferably capable of dissolving the polymer compound at 25° C. at the concentration of 1% by mass or more.

When the solution contains two or more types of solvents, the proportion of the solvent having the highest boiling point in the solution is preferably 40 to 90% by mass of the mass of the whole solvent, more preferably 50 to 90% by mass, and even more preferably 65 to 85% by mass for satisfactory viscosity and film formability.

When the solution contains a thickener, the thickener may be soluble in the same solvent as that in which the polymer compound is soluble, and may be one not interfering with the emission or the transport of charges. For example, high molecular weight polystyrenes and high molecular weight polymethyl methacrylates can be used. The compound used as the thickener is preferably a compound having a polystyrene-equivalent weight-average molecular weight of $5 \times 10^5$ or more and a compound having a polystyrene-equivalent weight-average molecular weight of $1 \times 10^6$ or more.

Furthermore, the antioxidant is used to improve the storage stability of the solution. The antioxidant may be soluble in the same solvent as that in which the polymer compound is soluble, and may be one not interfering with the emission or the transport of charges. Examples of antioxidants include phenol-based antioxidants and phosphor-based antioxidants.

In addition, the solution can contain water, metals and salts thereof, silicon, phosphor, fluorine, chlorine, bromine and the like in the range of 1 to 1,000 ppm on mass basis. Examples of the aforementioned metal include lithium, sodium, calcium, potassium, iron, copper, nickel, aluminum, zinc, chromium, manganese, cobalt, platinum and iridium.

[Film]

The film according to the preferred embodiment comprises a polymer compound of the preferred embodiment described above. Examples of the film include light-emitting films, electric conductive films and organic semiconductor film. The film may include a combination of the components constituting the aforementioned composition according to its purposes of use.

The film can be fabricated by carrying out methods such as a spin coating method, a casting method, a microgravure coating method, a gravure coating method, a bar coating method, a roll coating method, a wire bar coating method, a dip coating method, a spray coating method, a screen printing method, a flexographic printing method, an offset printing method, an ink jet printing method, a capillary coating method or a nozzle coating method, by using the polymer compound directly or in states such as the aforementioned composition and solution.

For example, when a film is fabricated by using the aforementioned solution, baking can be carried out at a temperature of 100° C. or more (e.g., 130 to 160° C.) depending on the glass transition temperature of the polymer compound contained in the solution.

If the film is a light-emitting film, the light-emitting quantum yield is preferably 30% or more, more preferably 40% or more, even more preferably 50% or more, and particularly preferably 60% or more for satisfactory brightness and the emission voltage of the device.

If the film is an electric conductive film, the surface resistivity is preferably 1 kΩ/sq. or less, more preferably 100 Ω/sq. or less, and even more preferably 10 Ω/sq. or less. The electric conductivity of an electric conductive film can be increased by doping Lewis acids, ionic compounds or the like. The unit "Ω/sq." represents surface resistivity.

If the film is an organic semiconductor film, the greater of the values of the electron mobility and the hole mobility of the film is preferably $10^{-5}$ cm$^2$/V/s or more, more preferably $10^{-3}$ cm$^2$/V/s or more, and even more preferably $10^{-1}$ cm$^2$/V/s or more. For example, an organic transistor can be fabricated by forming the organic semiconductor film on a Si substrate, on which an insulating film such as SiO$_2$ film and a gate electrode are formed, and by forming a source electrode and a drain electrode by means of Au or the like.

[Light-Emitting Device]

The light-emitting device of the present invention includes electrodes comprising an anode and a cathode, and an organic layer containing the aforementioned polymer compound of the present invention provided between the electrodes. The light-emitting device may include either one organic layer only or two or more of them. When two or more organic layers are provided, at least one layer may contain the polymer compound of the present invention described above.

The organic layer containing the aforementioned polymer compound of the present invention can function as a light-emitting layer, a hole transport layer and an electron blocking layer in the light-emitting device. Therefore, in the light-emitting device of this embodiment, at least one of the layers is preferably constituted by an organic layer containing the aforementioned polymer compound of the present invention. The light-emitting device particularly preferably comprises an organic layer containing the aforementioned polymer compound of the present invention in its light-emitting layer. The light-emitting device may include other layers in addition to organic layers functioning as a cathode, an anode and a light-emitting layer (hereinafter be simply referred to as a "light-emitting layer"), for example, between or among the layers. Each layer may comprise one layer or two or more layers. The materials and compounds constituting each layer may be used singly or in combinations of two or more.

Examples of layers provided between an anode and a light-emitting layer include a hole injection layer, a hole transport layer and an electron blocking layer. When one such a layer only is provided between the anode and the light-emitting layer, the layer is a hole injection layer. When two or more of such layers are provided between the anode and the light-emitting layer, the layer contacting with the anode is a hole injection layer and the other layer(s) are hole transport layer(s).

A hole injection layer has a function of improving the efficiency of hole injection from the anode. A hole transport layer has a function of improving the hole injection from the hole injection layer or a layer closer to the anode. On the other hand, when the layers have a function of blocking the transport of electrons, the layers are electron blocking layers. Whether a target layer has a function of blocking the transport of electrons can be verified by fabricating a device which allows electron currents only to flow therein and by determining whether the current value decreases.

Examples of the layer provided between the cathode and the light-emitting layer include an electron injection layer, an electron transport layer and a hole blocking layer. When one such a layer only is provided between the cathode and the light-emitting layer, the layer is an electron injection layer. When two or more of such layers are provided between the cathode and the light-emitting layer, the layer contacting with the cathode is an electron injection layer and the other layer(s) are electron transport layers.

An electron injection layer has a function of improving the injection of electrons from the cathode. An electron transport layer has a function of improving the injection of electrons from the electron injection layer or a layer closer to the cathode. When these layers have a function of blocking the transport of the hole, the layers may be referred to as hole blocking layers. Whether a layer has a function of blocking the transport of holes can be verified by fabricating a device which allows hole currents only to flow therein and by determining whether the current value decreases.

Examples of structures of the light-emitting device having the configuration including the aforementioned layers include the following structures a) to d). The symbol "/" in the following structures indicates that the layers are laminated adjacent to each other (the same applies hereunder).

a) Anode/light-emitting layer/cathode
b) Anode/hole transport layer/light-emitting layer/cathode
c) Anode/light-emitting layer/electron transport layer/cathode
d) Anode/hole transport layer/light-emitting layer/electron transport layer/cathode Of the hole transport layer and the electron transport layer provided adjacent to the electrodes (cathode and anode), those having a function of improving the charge injection efficiency from the electrodes and having an effect of lowering the driving voltage of the device, are sometimes referred to as charge injection layers.

In order to increase adhesiveness with the electrodes (cathode and anode) and improve charge injection from the electrodes, there may be further provided adjacent to the electrodes a charge injection layer or insulating layer. In addition, a thin buffer layer may be provided at the interface with the charge transport layer or light-emitting layer to increase the interfacial adhesiveness between the layers and prevent intermixture of the constituent materials. The order and number of the laminated layers and the thickness of each layer may be adjusted in consideration of the light-emitting efficiency and the life of the device.

Examples of light-emitting devices further provided with charge injection layers include those having the following structures e) to p).

e) Anode/charge injection layer/light-emitting layer/cathode
f) Anode/light-emitting layer/charge injection layer/cathode
g) Anode/charge injection layer/light-emitting layer/charge injection layer/cathode h) Anode/charge injection layer/hole transport layer/light-emitting layer/cathode
i) Anode/hole transport layer/light-emitting layer/charge injection layer/cathode
j) Anode/charge injection layer/hole transport layer/light-emitting layer/charge injection layer/cathode
k) Anode/charge injection layer/light-emitting layer/charge transport layer/cathode
l) Anode/light-emitting layer/electron transport layer/charge injection layer/cathode
m) Anode/charge injection layer/light-emitting layer/electron transport layer/charge injection layer/cathode
n) Anode/charge injection layer/hole transport layer/light-emitting layer/charge transport layer/cathode
o) Anode/hole transport layer/light-emitting layer/electron transport layer/charge injection layer/cathode
p) Anode/charge injection layer/hole transport layer/light-emitting layer/electron transport layer/charge injection layer/cathode FIG. 1 shows a cross-sectional configuration of the light-emitting device having the aforementioned structure j) as an example. More specifically, in FIG. 1, a light-emitting device 10 has a structure in which an anode 1, a hole injection layer (charge injection layer)$_2$, a hole transport layer 3, a light-emitting layer 4, an electron injection layer (charge injection layer) 6 and a cathode 7 are laminated in this order on a substrate 0.

The layers of the light-emitting device having the aforementioned structures a) to p) have the following configurations, for example.

(Anode)

An anode is normally transparent or semi-transparent and includes a metal oxide, a metallic sulfide and a metal film with a high electric conductivity, and among them, preferably includes a material with a high transmissivity. As the materials of the anode, a film fabricated using a conductive inorganic compound comprising indium oxide, zinc oxide, tin oxide and a complex thereof such as indium tin oxide (ITO) and indium zinc oxide or NESA, gold, platinum, silver, copper or the like are used. Among them, ITO, indium zinc oxide, and tin oxide are preferable. In fabricating the anode, methods such as a vacuum vapor deposition method, a sputtering method, an ion plating method or a plating method may be used. The anode used may be an organic transparent conductive film made of polyaniline or a derivative thereof, or polythiophene or a derivative thereof.

The thickness of the anode may be selected in consideration of light permeability and electric conductivity. For example, the thickness of the anode is preferably 10 nm to 10 μm, more preferably 20 nm to 1 μm, and even more preferably 40 nm to 500 nm.

(Hole Injection Layer)

Examples of materials used for a hole injection layer include conductive polymers including phenylamine-based compounds, starburst amine-based compounds, phthalocyanine-based compounds, oxides such as vanadium oxides, molybdenum oxides, ruthenium oxides and aluminum oxides, amorphous carbon atoms, polyaniline and derivatives thereof, and polythiophene and derivatives thereof.

If the hole injection layer is a conductive polymer or a polymer compound of the aforementioned embodiment, anions such as polystyrenesulfonate ions, alkylbenzenesulfonate ions and camphorsulfonate ions can be doped to the hole injection layer to improve the electric conductivity of the polymer or the polymer compound as necessary.

(Hole Transport Layer)

Examples of materials used for the hole transport layer include materials mentioned above as examples of hole transport materials. When the material used for the hole transport layer is a low molecular compound, the low molecular compound is preferably dispersed in a macromolecular binder to be used. When the polymer compound of the aforementioned embodiment is used for the hole transport layer, the polymer compound preferably includes a hole transporting group (an aromatic amino group, a thienyl group or the like) as a constitutional unit and/or a substituent of the polymer compound.

In particular, the hole transport material used for the hole transport layer is preferably the polymer compound of the present invention in addition to polyvinylcarbazole and derivatives thereof, polysilane and derivatives thereof, polysiloxane derivatives having aromatic amines on side chains or the main chain, and polyarylamine and derivatives thereof.

When the material used for the hole transport layer is a low molecular compound, examples of the film-forming method for the hole transport layer include a method using a mixed solution containing the low molecular compound and a macromolecular binder, and when a polymer compound is used as the material for the hole transport layer, examples of the film-forming method for the hole transport layer include a method using a solution containing the polymer compound.

The solvent used in the film-forming using a solution may be a solution capable of dissolving the material used for the hole transport layer. Examples of the solvent include a chlorine-based solvent such as chloroform, methylene chloride and dichloroethane; an ether-based solvent such as tetrahydrofuran; an aromatic hydrocarbon-based solvent such as toluene or xylene; a ketone-based solvent such as acetone or methyl ethyl ketone; and an ester-based solvent such as ethyl acetate, butyl acetate or ethyl cellosolve acetate.

Coating methods such as a spin coating method, a casting method, a microgravure method, a gravure coating method, a bar coating method, a roll coating method, a wire bar coating method, a dip coating method, a spray coating method, a screen printing method, a flexographic printing method, an offset printing method or an ink jet printing method, which use the solution, can be used in the film formation using the solution.

The macromolecular binder to be combined with a low molecular compound is preferably one that produces only minimal interference with charge transport, and preferably one with weak absorption for visible light. Examples of the macromolecular binders include polycarbonates, polyacrylates, polymethyl acrylate, polymethyl methacrylate, polystyrene, polyvinyl chloride and polysiloxanes.

The thickness of the hole transport layer may be selected in consideration of the driving voltage and light-emitting efficiency. However, although the thickness must be such that pinholes are not easily generated, the driving voltage for the light-emitting device may become high if the hole transport layer is extremely thick. Therefore, the thickness of the hole transport layer is preferably 1 nm to 1 μM, more preferably 2 nm to 500 nm, and even more preferably 5 nm to 200 nm.

(Light-Emitting Layer)

The light-emitting layer is formed by an organic compound which emits fluorescence or phosphorescence (low molecular compound and polymer compound) and a dopant which aids the compound as necessary. The light-emitting layer of the light-emitting device of this embodiment preferably includes the polymer compound, the light-emitting material and the like according to the aforementioned embodiment. When the light-emitting material is a low molecular compound, the material is preferably dispersed in a macromolecular binder to be used.

Dopants can be added to the light-emitting layer to improve the light-emitting efficiency and to change the emission wavelength. Examples of the dopant include anthracene derivatives, perylene derivatives, coumarin derivatives, rubrene derivatives, quinacridone derivatives, squarium derivatives, porphyrin derivatives, styryl-based pigments, tetracene derivatives, pyrazolone derivatives, decacyclene and phenoxazone.

The thickness of the light-emitting layer may be selected in consideration of the driving voltage and light-emitting efficiency, and is preferably 2 to 200 nm, for example.

A method in which a solution containing a light-emitting material is coated on or above the substrate, a vacuum vapor deposition method, a transfer method and the like can be used as the film-forming method for the light-emitting layer. When the film formation using a solution is carried out, solvents similar to those described as examples with respect to the film formation for the hole transport layer using a solution can be applied as the solvent. As the method in which a solution containing a light-emitting material is coated on or above the substrate, a spin coating method, a dip coating method, an ink jet printing method, a flexographic printing method, a gravure printing method, a slit coating method or the like can be used. When the light-emitting material is a low molecular compound with sublimation property, the film formation can be carried out by the vacuum vapor deposition method. In addition, a method for forming a light-emitting layer at a desired position by laser transfer or thermal transfer can be used.

(Electron Transport Layer)

Examples of materials used for the electron transport layer include the aforementioned polymer compound of the present invention and the aforementioned electron transport material. When the aforementioned polymer compound of the present invention is used for the electron transport layer, the polymer compound preferably includes an electron transporting group (an oxadiazole group, an oxathiadiazole group, a pyridyl group, a pyrimidyl group, a pyridazyl group, a triazyl group and the like) as a constitutional unit and/or a substituent of the polymer compound.

In particular, the electron transport material used for the electron transport layer is preferably the aforementioned polymer compound of the present invention, oxadiazole derivatives, benzoquinone and derivatives thereof, anthraquinone and derivatives thereof, metal complexes of 8-hydroxyquinoline and derivatives thereof, polyquinoline and derivatives thereof, polyquinoxaline and derivatives thereof, and polyfluorene and derivatives thereof.

Examples of the film-forming method for the electron transport layer include, when the material used for the electron transport layer is a low molecular compound, a vacuum vapor deposition method using powders and a method by film formation in a solution or in a melted state. On the other hand, when the material used for the electron transport layer is a polymer compound, examples include a method by film formation in a solution or in a melted state. A macromolecular binder may be used in combination in the film formation in a solution or in a melted state. The film formation using a solution can be carried out in a similar manner as the film-forming method for the hole transport layer using a solution described above.

The thickness of the electron transport layer can be adjusted in consideration of the driving voltage and light-emitting efficiency. However, although the thickness must be such that pinholes are not easily generated, the driving voltage for the light-emitting device may become high if the electron transport layer is extremely thick. Therefore, the film thickness of the electron transport layer is preferably 1 nm to 1 μm, more preferably 2 nm to 500 nm, and even more preferably 5 nm to 200 nm.

(Electron Injection Layer)

The configuration of the electron injection layer may be selected according to the type of the light-emitting layer. Examples of the electron injection layer include an electron injection layer composed of a single Ca-layer structure; and an electron injection layer having a laminate structure including a layer formed with: one or two or more selected from group 1 or 2 metals of the periodic table except Ca with a work function of 1.5 to 3.0 eV, and oxides, halides, and carbonates of the metals; and a Ca layer. Examples of the group 1 metals of the periodic table with a work function of 1.5 to 3.0 eV and oxides, halides, and carbonates of the metals include lithium, lithium fluorides, sodium oxides, lithium oxides and lithium carbonates. Examples of the group 2 metals of the periodic table with a work function of 1.5 to 3.0 eV except Ca and oxides, halides and carbonates of the metals include strontium, magnesium oxides, magnesium fluorides, strontium fluorides, barium fluorides, strontium oxides and magnesium carbonates.

An electron injection layer can be formed by an evaporation method, a sputtering method, a printing method and the like. The thickness of the electron injection layer is preferably 1 nm to 1 μm.

(Cathode)

Materials with a low work function and capable of easily injecting electrons into the light-emitting layer are preferable as materials for the cathode. For example, a metal such as lithium, sodium, potassium, rubidium, cesium, beryllium, magnesium, calcium, strontium, barium, aluminum, scandium, vanadium, zinc, yttrium, indium, cerium, samarium, europium, terbium or ytterbium or an alloy comprising two or more of these metals, or an alloy comprising one or more of these metals with one or more of gold, silver, platinum, copper, manganese, titanium, cobalt, nickel, tungsten and tin, or graphite or a graphite interlaminar compound is used. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

When the cathode is formed of a laminate structure of two or more layers, a laminate structure including metals, metal oxides, metal fluorides or alloys thereof, and metals such as aluminum, silver and chromium is preferable.

The cathode may be formed by methods such as a vacuum vapor deposition method, a sputtering method or a laminating method involving thermocompression bonding of a metal film. The thickness of the cathode may be selected in consideration of electric conductivity and durability. The thickness of the cathode is preferably 10 nm to 10 μm, more preferably 20 nm to 1 μm, and even more preferably 50 nm to 500 nm, for example.

(Protective layer)

After the cathode is fabricated, a protective layer for protecting the light-emitting device may be further formed on an upper portion of the cathode. For prolonged stable use of the light-emitting device, a protective layer and/or protective cover is particularly preferably situated to protect the light-emitting device from the external environment.

Polymeric compounds, metal oxides, metal fluorides, metal borides and the like can be used as materials constituting a protective layer. As the protective cover, a metal plate, a glass plate, a plastic sheet that has been subjected to low-water permeability treatment on the surface or the like may be used. Examples of methods for protecting the light-emitting device using the protective cover include a method in which the protective cover is hermetically attached to the element board with a thermosetting resin or photocuring resin. In this case, a spacer may be used to maintain a space, thus helping to easily prevent damage to the device. By encapsulating an inert gas such as nitrogen or argon into the space, it is possible to prevent oxidation of the cathode. Furthermore, setting a desiccant such as barium oxide in the space will help to easily suppress damage to the device by moisture adsorbed during the production steps or a minute quantity of moisture infiltrating through the cured resin. It is preferable to employ one or more of the aforementioned measures for the light-emitting device.

The light-emitting device according to the preferred embodiment described above can be used as a surface light source, a display apparatus (a segment display apparatus or a dot matrix display apparatus), and a backlight for a liquid crystal display apparatus.

A planar anode and cathode may be placed overlapping to each other in order to obtain planar luminescence using the light-emitting device. Also, luminescence in a pattern can be obtained by a method in which a mask with a patterned window is set on the front side of the planar light-emitting device, a method in which an extremely thick organic substance layer is formed in a non-light-emitting portion to obtain substantially non-light-emitting portions, or a method in which an anode or cathode or both electrodes, are formed in a pattern shape. By forming a pattern by any of these methods, and configuring some electrodes to be independently turned on or off, it is possible to obtain a segment type display device allowing display of numerals, letters, simple symbols or the like.

Furthermore, for a dot matrix element, the anode and cathode may both be formed as stripes and configured in a crossing manner. A partial color display or multicolor display can also be formed by a method in which different types of polymer compounds with different light-emitting colors are coated or a method using a color filter or fluorescence conversion filter. The dot matrix element may be passively driven or actively driven in combination with a TFT or the like.

The planar light-emitting device described above is an autonomous light-emitting thin device and can be preferably used as a surface light source for a backlight of a liquid crystal display apparatus and a planar light source for illumination, etc. The aforementioned display devices may be used as display apparatuses for computers, televisions, portable terminals, cellular phones, car navigation systems, video camera viewfinders and the like. Furthermore, when a flexible substrate is used, the light-emitting device can be used as a curved-surface light source and a display apparatus.

EXAMPLES

The present invention will now be described in greater detail by Examples, with the understanding that the present invention is not limited thereto.

[Measuring Method]

In the following Examples, measurement of the number-average molecular weights and weight-average molecular weights, high-performance liquid chromatography (HPLC), and measurement of the glass transition temperature were carried out in the following manner.

(Measurement of Number-Average Molecular Weights and Weight-Average Molecular Weights)

The polystyrene-equivalent number-average molecular weights (Mn) and the polystyrene-equivalent weight-average molecular weights (Mw) were determined by GPC (trade name: LC-10Avp manufactured by Shimadzu Corp.). In this case, the polymer compound to be measured was dissolved in tetrahydrofuran to a concentration of about 0.05% by mass and 10 μL thereof was injected into the GPC. The GPC mobile phase used was tetrahydrofuran, and the flow rate was 2.0 mL/min. The column used was a PLgel MIXED-B (manufactured by Polymer Laboratories, Ltd.). The detector used was a UV-VIS detector (trade name: SPD-10Avp, manufactured by Shimadzu Corp.).

(Measurement by NMR)

Measurement by NMR was carried out by dissolving 5 to 20 mg of a measurement sample in about 0.5 mL of an organic solvent by an NMR (trade name: MERCURY 300, manufactured by Varian, Inc.) unless otherwise particularly noted.

(High-Performance Liquid Chromatography (HPLC))

A value of HPLC area normalization was used as an index for the purity of the compound. This value is a value obtained at 254 nm by high-performance liquid chromatography (HPLC, trade name: LC-20A manufactured by Shimadzu Corp.) unless otherwise particularly noted. In this case, the compound to be measured was dissolved in tetrahydrofuran or chloroform to a concentration of 0.01 to 0.2% by mass and 1 to 10 μL thereof depending on the concentration was injected into the HPLC. The HPLC mobile phase used was acetonitrile and tetrahydrofuran, and they were allowed to flow at the flow rate of 1 mL/min by gradient analysis of acetonitrile/tetrahydrofuran=100/0 to 0/100 (volume ratio). The column used was a Kaseisorb LC ODS 2000 (manufactured by Tokyo Chemical Industry Co., Ltd.). The detector used was a photo diode array detector (trade name: SPD-M20A, manufactured by Shimadzu Corp.).

(Measurement of Glass Transition Temperature)

Measurement of the glass transition temperature was carried out by DSC (trade name: DSC 2920 manufactured by TA Instruments-Waters LLC). After heating each polymer compound (sample, copolymer or polymer) to 200° C., the polymer compound was rapidly cooled to −50° C. and held for 30 minutes. After increasing the temperature to 30° C., the measurement was continued up to the temperature of 300° C. with the rate of temperature increase of 10° C./min.

[Synthesis of Starting Monomer]

To begin with, a method for synthesizing a starting monomer used in producing the following compound and polymer compound will be described.

The following monomers, such as a monomer CM5 (2,7-dibromo-9,9-dioctyl fluorene), a monomer CM6 (1,4-dihexyl-2,5-bis(4,4,5,5-tetramethyl-1,3,2-dioxaborolane-2-yl)benzene), a monomer CM7 (9,9-dioctyl-(1,3,2-dioxaborolane-2-yl)-fluorene), a monomer CM8 (N,N-bis(4-bromophenyl)-N',N-bis(4-n-butylphenyl)-1,4-phenylenediamine), a monomer CM9 (N,N-bis(4-bromophenyl)-N-(bicyclo[4.2.0]octa-1,3,5-trien-3-yl)-amine), a monomer CM10 (9,9-dioctyl-2,7-bis(4,4,5,5-tetramethyl-1,3,2-dioxaborolane-2-yl)-fluorene), a monomer CM11 (9,9-bis(4-hexylphenyl)-2,7-bis(4,4,5,5-tetramethyl-1,3,2-dioxaborolane-2-yl)-fluorene), a monomer CM12 (N,N'-bis(4-bromophenyl)-N,N'-bis(2,6-dibromo-4-tert-butylphenyl)-1,4-phenylenediamine), a monomer CM13 (9,9-bis(3-hexylphenyl)-2,7-dibromofluorene), a monomer CM14 (2,5-bis(4-bromophenyl)-1-(4-n-hexylphenyl)-1,3,4-triazole), and a monomer CM15 (9,9-bis(4-hexylphenyl)-2,7-dibromofluorene) were synthesized according to a known synthesis method, and those exhibited 99.5% or more of HPLC area normalization value (UV 254 nm) were used.

[Chemical Formula 58]

CM5
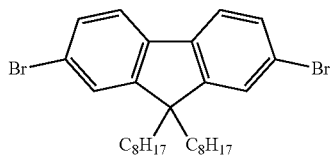

CM6
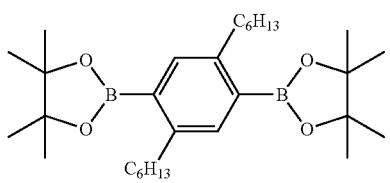

CM7
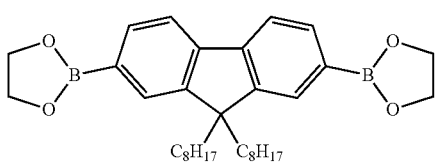

CM8
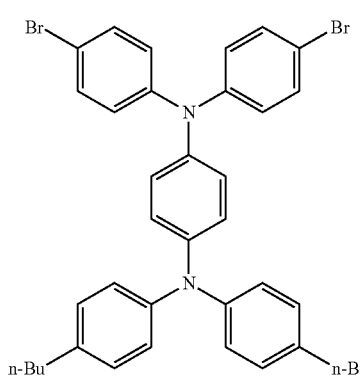

CM9
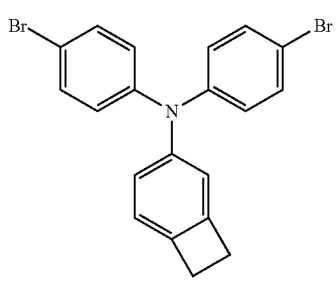

[Chemical Formula 59]

CM10
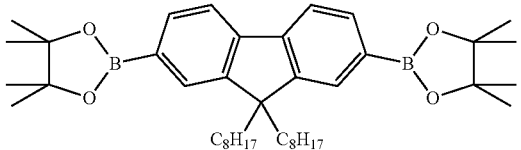

CM11
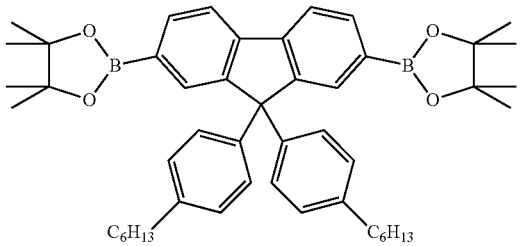

CM12
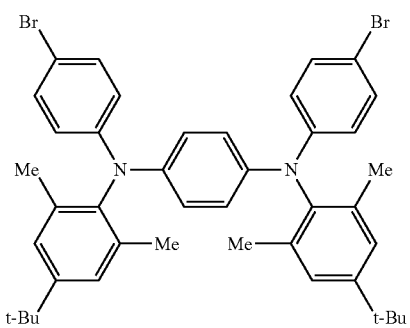 [SMILES: Cc1cc(C(C)(C)C)cc(C)c1N(c1ccc(Br)cc1)c1ccc(N(c2ccc(Br)cc2)c2c(C)cc(C(C)(C)C)cc2C)cc1]

CM13
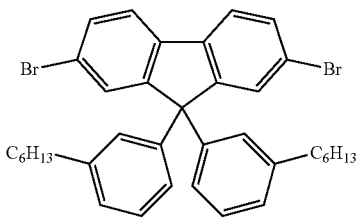

[Chemical Formula 60]

CM14
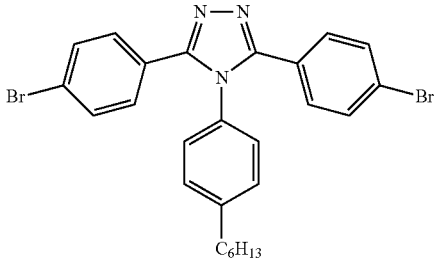

CM15
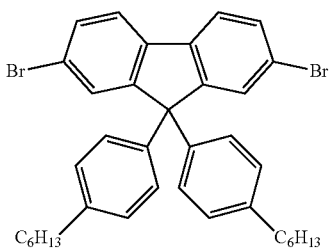

(Synthesis of Monomer CM1)

A monomer CM1 was synthesized by carrying out the following step (C1a).

[Chemical Formula 61]

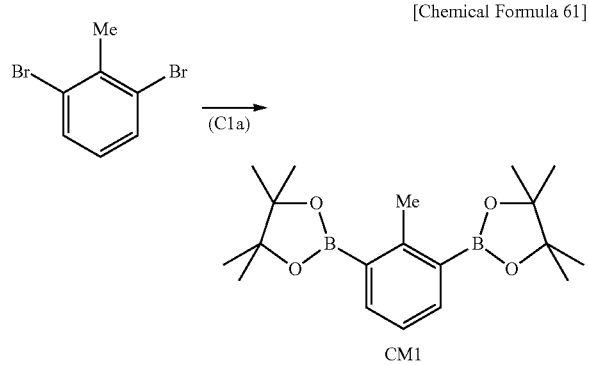

CM1

<Step (C1a)>

To a small piece of magnesium (19.45 g, 800 mmol) in a 1,000 mL flask, a small amount of dehydrated tetrahydrofuran and 1,2-dibromoethane (1.50 g, 8 mmol) were serially added under an argon gas atmosphere. After confirming that magnesium was activated based on the generated heat and bubbles, a solution prepared by dissolving 2,6-dibromotoluene (49.99 g, 200 mmol) in dehydrated tetrahydrofuran (200 mL) was added dropwise to the reaction solution over a period of about 2 hours. After the drip was completed, the mixture was heated in an oil bath kept at 80° C. and was stirred for 1 hour under reflux.

Then the oil bath was removed, the mixture was diluted with dehydrated tetrahydrofuran (400 mL) and further cooled in an ice bath, and then 2-isopropyloxy-4,4,5,5-tetramethyl-1,3,2-dioxaborolane (148.85 g, 800 mmol) was added. Then the ice bath was removed, the mixture was heated in an oil bath kept at 80° C., and then was stirred for 1.5 hours under reflux. Then the oil bath was removed, the mixture was further cooled in an ice bath, then a saturated ammonium chloride aqueous solution (50 mL) was added, and then the mixture was stirred for 30 minutes.

After that, the ice bath was removed and hexane (1,500 mL) was added, and then the mixture was stirred vigorously for 30 minutes. Then the stirring was stopped and the mixture was allowed to stand for 15 minutes, then it was filtered through silica gel on a glass filter, then the silica gel was washed with hexane (1,000 mL) and the combined filtrate was vacuum-concentrated to obtain a crude product (72.0 g). A similar procedure was repeated to obtain a crude product (75.4 g).

Methanol (740 mL) was added to the total crude product (147.4 g), and the mixture was stirred in an oil bath kept at 85° C. for 1 hour under heating reflux. Then the oil bath was removed and the mixture was cooled to room temperature while being stirred, then the solid was filtered out, washed with methanol (100 mL), and dried under vacuum to obtain a white crystal (59.7 g). The dried crystal was dissolved in isopropanol (780 mL) under heating, the mixture was allowed to stand and slowly cooled to room temperature to deposit the crystal, then the crystal was filtered out and washed with methanol (100 mL), and was dried at 50° C. overnight under vacuum to obtain an object monomer CM1 (50.8 g, 99.8% of HPLC area normalization (ultraviolet wavelength: 254 nm), yield of 37%) as a white crystal. The analysis result of the monomer CM1 was as follows.

$^1$H-NMR (300 MHz, CDCl$_3$), δ (ppm)=1.34 (s, 24H), 2.74 (s, 3H), 7.14 (t, 1H), 7.79 (d, 2H).

(Synthesis of Monomer CM2)

After the following step (C2a) was carried out and a compound. CM2a was obtained, step (C2b) was carried out to obtain a monomer CM2.

[Chemical Formula 62]

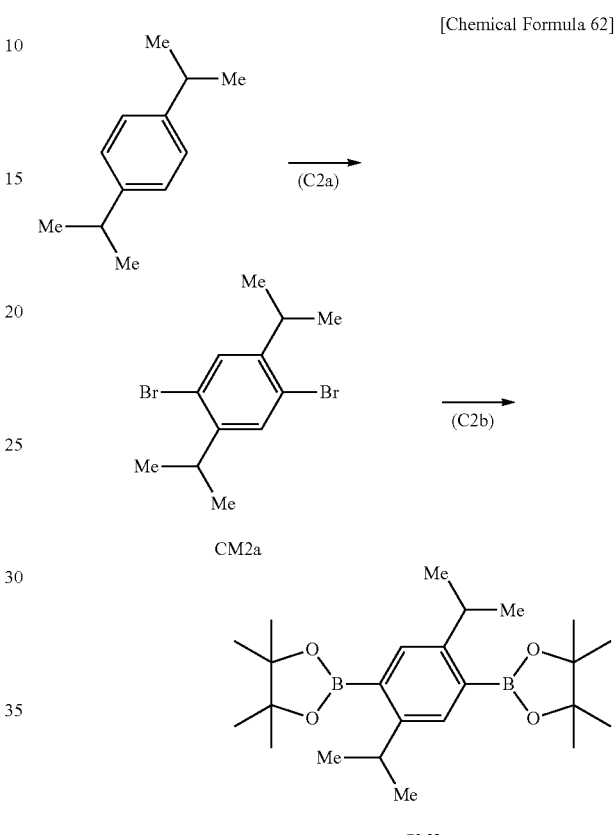

<Step (C2a)>

1,4-diisopropyl benzene (24.34 g, 150 mmol), iron powder (0.838 g, 15 mmol), dehydrated chloroform (40 mL), and trifluoroacetic acid (1.71 g, 15 mmol) were mixed and stirred in a 300 mL shaded round-bottom flask under an argon gas atmosphere, the mixture was cooled in an ice bath, then a bromine (55.1 g, 345 mmol) diluted solution of dehydrated chloroform (92 mL) was added dropwise over a period of 30 minutes, then the mixture was kept cooled in an ice bath, and the reaction was involved for further 5 hours under stirring to obtain a reaction solution.

After the reaction was completed, the obtained reaction solution was slowly added to 10% by mass aqueous sodium hydroxide being cooled in an ice bath, and then the mixture was further stirred for 15 minutes. Then the organic layer and the aqueous layer were allowed to separate, the organic layer was extracted from the aqueous layer with chloroform (100 mL), and after the obtained organic layers were combined, 10% by mass sodium sulfite aqueous solution (200 mL) were added, and then the mixture was stirred at room temperature for 30 minutes. At this time, it was observed that the color of the organic layer changed from pale yellow to substantially transparent and colorless.

Subsequently, the aqueous layer was removed by separation, then the obtained organic layer was washed with 15% by mass brine (200 mL) and dried over anhydrous magnesium sulfate (30 g), and then the solvent was removed by reduced-pressure concentration distillation to obtain about 47 g of a pale yellow oily product. Then ethanol (15 g) was added thereto, the mixture was shaken up until the content of the mixture became uniform, and then the mixture was allowed to stand for 3 hours in a freezer kept at −10° C. to allow the crystal to be deposited, then the crystal was filtered out, washed with a small amount of methanol, and was then dried at room temperature overnight under vacuum to obtain the object 1,4-dibromo-2,5-diisopropyl benzene (compound CM2a: 30.8 g, yield of 64%) as a white crystal. The analysis result of the obtained compound CM2a was as follows.

$^1$H-NMR (300 MHz, CDCl$_3$), δ (ppm)=1.24 (d, 12H), 3.30 (m, 2H), 7.50 (s, 2H).

<Step (C2b)>

To a small piece of magnesium (9.724 g, 400 mmol) in a 1,000 mL flask, a small amount of dehydrated tetrahydrofuran and 1,2-dibromoethane (0.75 g, 4 mmol) were serially added under an argon gas atmosphere. After observing that magnesium was activated based on the generated heat and bubbles, a solution prepared by dissolving the compound CM2a obtained above (32.0 g, 100 mmol) in dehydrated tetrahydrofuran (100 mL) was added dropwise to the reaction solution over a period of about 1 hour. After the dropping was completed, the mixture was heated in an oil bath kept at 80° C. and was stirred for 1 hour under reflux.

Then the oil bath was removed, the mixture was diluted with dehydrated tetrahydrofuran (200 mL) and further cooled in an ice bath, and then 2-isopropyloxy-4,4,5,5-tetramethyl-1,3,2-dioxaborolane (74.4 g, 400 mmol) was added. Then the ice bath was removed, the mixture was heated in an oil bath kept at 80° C., and then was stirred for 1.5 hours under reflux. Then the oil bath was removed, the mixture was further cooled in an ice bath, then a saturated ammonium chloride aqueous solution (25 mL) was added, and then the mixture was stirred for 30 minutes.

After that, the ice bath was removed and hexane (2,000 mL) was added, and then the mixture was stirred vigorously for 30 minutes. Then the stirring was stopped and the mixture was allowed to stand for 15 minutes, then it was filtered by silica gel on a glass filter, then the silica gel was washed with hexane (1,000 mL) and the combined filtrate was vacuum-concentrated to obtain a crude product (59.0 g). A similar procedure was repeated by the scale of 80% of the above-described step to obtain a crude product (44.8 g).

Methanol (520 mL) was added to the total crude product (103.8 g), and the mixture was stirred in an oil bath kept at 75° C. for 1 hour under heating reflux. Then the oil bath was removed and the mixture was cooled to room temperature while being stirred, then the solid was filtered out, washed with methanol (100 mL), and dried under vacuum to obtain a white crystal (48.8 g, 93.3% of HPLC area normalization (ultraviolet wavelength: 254 nm)). The dried crystal was dissolved in isopropanol (690 mL) under heating, the mixture was allowed to stand and slowly cooled to room temperature to deposit the crystal, then the crystal was filtered out and washed with methanol (50 mL), and was dried at 50° C. overnight under vacuum to obtain an object monomer CM2, e.g., 1,4-diisopropyl-2,5-bis(4,4,5,5-tetramethyl-1,3,2-dioxaborolane-2-yl)benzene (44.6 g, 99.8% of HPLC area normalization (ultraviolet wavelength: 254 nm), yield of 60%). The analysis result of the monomer CM2 was as follows.

$^1$H-NMR (300 MHz, CDCl$_3$), δ (ppm)=1.23 (d, 12H), 1.34 (s, 24H), 3.58 (m, 2H), 7.61 (s, 2H).

(Synthesis of Monomer CM3)

After the following step (C3a) was carried out and a compound CM3a was obtained, step (C3b) was carried out to obtain a monomer CM3.

[Chemical Formula 63]

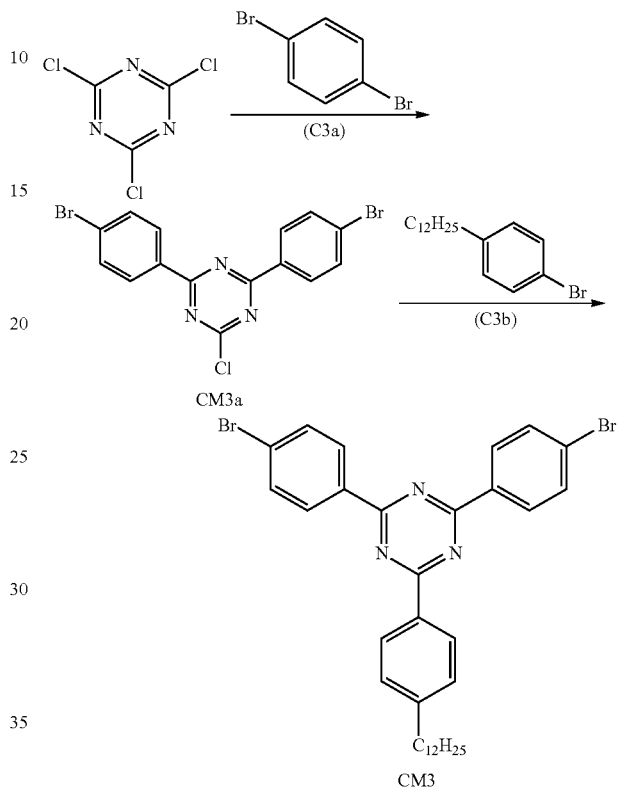

<Step (C3a)>

A solution of 1,4-dibromobenzene (27.1 g) in dehydrated diethyl ether (217 mL) was cooled in a bath of dry ice/methanol mixture under a nitrogen atmosphere. A 2.77 M n-butyllithium hexane solution (37.2 mL) was slowly added dropwise to the obtained suspension, then the mixture was stirred for 1 hour to prepare a lithium reagent.

A cyanuric chloride (10.0 g) suspension in dehydrated diethyl ether (68 mL) was cooled in a bath of dry ice/methanol mixture under a nitrogen atmosphere, then the lithium reagent was slowly added and the temperature was increased to room temperature to involve a reaction at room temperature. The obtained product was filtered and dried under vacuum. After that, the obtained solid (16.5 g) was purified to obtain 13.2 g of needle crystal (compound CM3a).

<Step (C3b)>

A 4-dodecyl bromobenzene (14.2 g) solution in dehydrated tetrahydrofuran (15 mL) was added in small portions to a suspension prepared by adding dehydrated tetrahydrofuran (65 mL) to magnesium (1.37 g) under a nitrogen atmosphere, then the mixture was heated and stirred under reflux. After left standing to cool, magnesium (0.39 g) was added to the reaction solution, then the mixture was heated again and a reaction was involved under reflux to prepare a Grignard reagent.

The aforementioned Grignard reagent was added to the dehydrated tetrahydrofuran (100 mL) suspension of the compound CM3a (12.0 g) obtained above under a nitrogen atmosphere while stirring the Grignard reagent, and the mixture was heated under reflux. After left standing to cool, the reaction solution was washed with a dilute hydrochloric acid aqueous solution. The organic layer and the aqueous layer were separated, and the aqueous layer was extracted with diethyl ether. The obtained organic layers were combined, then it was washed with water again, and then the organic layer was dehydrated with anhydrous magnesium sulfate, filtered, and concentrated. The obtained white solid was purified with a silica gel column and further recrystallized to obtain an object monomer CM3 (6.5 g) as a white solid. The obtained monomer CM3 exhibited 99.5% or more of the HPLC area normalization value (UV: 254 nm).

[Production of Polymer Compound]

Various types of polymer compounds were produced by using the starting monomers obtained above by the following methods.

Example 1

Synthesis of Polymer Compound P1

<First Step>

After heating a mixture containing the monomer CM2 (0.482 g), the monomer CM3 (0.462 g), the monomer CM5 (0.410 g), and toluene (31 mL) functioning as a solvent to about 80° C. under a nitrogen atmosphere, palladium acetate (0.33 mg), tris(2-methoxyphenyl)phosphine (2.03 mg), and a 20% by mass tetraethylammonium hydroxide aqueous solution (12.8 g) were added, and while being further heated in an oil bath, the mixture was stirred for about 3 hours under reflux to obtain a polymer compound having a block (A). The polystyrene-equivalent number-average molecular weight (Mn) and the polystyrene-equivalent weight-average molecular weight (Mw) of the polymer compound present in the reaction solution and having a block (A) were Mn=6.9×10$^3$ and Mw=1.1×10$^4$.

<Second Step>

Next, the monomer CM2 (0.451 g), the monomer CM1 (0.249 g), the monomer CM5 (1.230 g), and toluene (10 mL) functioning as a solvent were further added to the reaction solution, then the mixture was heated to about 80° C., and then palladium acetate (0.50 mg) and tris(2-methoxyphenyl)phosphine (3.10 mg) were added, and while being further heated in an oil bath, the mixture was stirred for about 3 hours under reflux.

Next, phenylboronic acid (179 mg), palladium acetate (0.85 mg), tris(2-methoxyphenyl)phosphine (5.11 mg), and a 20% by mass tetraethylammonium hydroxide aqueous solution (12.8 g) were added, and while being further heated in an oil bath, the mixture was stirred for about 16 hours under reflux.

A solution prepared by dissolving sodium N,N-diethyldithiocarbamate trihydrate (1.02 g) in ion-exchanged water (20 mL) was added, and then while being heated to 85° C., the mixture was stirred for 2 hours.

The organic layer was serially washed with 3.6% by mass hydrochloric acid (about 40 mL) twice, with a 2.5% by mass ammonia aqueous solution (about 40 mL) twice, and with ion-exchanged water (about 40 mL) four times. Then the organic layer was added dropwise to methanol to allow the product to be precipitated, then the product was filtered out and dried to obtain a solid. The solid was dissolved in toluene (about 230 mL), then it was passed through a silica gel column and alumina column in which toluene had been previously passed through, and the obtained solution was added dropwise to methanol (about 760 mL) to allow a solid to be precipitated, and then it was filtered out and dried to obtain a polymer compound (1.766 g: the polymer compound P1). The polystyrene-equivalent number-average molecular weight (Mn) and the polystyrene-equivalent weight-average molecular weight (Mw) of the polymer compound P1 were Mn=2.3×10$^4$ and Mw=5.8×10$^4$ and the glass transition temperature was 115° C.

Because the polymer compound P1 was obtained at a charging ratio (molar ratio) of the monomers shown in Tables 4 and 5, it is estimated that the polymer compound P1 is a polymer compound having the constitutional units and the molar ratios shown in the following Tables 6 and 7. In this case, the average chain length n of the block (A) is estimated to be 4.60.

In Table 4, the "monomer for polymerization of block (A)" refers to a monomer used to produce the polymer compound having the block (A) in the first step, and in Table 5, the "monomer for polymerization of block (B)" refers to a monomer added in the second step to form the block (B). Tables 6 and 7 show the constitutional units formed from the monomers and ratios (molar ratios) of the respective constitutional units determined based on the ratios of the monomers. Similar descriptions in the tables described below have meanings similar to those described above.

TABLE 4

| Monomer for polymerization of block (A) | CM2 | CM3 | CM5 |
|---|---|---|---|
| Proportion of monomer | 16.0 | 10.0 | 10.0 |

TABLE 5

| Monomer for polymerization of block (B) | CM2 | CM1 | CM5 |
|---|---|---|---|
| Proportion of monomer | 24.0 | 10.0 | 30.0 |

TABLE 6

| Block (A) | Constitutional unit represented by formula (3) | Constitutional unit represented by formula (2) | Constitutional unit represented by formula (4) |
|---|---|---|---|
| Proportion of constitutional unit | 16 | 10 | 10 |

TABLE 7

| Block (B) | Constitutional unit represented by formula (3) | Constitutional unit represented by formula (1) | Constitutional unit represented by formula (4) |
|---|---|---|---|
| Proportion of constitutional unit | 24 | 10 | 30 |

Example 2

Synthesis of Polymer Compound P2

<First Step>

After heating a mixture containing the monomer CM2 (0.753 g), the monomer CM3 (0.463 g), the monomer CM5 (0.410 g), and toluene (31 mL) functioning as a solvent to about 80° C. under a nitrogen atmosphere, palladium acetate (0.33 mg), tris(2-methoxyphenyl)phosphine (2.08 mg), and a 20% by mass tetraethylammonium hydroxide aqueous solution (12.8 g) were added, and while being further heated in an oil bath, the mixture was stirred for about 3 hours under reflux to obtain a polymer compound having a block (A). The polystyrene-equivalent number-average molecular weight (Mn) and the polystyrene-equivalent weight-average molecular weight (Mw) of the polymer compound present in the reaction solution and having a block (A) were Mn=1.2× $10^4$ and Mw=2.0×$10^4$.

<Second Step>

Next, the monomer CM2 (0.722 g), the monomer CM1 (0.249 g), the monomer CM5 (1.230 g), and toluene (8 mL) functioning as a solvent were added to the reaction solution, then the mixture was heated to about 80° C., and then palladium acetate (0.51 mg) and tris(2-methoxyphenyl) phosphine (2.99 mg) were added, and while being further heated in an oil bath, the mixture was stirred for about 2.5 hours under reflux.

Next, phenylboronic acid (179 mg), palladium acetate (0.77 mg), tris(2-methoxyphenyl)phosphine (5.06 mg), and a 20% by mass tetraethylammonium hydroxide aqueous solution (12.8 g) were added, and while being further heated in an oil bath, the mixture was stirred for about 16.5 hours under reflux.

A solution prepared by dissolving sodium N,N-diethyldithiocarbamate trihydrate (1.02 g) in ion-exchanged water (20 mL) was added to the reaction solution, and then while being heated to 85° C., the mixture was stirred for 2 hours.

The organic layer was serially washed with 3.6% by mass hydrochloric acid (about 40 mL) twice, with a 2.5% by mass ammonia aqueous solution (about 40 mL) twice, and with ion-exchanged water (about 40 mL) four times. Then the organic layer was added dropwise to methanol to allow the product to be precipitated, then the product was filtered out and dried to obtain a solid. The solid was dissolved in toluene (about 113 nit), then it was passed through a silica gel column and alumina column in which toluene had been previously passed through, and the obtained solution was added dropwise to methanol (about 760 mL) to allow a solid to be precipitated, and then it was filtered out and dried to obtain a polymer compound (1.282 g: the polymer compound P2). The polystyrene-equivalent number-average molecular weight (Mn) and the polystyrene-equivalent weight-average molecular weight (Mw) of the polymer compound P2 were Mn=$9.0 \times 10^3$ and Mw=$2.5 \times 10^4$ and the glass transition temperature was 101° C.

Because the polymer compound P2 was obtained at a charging ratio of the monomers shown in Tables 8 and 9, it is estimated that the polymer compound P2 is a polymer compound having the constitutional units and the molar ratios shown in the following Tables 10 and 11. In this case, the average chain length n of the block (A) is estimated to be 5.50.

TABLE 8

| Monomer for polymerization of block (A) | CM2 | CM3 | CM5 |
|---|---|---|---|
| Proportion of monomer | 25.0 | 10.0 | 10.0 |

TABLE 9

| Monomer for polymerization of block (B) | CM2 | CM1 | CM5 |
|---|---|---|---|
| Proportion of monomer | 15.0 | 10.0 | 30.0 |

TABLE 10

| Block (A) | Constitutional unit represented by formula (3) [structure: dimethylbenzene with Me groups] | Constitutional unit represented by formula (2) [structure: triazine with three phenyl groups, one bearing C12H25] | Constitutional unit represented by formula (4) [structure: 9,9-dioctylfluorene with C8H17 groups] |
|---|---|---|---|
| Proportion of constitutional unit | 25 | 10 | 10 |

TABLE 11

| Block (B) | Constitutional unit represented by formula (3) [structure: dimethylbenzene with Me groups] | Constitutional unit represented by formula (1) [structure: methylphenylene] | Constitutional unit represented by formula (4) [structure: 9,9-dioctylfluorene with C8H17 groups] |
|---|---|---|---|
| Proportion of constitutional unit | 15 | 10 | 30 |

Synthesis Example 1

Synthesis of Polymer Compound CP2

After heating a mixture containing the monomer CM7 (21.218 g), the monomer CM5 (5.487 g), the monomer CM8 (16.377 g), the monomer CM9 (2.575 g), methyltrioctylammonium chloride (5.17 g, trade name: Aliquat (R) 336 manufactured by Sigma-Aldrich Co. LLC.), and toluene (400 mL) functioning as a solvent to about 80° C. under a nitrogen atmosphere, bistriphenylphosphine palladium dichloride (56.2 mg) and a 17.5% by mass sodium carbonate aqueous solution (109 mL) were added, and while being further heated in an oil bath, the mixture was stirred for about 6 hours under reflux. Next, phenylboronic acid (0.49 g) was added and while being further heated in an oil bath, the mixture was stirred for about 2 hours under reflux.

A solution prepared by dissolving sodium N,N-diethyldithiocarbamate trihydrate (24.3 g) in ion-exchanged water (240 mL) was added to the reaction solution, and then while being heated to 85° C., the mixture was stirred for 2 hours.

The organic layer was serially washed with ion-exchanged water (about 520 mL) twice, with a 3% by mass acetic acid aqueous solution (about 520 mL) twice, and with ion-exchanged water (about 520 mL) twice. Then the organic layer was added dropwise to methanol to allow the product to be precipitated, then the product was filtered out and dried to obtain a solid. The solid was dissolved in toluene (about 1,240 mL), then it was passed through a silica gel column and alumina column in which toluene had been previously passed through, and the obtained solution was added dropwise to methanol (about 6,200 mL) to allow a solid to be precipitated, and then it was filtered out and dried to obtain a polymer compound (26.23 g: the polymer compound CP2). The polystyrene-equivalent number-average molecular weight (Mn) and the polystyrene-equivalent weight-average molecular weight (Mw) of the polymer compound CP2 were Mn=$7.8 \times 10^4$ and Mw=$2.6 \times 10^5$ and the glass transition temperature was 115° C.

Because the polymer compound CP2 was obtained at a charging ratio of the monomers shown in Table 12, it is estimated that the polymer compound CP2 is a polymer having the constitutional units and the molar ratios shown in Table 13.

TABLE 12

| Monomer | CM7 | CM5 | CM8 | CM9 |
|---|---|---|---|---|
| Proportion of Monomer | 50.0 | 12.5 | 30.0 | 7.5 |

TABLE 13

| CP2 | | | | |
|---|---|---|---|---|
| Proportion of constitutional unit | 50 | 12.5 | 30 | 7.5 |

Synthesis Example 2

Preparation of Light-Emitting Material EM-A

A light-emitting material EM-A was synthesized by the following method. The synthesis method was according to the synthesis method described in WO02/066552.

To begin with, 2-bromopyridine was reacted with 1.2 equivalents of 3-bromophenyl boronic acid by Suzuki coupling (catalyst: tetrakis(triphenylphosphine)palladium (0), base: 2 M sodium carbonate aqueous solution, solvent: ethanol and toluene) under an inert gas atmosphere to obtain 2-(3'-bromophenyl)pyridine represented by the following formula.

[Chemical Formula 64]

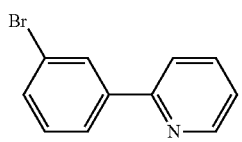

Next, tribromobenzene was reacted with 2.2 equivalents of 4-tert-butylphenyl boronic acid by Suzuki coupling (catalyst: tetrakis(triphenylphosphine)palladium (0), base: 2 M sodium carbonate aqueous solution, solvent: ethanol and toluene) under an inert gas atmosphere to obtain a bromo compound represented by the following formula.

[Chemical Formula 65]

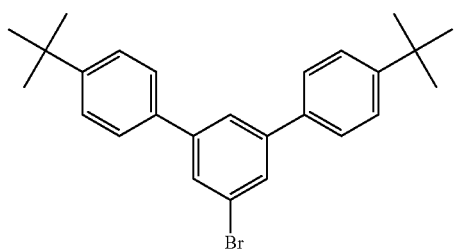

This bromo compound was cooled to −78° C. after being dissolved in anhydrous THF under an inert gas atmosphere and slightly excessive tert-butyllithium was added dropwise thereto. Under cooling, B(OC4H9)3 was further added dropwise to the solution to involve a reaction at room temperature. The obtained reaction solution was subjected to post-treatment with 3M hydrochloric acid water to obtain a boronic acid compound represented by the following formula.

[Chemical Formula 66]

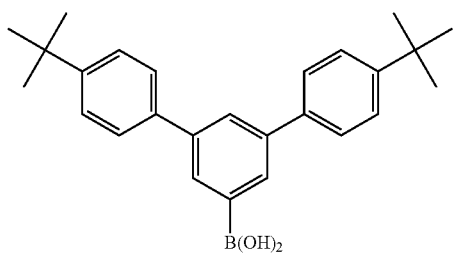

[Chemical Formula 67]

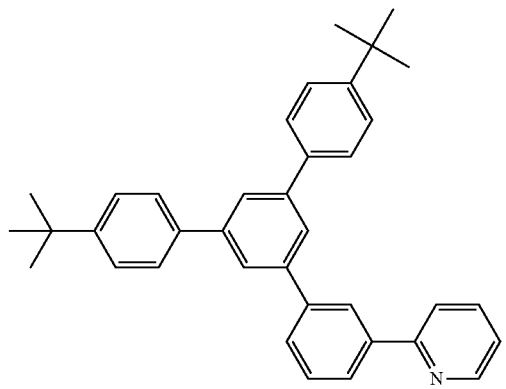

The 2-(3'-bromophenyl)pyridine obtained as above was reacted with the aforementioned 1.2 equivalents of boric acid compound by Suzuki coupling (catalyst: tetrakis(triphenylphosphine)palladium (0), base: 2 M sodium carbonate aqueous solution, solvent: ethanol and toluene) under an inert gas atmosphere to obtain a ligand represented by the following formula (i.e., a compound to function as a ligand).

The ligand obtained as above, 4 equivalents of $IrCl_3 \cdot 3H_2O$, 2-ethoxyethanol, and ion-exchanged water were charged and the mixture was refluxed under an argon atmosphere. The deposited solid was suction-filtered. The obtained solid was washed with ethanol and ion-exchanged water in this order and dried to obtain yellow powder represented by the following formula.

[Chemical Formula 68]

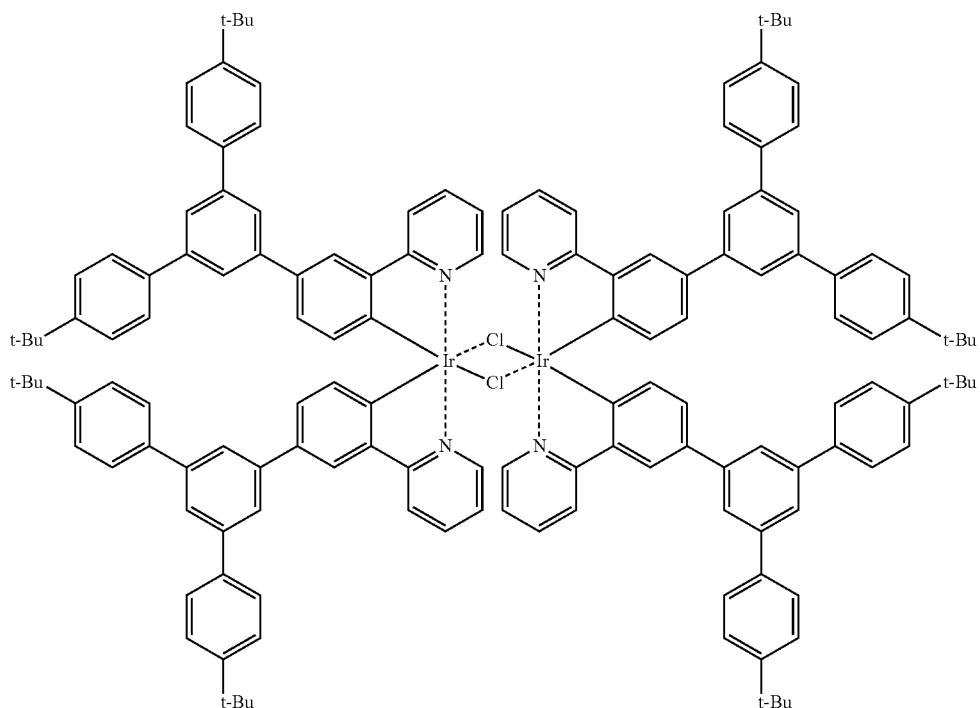

2 equivalents of the aforementioned ligand was added to the aforementioned yellow powder and the mixture was heated in a glycol-based solvent in an argon atmosphere to obtain an iridium complex (light-emitting material EM-A) represented by the following formula.

[Chemical Formula 69]

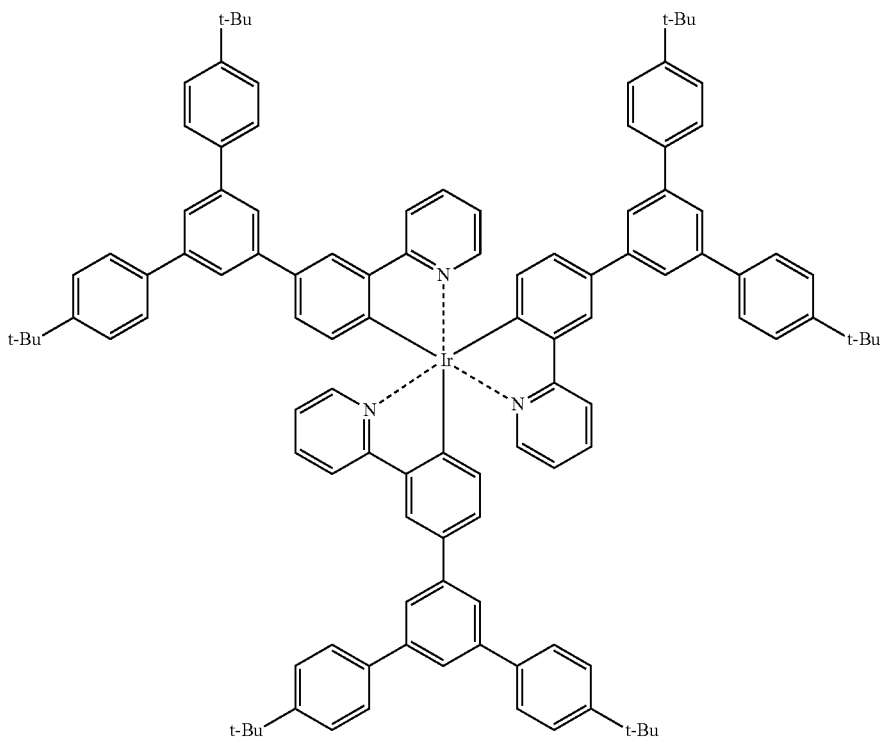

The analysis result of the obtained iridium complex (light-emitting material EM-A) is as follows.

$^1$H-NMR (300 MHz, CDCl$_3$), δ (ppm)=1.38 (s, 54H), 66.93 (dd, J=6.3, 6.6 Hz, 3H), δ7.04 (br, 3H), δ7.30 (d, J=7.9 Hz, 3H), δ7.48 (d, J=7.3 Hz, 12H), δ7.61-7.70 (m, 21H), δ7.82 (s, 6H), δ8.01 (s, 3H), δ8.03 (d, J=7.9 Hz, 3H).

LC/MS (APCI posi): [M+H]+ 1677

[Fabrication of Light-Emitting Device]

A composition and its solution were prepared using the polymer compound and the light-emitting material obtained as above and various light-emitting devices were fabricated using the composition and the solution.

Example 3

Case of Using Polymer Compound P1 for Light-Emitting Layer

Preparation of Composition MP1 and its Solution>

A composition MP1 including a mixture of the polymer compound P1 and the light-emitting material EM-A at a mass ratio of 70:30 was dissolved in xylene (manufactured by Kanto Chemical Co., Inc. with the grade for use in electronics) to achieve a content of the total solid content of 2.5% by mass. The solution obtained as above will be hereinafter referred to as a "2.5% by mass xylene solution containing the composition NIP 1."

<Fabrication of Light-Emitting Device DP1>

A 65 nm-thick film was formed on a glass substrate provided with a 45 nm-thick ITO film by a sputtering method by using a poly(3,4-ethylenedioxythiophen)/polystyrene sulfonate solution (trade name: CLEVIOS P AI4083 manufactured by H.C. Starck GmbH; hereinafter referred to as "CLEVIOS P") by spin coating and it was dried on a hot plate at 200° C. for 10 minutes. Next, a film was formed by using a 0.7% by mass xylene solution containing the polymer compound CP2 by spin coating at a rotational speed of 3,000 rpm, and it was dried on a hot plate at 180° C. for 60 minutes under a nitrogen gas atmosphere. The film thickness was about 20 nm.

Then a film was formed by using a 2.5% by mass xylene solution containing the composition MP1 by spin coating at a rotational speed of 2,100 rpm. The film thickness was about 80 nm. It was dried on a hot plate at 180° C. for 10 minutes under a nitrogen gas atmosphere, and then barium and aluminum were vapor-deposited thereon by about 5 nm and about 120 nm, respectively, as a cathode to fabricate a light-emitting device DP1. The vapor deposition of the metal was initiated after the degree of vacuum fell to 1×10$^{-4}$ Pa or lower.

The device configuration of the obtained light-emitting device DP1 is ITO (anode)/CLEVIOS P (hole injection layer, 65 nm)/polymer compound CP2 (hole transport layer)/composition MP1 (light-emitting layer)/Ba (5 nm)/Al (120 nm) (Ba and Al were together to form the cathode).

<Evaluation of Characteristics>

When a voltage was applied to the obtained light-emitting device DP1, green luminescence with a peak wavelength (EL) at 520 nm was obtained. The driving voltage at the brightness of 1,000 cd/m$^2$ was 6.26 V, and the chromaticity coordinate C.I.E. 1931 was (x, y)=(0.307, 0.636). When the initial brightness was set at 8,000 cd/m$^2$ and the device was driven with a constant current, time taken for reducing the brightness by 20% was 8.1 hours and the brightness half-life was 54.5 hours.

Example 4

Case of Using Polymer Compound P2 for Light-Emitting Layer

<Preparation of Composition MP2 and its Solution>

A composition MP2 including a mixture of the polymer compound P2 and the light-emitting material EM-A at a mass ratio of 70:30 was dissolved in xylene (manufactured by Kanto Chemical Co., Inc. with the grade for use in electronics) to achieve a concentration of the total solid content of 2.8% by mass. The solution obtained as above will be hereinafter referred to as a "2.8% by mass xylene solution containing the composition MP2."

<Fabrication of Light-Emitting Device DP2>

A light-emitting device DP2 was fabricated in the similar manner as Example 3 except that the 2.8% by mass xylene solution containing the composition MP2 was used instead of the 2.5% by mass xylene solution containing the composition MP1 of Example 3 and that the rotation speed in the spin coating was changed from 2,100 rpm to 2,000 rpm.

<Evaluation of Characteristics>

When a voltage was applied to the obtained light-emitting device DP2, green luminescence with a peak wavelength (EL) at 520 nm was obtained. The driving voltage at the brightness of 1,000 cd/m² was 6.23 V, and the chromaticity coordinate C.I.E. 1931 was (x, y)=(0.302, 0.638). When the initial brightness was set at 8,000 cd/m² and the device was driven with a constant current, time taken for reducing the brightness by 20% was 10.3 hours and the brightness half-life was 63.0 hours.

[Production of Polymer Compound]

Various types of polymer compounds were produced by the following methods by using the aforementioned various types of starting monomers.

Example 5

Synthesis of Polymer Compound P5

<First Step>

After heating a mixture containing the monomer CM11 (0.419 g), the monomer CM3 (0.361 g), the monomer CM13 (0.122 g), and toluene (41 mL) functioning as a solvent to about 80° C. under a nitrogen atmosphere, bistriphenylphosphine palladium dichloride (0.49 mg) and a 20% by mass tetraethylammonium hydroxide aqueous solution (6.4 mL) were added, and while being further heated in an oil bath, the mixture was stirred for about 3 hours under reflux to obtain a polymer compound having a block (A). The polystyrene-equivalent number-average molecular weight (Mn) and the polystyrene-equivalent weight-average molecular weight (Mw) of the polymer compound present in the reaction solution and having a block (A) were Mn=6.5×10³ and Mw=1.2×10⁴.

<Second Step>

Next, the monomer CM11 (0.572 g), the monomer CM10 (0.340 g), the monomer CM12 (0.210 g), the monomer CM13 (1.550 g), and toluene (16 mL) functioning as a solvent were added to the reaction solution, then the mixture was heated to about 80° C., and then bistriphenylphosphine palladium dichloride (0.75 mg) was added, and while being further heated in an oil bath, the mixture was stirred for about 3 hours under reflux.

Next, phenylboronic acid (92.7 mg), bistriphenylphosphine palladium dichloride (1.28 mg), and a 20% by mass tetraethylammonium hydroxide aqueous solution (6.4 mL) were added, and while being further heated in an oil bath, the mixture was stirred for about 16.5 hours under reflux.

The aqueous layer was removed by separation, then a solution prepared by dissolving sodium N,N-diethyldithiocarbamate trihydrate (0.54 g) in ion-exchanged water (11 mL) was added, and then while being heated to 85° C., the mixture was stirred for 2 hours.

After separating the organic layer from the aqueous layer, the organic layer was serially washed with 3.6% by mass hydrochloric acid (about 35 mL) twice, with a 2.5% by mass ammonia aqueous solution (about 35 mL) twice, and with ion-exchanged water (about 35 mL) five times. Then the organic layer was added dropwise to methanol to allow the product to be precipitated, then the product was filtered out and dried to obtain a solid. The solid was dissolved in toluene (about 103 mL), then it was passed through a silica gel column and alumina column in which toluene had been previously passed through, and the obtained solution was added dropwise to methanol (about 680 mL) to allow a solid to be precipitated, and then it was filtered out and dried to obtain a polymer compound (1.593 g: the polymer compound P5).

The polystyrene-equivalent number-average molecular weight (Mn) and the polystyrene-equivalent weight-average molecular weight (Mw) of the polymer compound P5 were Mn=5.7×10⁴ and Mw=1.2×10⁵ and the glass transition temperature was 157° C.

Because the polymer compound P5 was obtained at a charging ratio of the monomers shown in. Tables 14 and 15, it is estimated that the polymer compound P5 is a polymer compound having the constitutional units and the molar ratios shown in Tables 16 and 17. In this case, the average chain length n of the block (A) is estimated to be 3.33.

TABLE 14

| Monomer for polymerization of block (A) | 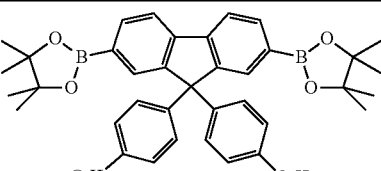 CM11 | 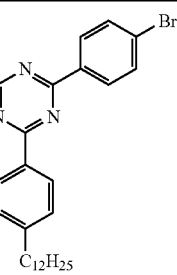 CM3 | 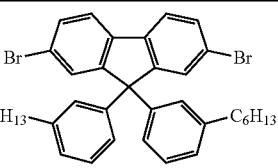 CM13 |
|---|---|---|---|
| Proportion of Monomer | 15.0 | 15.0 | 5.0 |

TABLE 15

| Monomer for polymerization of block (B) | CM11 (9,9-bis(4-hexylphenyl)fluorene-2,7-diboronic acid bis(pinacol) ester) | CM10 (9,9-dioctylfluorene-2,7-diboronic acid bis(pinacol) ester) |
|---|---|---|
| Proportion of Monomer | 20.5 | 14.0 |
| Monomer for polymerization of block (B) | CM12 (N,N'-bis(4-tert-butyl-2,6-dimethylphenyl)-N,N'-bis(4-bromophenyl)-1,4-phenylenediamine) | CM13 (2,7-dibromo-9,9-bis(3-hexylphenyl)fluorene) |
| Proportion of Monomer | 7.5 | 22.5 |

TABLE 16

| Block (A) | 9,9-bis(4-hexylphenyl)fluorene unit | 2,4,6-tris(4-dodecylphenyl)-1,3,5-triazine unit | 9,9-bis(3-hexylphenyl)fluorene unit |
|---|---|---|---|
|  | Constitutional unit represented by formula (4) | Constitutional unit represented by formula (2) | Constitutional unit represented by formula (4) |
| Proportion of constitutional unit | 15.1 | 15.1 | 5.0 |

TABLE 17

| Block (B) | | | | |
|---|---|---|---|---|
| | Constitutional unit represented by formula (4) | Constitutional unit represented by formula (4) | Constitutional unit represented by formula (5) | Constitutional unit represented by formula (4) |
| Proportion of constitutional unit | 20.6 | 14.1 | 7.5 | 22.6 |

Example 6

Synthesis of Polymer Compound P6

<First Step>

After heating a mixture containing the monomer CM11 (0.314 g), the monomer CM3 (0.361 g), and toluene (35 mL) functioning as a solvent to about 80° C. under a nitrogen atmosphere, bistriphenylphosphine palladium dichloride (0.49 mg) and a 20% by mass tetraethylammonium hydroxide aqueous solution (6.4 mL) were added, and while being further heated in an oil bath, the mixture was stirred for about 3 hours under reflux to obtain a polymer compound having a block (A). The polystyrene-equivalent number-average molecular weight (Mn) and the polystyrene-equivalent weight-average molecular weight (Mw) of the polymer compound present in the reaction solution and having a block (A) were Mn=$6.0\times10^3$ and Mw=$1.1\times10^4$.

<Second Step>

Next, the monomer CM11 (0.677 g), the monomer CM10 (0.340 g), the monomer CM12 (0.210 g), the monomer CM13 (0.672 g), and toluene (23 mL) functioning as a solvent were added to the reaction solution, then the mixture was heated to about 80° C., and then bistriphenylphosphine palladium dichloride (0.86 mg) was added, and while being further heated in an oil bath, the mixture was stirred for about 3 hours under reflux.

Next, phenylboronic acid (92.9 mg), bistriphenylphosphine palladium dichloride (1.36 mg), and a 20% by mass tetraethylammonium hydroxide aqueous solution (6.4 mL) were added, and while being further heated in an oil bath, the mixture was stirred for about 17 hours under reflux.

Then a solution prepared by dissolving sodium N,N-diethyldithiocarbamate trihydrate (0.53 g) in ion-exchanged water (11 mL) was added, and then while being heated to 85° C., the mixture was stirred for 2 hours.

The organic layer was serially washed with 3.6% by mass hydrochloric acid (about 35 mL) twice, with a 2.5% by mass ammonia aqueous solution (about 35 mL) twice, and with ion-exchanged water (about 35 mL) four times. Then the organic layer was added dropwise to methanol to allow the product to be precipitated, then the product was filtered out and dried to obtain a solid. The solid was dissolved in toluene (about 100 mL), then it was passed through a silica gel column and alumina column in which toluene had been previously passed through, and the obtained solution was added dropwise to methanol (about 700 mL) to allow a solid to be precipitated, and then it was filtered out and dried to obtain a polymer compound (1.634 g: the polymer compound P6). The polystyrene-equivalent number-average molecular weight (Mn) and the polystyrene-equivalent weight-average molecular weight (Mw) of the polymer compound P6 were Mn=$6.7\times10^4$ and Mw=$1.8\times10^5$.

Because the polymer compound P6 was obtained at a charging ratio of the monomers shown in Tables 18 and 19, it is estimated that the polymer compound P6 is a polymer compound having the constitutional units and the molar ratios shown in Tables 20 and 21. In this case, the average chain length n of the block (A) is estimated to be 2.75.

TABLE 18

| Monomer for polymerization of block (A) | CM11 | CM3 |
|---|---|---|
| Proportion of Monomer | 11.3 | 15.0 |

TABLE 19

| Monomer for polymerization of block (B) | CM11 | CM10 |
|---|---|---|
| Proportion of Monomer | 24.3 | 14.0 |
| Monomer for polymerization of block (B) | CM12 | CM13 |
| Proportion of Monomer | 7.5 | 27.5 |

TABLE 20

| Block (A) | | |
|---|---|---|
| | 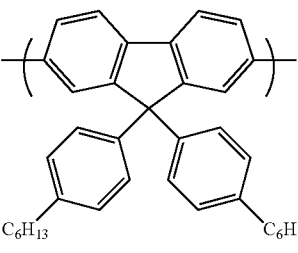 | 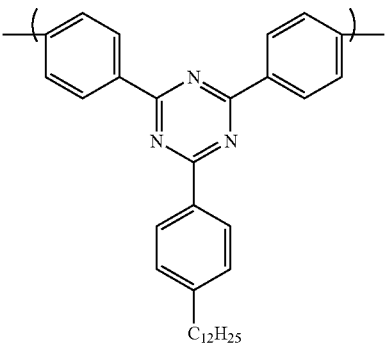 |
| | Constitutional unit represented by formula (4) | Constitutional unit represented by formula (2) |
| Proportion of constitutional unit | 11.4 | 15.1 |

TABLE 21

| Block (B) | | | | |
|---|---|---|---|---|
| | 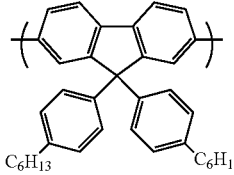 |  | 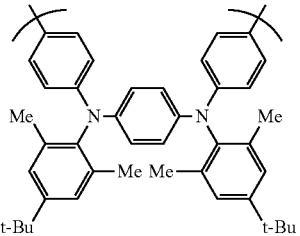 | 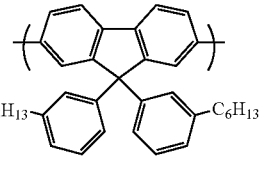 |
| | Constitutional unit represented by formula (4) | Constitutional unit represented by formula (4) | Constitutional unit represented by formula (5) | Constitutional unit represented by formula (4) |
| Proportion of constitutional unit | 24.4 | 14.1 | 7.5 | 27.6 |

Synthesis Example 3

Synthesis of Polymer Compound CP1

After heating a mixture containing monomers such as the compound CM2 (1.560 g), the compound CM1 (0.324 g), the compound CM3 (0.598 g), and the compound CM5 (2.066 g), and toluene (50 mL) functioning as a solvent to about 80° C. under a nitrogen atmosphere, palladium acetate (1.7 mg), tris(2-methoxyphenyl)phosphine (10.0 mg), and a 20% by weight tetraethylammonium hydroxide aqueous solution (16 in L) were added, and while being further heated in an oil bath, the mixture was stirred for about 21 hours under reflux.

Next, phenylboronic acid (58.0 mg), palladium acetate (1.6 mg), tris(2-methoxyphenyl)phosphine (10.1 mg), and a 20% by weight tetraethylammonium hydroxide aqueous solution (16 mL) were added, and while being further heated in an oil bath, the mixture was stirred for 19.5 hours under reflux.

The aqueous layer was removed by separation, then a solution prepared by dissolving sodium N,N-diethyldithiocarbamate trihydrate (2.62 g) in ion-exchanged water (52 mL) was added, and then while being heated to 85° C., the mixture was stirred for about 2 hours.

After separating the organic layer from the aqueous layer, the organic layer was serially washed with ion-exchanged water twice, with a 3% by weight acetic acid aqueous solution twice, and with ion-exchanged water four times. Then the organic layer was added dropwise to methanol to allow the polymer compound to be precipitated, then the polymer compound was filtered out and dried to obtain a solid. The solid was dissolved in toluene, then it was passed through a silica gel column and alumina column in which toluene had been previously passed through, and the obtained solution was added dropwise to methanol to allow the polymer compound to be precipitated, and then it was filtered out and dried to obtain a polymer compound (1.980 g: the polymer compound CP1). The polystyrene-equivalent number-average molecular weight (Mn) and the polystyrene-equivalent weight-average molecular weight (Mw) of the polymer compound CP1 were $Mn=9.2 \times 10^4$ and $Mw=2.8 \times 10^5$ and the glass transition temperature was 123° C.

Because the polymer compound CP1 was obtained at a charging ratio of the monomers shown in Table 22, it is estimated that the polymer compound CP1 is a polymer having the constitutional units and the molar ratios shown in the following Table 23. In this case, the average chain length n in the polymer compound CP1 is estimated to be 11.0.

TABLE 22

| Monomer | CM2 | CM1 | CM3 | CM5 |
|---|---|---|---|---|
| Proportion of Monomer | 40.0 | 10.0 | 10.0 | 40.0 |

TABLE 23

| CP1 | | | | |
|---|---|---|---|---|
| Proportion of constitutional unit | 40 | 10 | 10 | 40 |

Comparative Example 1

Case of Using Polymer Compound CP1 For Light-Emitting Layer

<Preparation of Composition MCP1 and its Solution>

A composition MCP1 including a mixture of the polymer compound CP1 and the light-emitting material EM-A at a weight ratio of 70:30 was dissolved in xylene (manufactured by Kanto Chemical Co., Inc. with the grade for use in electronics) to achieve a concentration of the total solid content of 1.8% by weight. The solution obtained as above will be hereinafter referred to as a "1.8% by weight xylene solution containing the composition MCP1."

<Fabrication of Light-Emitting Device DCP1>

A light-emitting device DCP1 was fabricated in the similar manner as Example 3 except that the 1.8% by weight xylene solution containing the composition MCP1 was used instead of the 2.5% by weight xylene solution containing the composition MP1 of Example 3 and that the rotation speed in the spin coating was changed from 2,100 rpm to 2,650 rpm.

<Evaluation of Characteristics>

When a voltage was applied to the light-emitting device DCP1, green luminescence with a peak wavelength (EL) at 520 nm was obtained. The driving voltage at the brightness of 1,000 cd/m² was 7.11 V, and the chromaticity coordinate C.I.E. 1931 was (x, y)=(0.305, 0.638). When the initial brightness was set at 8,000 cd/m² and the device was driven with a constant current, time taken for reducing the brightness by 20% was 4.9 hours and the brightness half-life was 48.0 hours.

The polymer compound (CP1) used for the light-emitting device DCP1 in Comparative Example 1 is a polymer compound including constitutional units similar to those of the polymer compound (P1) used for the light-emitting device DP1 in Example 3 and the polymer compound (P2) used for the light-emitting device DP2 in Example 4 but not having a block (A) with an electron transporting property as those imparted in P1 and P2. In order to verify the difference of characteristics occurring due to the difference in the structures of the polymer compounds, the following Table 24 shows relative values of the driving voltages for the light-emitting devices at the brightness of 1,000 cd/m², the time taken for reducing the brightness by 20%, which is an index for the stability of the light-emitting device, and the brightness half-life, when the values of the DCP1 are 1.00.

TABLE 24

| | Driving voltage at 1,000 cd/m² (relative value) | Time required for reducing brightness by 20% (relative value) | Time required for reducing brightness by half (relative value) |
|---|---|---|---|
| DP1 | 0.88 | 1.65 | 1.14 |
| DP2 | 0.88 | 2.04 | 1.31 |
| DCP1 | 1.00 | 1.00 | 1.00 |

Synthesis Example 4

Preparation of Light-Emitting Material EM-B

A light-emitting material EM-B was synthesized according to the synthesis method described in WO06/062226.

[Chemical Formula 70]

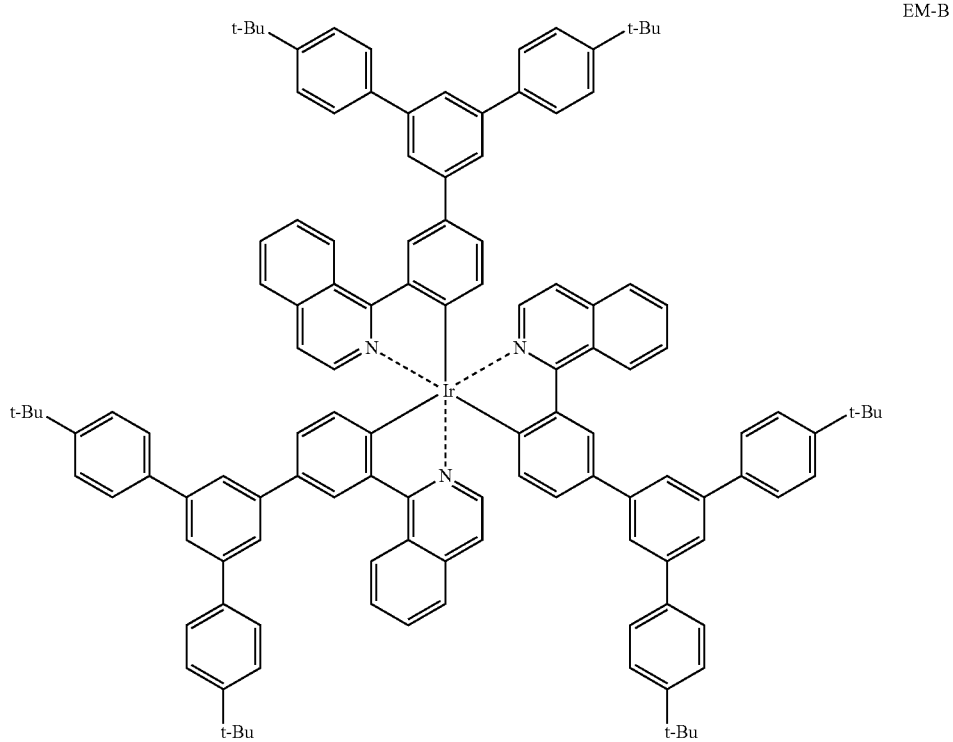

EM-B

Example 7

Case of Using Polymer Compound P5 for Light-Emitting Layer

<Preparation of Composition MP5 and its Solution>

A composition MP5 including a mixture of the polymer compound P5 and the light-emitting material EM-B at a mass ratio of 92.5:7.5 was dissolved in xylene (manufactured by Kanto Chemical Co., Inc. with the grade for use in electronics) to achieve a concentration of the total solid content of 1.8% by mass. The solution obtained as above will be hereinafter referred to as a "1.8% by mass xylene solution containing the composition MP5.

<Fabrication of Light-Emitting Device DP5>

A 65 nm-thick film was formed on a glass substrate provided with a 45 nm-thick ITO film by a sputtering method by using AQ-1200 (manufactured by Plextronics, Inc.), which is a polythiophene/sulfonic acid-based hole injection agent, by spin coating and it was dried on a hot plate at 170° C. for 15 minutes. Next, a film was formed by using a 0.7% by mass xylene solution containing the polymer compound CP2 by spin coating at a rotational speed of 1,890 rpm, and it was dried on a hot plate at 180° C. for 60 minutes under a nitrogen gas atmosphere. The film thickness was about 20 nm.

Then a film was formed by using a 1.8% by mass xylene solution containing the composition MP5 by spin coating at a rotational speed of 1,760 rpm. The film thickness was about 80 nm. It was dried on a hot plate at 180° C. for 10 minutes under a nitrogen gas atmosphere, and then sodium fluoride and aluminum were vapor-deposited thereon by about 3 nm and about 80 nm, respectively, as a cathode to fabricate a light-emitting device DP1. The vapor deposition of the metal was initiated after the degree of vacuum fell to $1 \times 10^{-4}$ Pa or lower.

The device configuration of the obtained light-emitting device DP5 is ITO (anode)/AQ1200 (hole injection layer, 65 nm)/polymer compound CP2 (hole transport layer)/composition MP5 (light-emitting layer)/sodium fluoride (3 nm)/Al (80 nm) (sodium fluoride and Al were together to form the cathode).

<Evaluation of Characteristics>

When a voltage was applied to the obtained light-emitting device DP5, red luminescence with a peak wavelength (EL) at 625 nm was obtained. The driving voltage at the brightness of 1,000 cd/m$^2$ was 4.19 V, and the chromaticity coordinate C.I.E. 1931 was (x, y)=(0.668, 0.329). When the initial brightness was set at 8,000 cd/m$^2$ and the device was driven with a constant current, time taken for reducing the brightness by 20% was 20.5 hours and the brightness half-life was 161.7 hours.

Example 8

Case of Using Polymer Compound P6 for Light-Emitting Layer

<Preparation of Composition MP6 and its Solution>

A composition MP6 including a mixture of the polymer compound P6 and the light-emitting material EM-B at a mass ratio of 92.5:7.5 was dissolved in xylene (manufactured by Kanto Chemical Co., Inc. with the grade for use in electronics) to achieve a content of the total solid content of 1.8% by mass. The solution obtained as above will be hereinafter referred to as a "1.8% by mass xylene solution containing the composition MP6."

<Fabrication of Light-Emitting Device DP6>

A light-emitting device DP6 was fabricated in the similar manner as Example 7 except that the 1.8% by mass xylene solution containing the composition MP6 was used instead of the 1.8% by mass xylene solution containing the composition MP5 of Example 7 and that the rotation speed in the spin coating was changed from 1,760 rpm to 2,200 rpm.

<Evaluation of Characteristics>

When a voltage was applied to the obtained light-emitting device DP5, red luminescence with a peak wavelength (EL) at 625 nm was obtained. The driving voltage at the brightness of 1,000 cd/m$^2$ was 4.58 V, and the chromaticity coordinate C.I.E. 1931 was (x, y)=(0.669, 0.329). When the initial brightness was set at 8,000 cd/m$^2$ and the device was driven with a constant current, time taken for reducing the brightness by 20% was 30.8 hours and the brightness half-life was 258.0 hours.

Synthesis Example 5

Synthesis of Polymer Compound CP3

After heating a mixture containing the monomer CM11 (1.6726 g), the monomer CM10 (0.5658 g), the monomer CM13 (1.1148 g), the monomer CM3 (0.5995 g), the monomer CM12 (0.3484 g), and toluene (69 mL) functioning as a solvent to about 80° C. under a nitrogen atmosphere, dichlorobis(triphenylphosphine)palladium (2.28 mg), a 20% by weight tetraethylammonium hydroxide aqueous solution (11.1 g) were added, and while being further heated in an oil bath, the mixture was stirred for about 7 hours under reflux.

Next, phenylboronic acid (37.7 mg), dichlorobis(triphenylphosphine)palladium (2.28 mg), and a 20% by weight tetraethylammonium hydroxide aqueous solution (11.1 g) were added, and while being further heated in an oil bath, the mixture was stirred for about 16 hours under reflux.

A solution prepared by dissolving sodium N,N-diethyldithiocarbamate trihydrate (1.75 g) in ion-exchanged water (35 mL) was added, and while being heated to 85° C., the mixture was stirred for 2 hours.

The organic layer was serially washed with ion-exchanged water twice, with a 3% by weight acetic acid twice, and with ion-exchanged water twice. Then the organic layer was added dropwise to methanol to allow the polymer compound to be precipitated, then the polymer compound was filtered out and dried to obtain a solid. The solid was dissolved in toluene, then it was passed through a silica gel column and alumina column in which toluene had been previously passed through, and the obtained solution was added dropwise to methanol to allow the polymer compound to be precipitated, and then it was filtered out and dried to obtain a polymer compound (2.561 g: the polymer compound CP3). The polystyrene-equivalent number-average molecular weight (Mn) and the polystyrene-equivalent weight-average molecular weight (Mw) of the polymer compound CP3 were Mn=1.2×10$^5$ and Mw=3.3×10$^5$.

Because the polymer compound CP3 was obtained at a charging ratio of the monomers shown in Table 25, it is estimated that the polymer compound CP3 is a polymer having the constitutional units and the molar ratios shown in the following Table 26.

TABLE 25

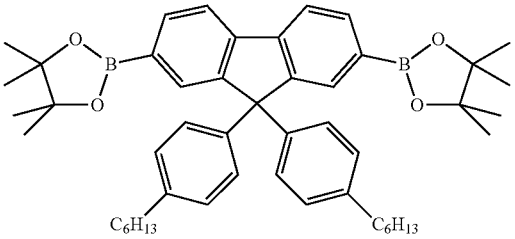

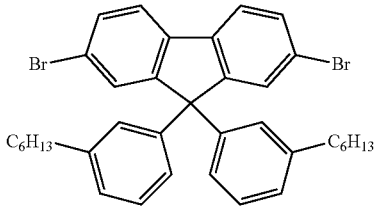

TABLE 25-continued
| | | |
|---|---|---|
| Proportion of Monomer | 27.5 | 15.0 |
| | Monomer | 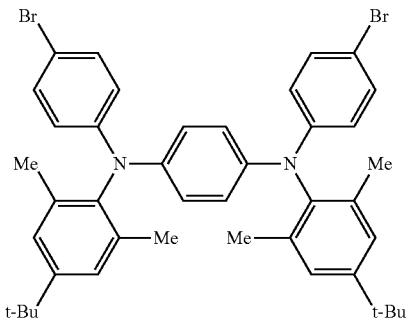 [SMILES: Cc1cc(C(C)(C)C)cc(C)c1N(c1ccc(Br)cc1)c1ccc(N(c2ccc(Br)cc2)c2c(C)cc(C(C)(C)C)cc2C)cc1] CM12 |
| | Proportion of Monomer | 7.5 |
TABLE 26
| CP3 | 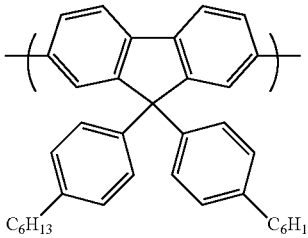 | 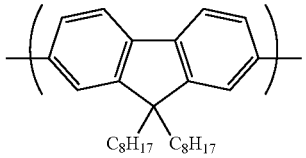 |
|---|---|---|
| | Constitutional unit represented by formula (4) | Constitutional unit represented by formula (4) |
| Proportion of constitutional unit | 36.0 | 14.0 |
| CP3 | 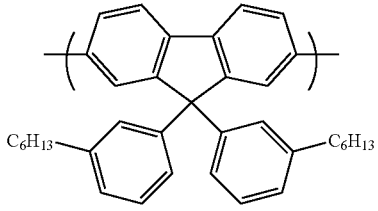 | 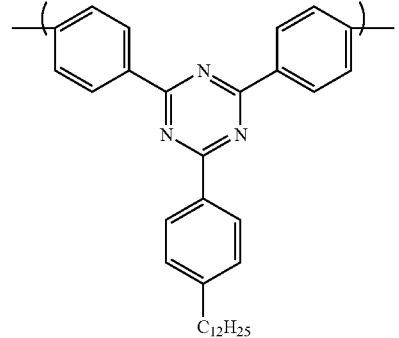 |
| | Constitutional unit represented by formula (4) | Constitutional unit represented by formula (2) |
| Proportion of constitutional unit | 27.5 | 15.0 |

TABLE 26-continued

| | CP3 |
|---|---|
| Proportion of constitutional unit | Constitutional unit represented by formula (5)<br>7.5 |

Example 9

Synthesis of Polymer Compound P7

<First Step>

After heating a mixture containing the monomer CM6 (0.3218 g), the monomer CM5 (0.0885 g), the monomer CM3 (0.4103 g), and toluene (44 mL) functioning as a solvent to about 80° C. under a nitrogen atmosphere, palladium acetate (0.17 mg), tris(2-methoxyphenyl)phosphine (1.17 mg), and a 20% by mass tetraethylammonium hydroxide aqueous solution (11.4 g) were added, and while being further heated in an oil bath, the mixture was stirred for about 3 hours under reflux to obtain a polymer compound having a block (A). The polystyrene-equivalent number-average molecular weight (Mn) and the polystyrene-equivalent weight-average molecular weight (Mw) of the polymer compound present in the reaction solution and having a block (A) were Mn=$1.2\times10^4$ and Mw=$2.0\times10^4$.

<Second Step>

Next, the monomer CM6 (1.2872 g), the monomer CM5 (1.3280 g), and toluene (19 mL) functioning as a solvent were further added to the reaction solution, then the mixture was heated to about 80° C., and then palladium acetate (0.50 mg) and tris(2-methoxyphenyl)phosphine (3.33 mg) were added, and while being further heated in an oil bath, the mixture was stirred for about 3.5 hours under reflux.

Next, phenylboronic acid (159 mg), palladium acetate (0.65 mg), tris(2-methoxyphenyl)phosphine (4.48 mg), and a 20% by mass tetraethylammonium hydroxide aqueous solution (11.4 g) were added, and while being further heated in an oil bath, the mixture was stirred for about 15 hours under reflux.

A solution prepared by dissolving sodium N,N-diethyldithiocarbamate trihydrate (0.91 g) in ion-exchanged water (18 mL) was added to the reaction solution, and while being heated to 85° C., the mixture was stirred for 3.5 hours.

The organic layer was serially washed with 3.6% by mass hydrochloric acid (about 40 mL) twice, with a 2.5% by mass ammonia aqueous solution (about 40 mL) twice, and with ion-exchanged water (about 40 mL) four times. Then the organic layer was added dropwise to methanol to allow the product to be precipitated, then the product was filtered out and dried to obtain a solid. The solid was dissolved in toluene (about 110 mL), then it was passed through a silica gel column and alumina column in which toluene had been previously passed through, and the obtained solution was added dropwise to methanol (about 800 mL) to allow a solid to be precipitated, and then it was filtered out and dried to obtain a polymer compound (1.765 g: the polymer compound P7). The polystyrene-equivalent number-average molecular weight (Mn) and the polystyrene-equivalent weight-average molecular weight (Mw) of the polymer compound P7 were Mn=$1.0\times10^5$ and Mw=$3.0\times10^5$.

Because the polymer compound P7 was obtained at a charging ratio (molar ratio) of the monomers shown in Tables 27 and 28, it is estimated that the polymer compound P7 is a polymer compound having the constitutional units and the molar ratios shown in the following Tables 29 and 30. In this case, the average chain length n of the block (A) is estimated to be 3.25.

TABLE 27

| Monomer for polymerization of block (A) | CM6 | CM3 | CM5 |
|---|---|---|---|
| Proportion of Monomer | 10.0 | 10.0 | 2.5 |

TABLE 28

| Monomer for polymerization of block (B) | CM6 | CM5 |
|---|---|---|
| Proportion of Monomer | 40.0 | 37.5 |

TABLE 29

| Block (A) | Constitutional unit represented by formula (3) | Constitutional unit represented by formula (2) | Constitutional unit represented by formula (4) |
|---|---|---|---|
| Proportion of constitutional unit | 10 | 10 | 2.5 |

TABLE 30

| Block (B) | Constitutional unit represented by formula (3) | Constitutional unit represented by formula (4) |
|---|---|---|
| Proportion of constitutional unit | 40 | 37.5 |

Example 10

Case of Using Polymer Compound P7 for Light-Emitting Layer

<Preparation of Composition MP7 and its Solution>

A composition MP7 including a mixture of the polymer compound P7 and the light-emitting material EM-A at a mass ratio of 70:30 was dissolved in xylene (manufactured by Kanto Chemical Co., Inc. with the grade for use in electronics) to achieve a concentration of the total solid content of 1.8% by mass. The solution obtained as above will be hereinafter referred to as a "1.8% by mass xylene solution containing the composition MP7."

<Fabrication of Light-Emitting Device DP7>

A light-emitting device DP7 was fabricated in the similar manner as Example 7 except that the 1.8% by mass xylene solution containing the composition MP7 was used instead of the 1.8% by mass xylene solution containing the composition MP5 of Example 7 and that the rotation speed in the spin coating was changed from 1,760 rpm to 3,120 rpm.

<Evaluation of Characteristics>

When a voltage was applied to the obtained light-emitting device DP7, green luminescence with a peak wavelength (EL) at 520 nm was obtained. The driving voltage at the brightness of 1,000 cd/m$^2$ was 5.64 V, and the chromaticity coordinate C.I.E. 1931 was (x, y)=(0.313, 0.634). When the initial brightness was set at 8,000 cd/m$^2$ and the device was driven with a constant current, time taken for reducing the brightness by 20% was 6.8 hours and the brightness half-life was 47.0 hours.

Example 11

Synthesis of Polymer Compound P8

<First Step>

After heating a mixture containing the monomer CM6 (1.1584 g), the monomer CM5 (1.4165 g), and toluene (44 mL) functioning as a solvent to about 80° C. under a nitrogen atmosphere, palladium acetate (0.52 mg), tris(2-methoxyphenyl)phosphine (3.59 mg), and a 20% by mass tetraethylammonium hydroxide aqueous solution (11.4 g) were added, and while being further heated in an oil bath, the mixture was stirred for about 4 hours under reflux to obtain a polymer compound. The polystyrene-equivalent number-average molecular weight (Mn) and the polystyrene-equivalent weight-average molecular weight (Mw) of the polymer compound present in the reaction solution were Mn=$1.1 \times 10^4$ and Mw=$2.7 \times 10^4$.

<Second Step>

Next, the monomer CM6 (0.4505 g), the monomer CM3 (0.4103 g), and toluene (19 mL) functioning as a solvent were further added to the reaction solution, then the mixture was heated to about 80° C., and then palladium acetate (0.18 mg) and tris(2-methoxyphenyl)phosphine (1.00 mg) were added, and while being further heated in an oil bath, the mixture was stirred for about 2 hours under reflux.

Next, phenylboronic acid (160 mg), palladium acetate (0.76 mg), tris(2-methoxyphenyl)phosphine (4.61 mg), and a 20% by mass tetraethylammonium hydroxide aqueous solution (11.4 g) were added, and while being further heated in an oil bath, the mixture was stirred for about 17 hours under reflux.

A solution prepared by dissolving sodium N,N-diethyldithiocarbamate trihydrate (0.91 g) in ion-exchanged water (18 mL) was added to the reaction solution, and then while being heated to 85° C., the mixture was stirred for 2 hours. Thereby a polymer compound having the block (B) derived from the polymer compound obtained by the first step and block (A) produced by the reaction in the second step was produced.

The organic layer was serially washed with 3.6% by mass hydrochloric acid (about 42 mL) twice, with a 2.5% by mass ammonia aqueous solution (about 42 mL) twice, and with ion-exchanged water (about 42 mL) four times. Then the organic layer was added dropwise to methanol to allow the product to be precipitated, then the product was filtered out and dried to obtain a solid. The solid was dissolved in toluene (about 240 mL), then it was passed through a silica gel column and alumina column in which toluene had been previously passed through, and the obtained solution was added dropwise to methanol (about 800 mL) to allow a solid to be precipitated, and then it was filtered out and dried to obtain a polymer compound (1.925 g: the polymer compound P8). The polystyrene-equivalent number-average molecular weight (Mn) and the polystyrene-equivalent weight-average molecular weight (Mw) of the polymer compound P8 were Mn=$1.3 \times 10^6$ and Mw=$4.5 \times 10^5$.

Because the polymer compound P8 was obtained at a charging ratio (molar ratio) of the monomers shown in Tables 31 and 32, it is estimated that the polymer compound P8 is a polymer compound having the constitutional units and the molar ratios shown in the following Tables 33 and 34. In this case, the average chain length n of the block (A) is estimated to be 3.40.

In Table 31, the "monomer for polymerization of block (B)" refers to a monomer used to produce the polymer compound having the block (B) in the first step, and in Table 32, the "monomer for polymerization of block (A)" refers to a monomer added in the second step to form the block (A). Tables 33 and 34 show the constitutional units formed from the monomers and ratios (molar ratios) of the respective constitutional units determined based on the ratios of the monomers.

TABLE 31

| Monomer for polymerization of block (B) | CM6 | CM5 |
|---|---|---|
| Proportion of Monomer | 36.0 | 40.0 |

TABLE 32

| Monomer for polymerization of block (A) | 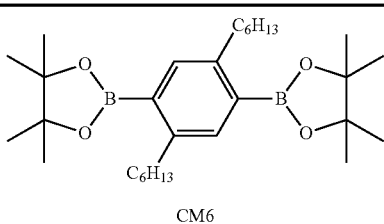 CM6 | 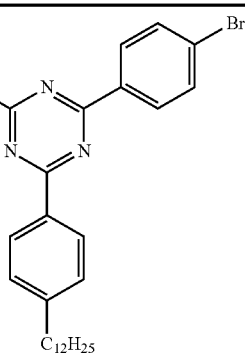 CM3 |
|---|---|---|
| Proportion of Monomer | 14.0 | 10.0 |

TABLE 33

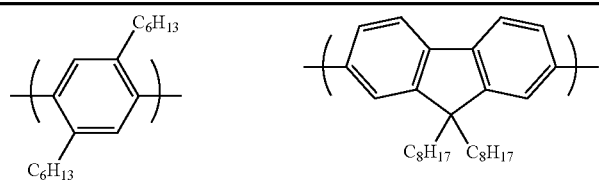

| Block (B) | Constitutional unit represented by formula (3) | Constitutional unit represented by formula (4) |
|---|---|---|
| Proportion of constitutional unit | 36 | 40 |

TABLE 34

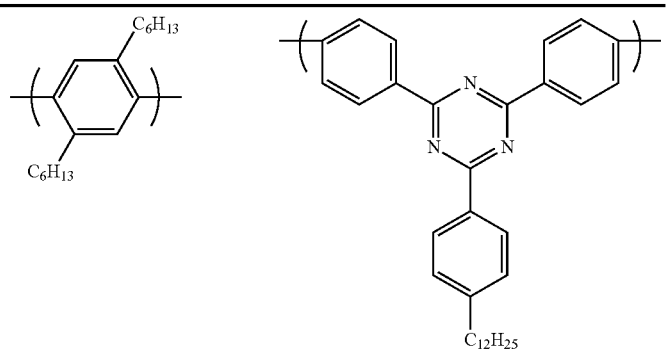

| Block (A) | Constitutional unit represented by formula (3) | Constitutional unit represented by formula (2) |
|---|---|---|
| Proportion of constitutional unit | 14 | 10 |

Example 12

Case of Using Polymer Compound P8 for Light-Emitting Layer

<Preparation of Composition MP8 and its Solution>

A composition MP8 including a mixture of the polymer compound P8 and the light-emitting material EM-A at a mass ratio of 70:30 was dissolved in xylene (manufactured by Kanto Chemical Co., Inc. with the grade for use in electronics) to achieve a concentration of the total solid content of 1.6% by mass. The solution obtained as above will be herein after referred to as a "1.6% by mass xylene solution containing the composition MP8."

<Fabrication of Light-Emitting Device DP8>

A light-emitting device DP8 was fabricated in the similar manner as Example 7 except that the 1.6% by mass xylene solution containing the composition MP8 was used instead of the 1.8% by mass xylene solution containing the composition MP5 of Example 7 and that the rotation speed in the spin coating was changed from 1,760 rpm to 2,600 rpm.

<Evaluation of Characteristics>

When a voltage was applied to the obtained light-emitting device DP8, green luminescence with a peak wavelength (EL) at 520 nm was obtained. The driving voltage at the brightness of 1,000 cd/m² was 6.50 V, and the chromaticity coordinate C.I.E. 1931 was (x, y)=(0.316, 0.632). When the initial brightness was set at 8,000 cd/m² and the device was driven with a constant current, time taken for reducing the brightness by 20% was 6.7 hours and the brightness half-life was 45.5 hours.

Synthesis Example 6

Synthesis of Polymer Compound CP4

After heating a mixture containing monomers such as the monomer CM6 (1.6089 g), the monomer CM5 (1.4165 g), and the monomer CM3 (0.4103 g), and toluene (63 mL) functioning as a solvent to about 80° C. under a nitrogen atmosphere, palladium acetate (0.73 mg), tris(2-methoxyphenyl)phosphine (4.46 mg), and a 20% by weight tetraethylammonium hydroxide aqueous solution (11.4 g) were added, and while being further heated in an oil bath, the mixture was stirred for about 4.5 hours under reflux.

Next, phenylboronic acid (159.1 mg), palladium acetate (0.71 mg), tris(2-methoxyphenyl)phosphine (4.62 mg), and a 20% by weight tetraethylammonium hydroxide aqueous solution (11.4 g) were added, and while being further heated in an oil bath, the mixture was stirred for about 19 hours under reflux.

A solution prepared by dissolving sodium N,N-diethyldithiocarbamate trihydrate (0.91 g) in ion-exchanged water (18 mL) was added, and then while being heated to 85° C., the mixture was stirred for about 2 hours.

The organic layer was serially washed with 3.6% by weight hydrochloric acid (about 50 mL) twice, with a 2.5% by weight ammonia aqueous solution (about 50 mL) twice, and with ion-exchanged water (about 50 mL) six times. Then the organic layer was added dropwise to methanol to allow a polymer compound to be precipitated, then the polymer compound was filtered out and dried to obtain a solid. The solid was dissolved in toluene (about 160 mL), then it was passed through a silica gel column and alumina column in which toluene had been previously passed through, and the obtained solution was added dropwise to methanol (about 800 in L) to allow a polymer compound to be precipitated, and then it was filtered out and dried to obtain a polymer compound (1.77 g: the polymer compound CP4). The polystyrene-equivalent number-average molecular weight (Mn) and the polystyrene-equivalent weight-average molecular weight (Mw) of the polymer compound CP4 were $Mn=1.1\times10^5$ and $Mw=3.5\times10^5$.

Because the polymer compound CP4 was obtained at a charging ratio of the monomers shown in Table 35, it is estimated that the polymer compound CP4 is a polymer compound having the constitutional units and the molar ratios shown in the following Table 36. In this case, the average chain length n of the polymer compound CP4 is estimated to be 11.0.

TABLE 35

| Monomer | 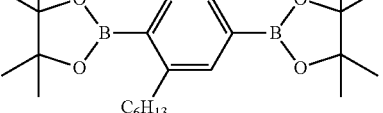 CM6 | 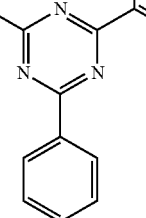 CM3 |
|---|---|---|
| Proportion of Monomer | 50.0 | 10.0 |

| Monomer | 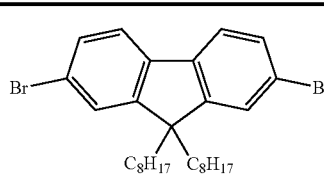 CM5 |
|---|---|
| Proportion of Monomer | 40.0 |

TABLE 36

| CP4 | | |
|---|---|---|
| [structure: 2,5-dihexyl-1,4-phenylene unit with C$_6$H$_{13}$ substituents] | [structure: 2,4,6-triaryl-1,3,5-triazine unit, with three phenyl groups; one para-C$_{12}$H$_{25}$ substituent] | [structure: 9,9-dioctylfluorene unit with C$_8$H$_{17}$, C$_8$H$_{17}$ substituents] |
| Proportion of constitutional unit: 50 | 10 | 40 |

Comparative Example 4

Case of Using Polymer Compound CP4 for Light-Emitting Layer (Preparation of Composition MCP4 and its Solution)

A composition MCP4 including a mixture of the polymer compound CP4 and the light-emitting material EM-A at a weight ratio of 70:30 was dissolved in xylene (manufactured by Kanto Chemical Co., Inc. with the grade for use in electronics) to achieve a content of the total solid content of 1.8% by weight. The solution obtained as above will be hereinafter referred to as a "1.8% by weight xylene solution containing the composition MCP4."

(Fabrication of Light-Emitting Device DCP4)

A light-emitting device DCP4 was fabricated in the similar manner as Example 7 except that the 1.8% by mass xylene solution containing the composition MCP4 was used instead of the 1.8% by mass xylene solution containing the composition MP5 of Example 7 and that the rotation speed in the spin coating was changed from 1,760 rpm to 2,900 rpm.

<Evaluation of Characteristics>

When a voltage was applied to the light-emitting device DCP4, green luminescence with a peak wavelength (EL) at 520 nm was obtained. The driving voltage at the brightness of 1,000 cd/m$^2$ was 8.17 V, and the chromaticity coordinate C.I.E. 1931 was (x, y)=(0.321, 0.629). When the initial brightness was set at 8,000 cd/m$^2$ and the device was driven with a constant current, time taken for reducing the brightness by 20% was 4.7 hours and the brightness half-life was 36.0 hours.

The polymer compound used for the light-emitting device DCP4 in Comparative Example 4 is a polymer compound including constitutional units similar to those of the polymer compound P7 used for the light-emitting device DP7 in Example 10 and the polymer compound P8 used for the light-emitting device DP8 in Example 12 but not having a block (A) with an electron transporting property as those imparted in P7 and P8. In order to verify the difference of characteristics occurring due to the difference in the structures of the polymer compounds, the following Table 37 shows relative values of the driving voltages for the light-emitting devices at the brightness of 1,000 cd/m$^2$, the time taken for reducing the brightness by 20%, which becomes an index for the stability of the light-emitting device, and the brightness half-life, when the values of the DCP4 are 1.00.

TABLE 37

| | Driving voltage at 1,000 cd/m$^2$ (relative value) | Time required for reducing brightness by 20% (relative value) | Time required for reducing brightness by half (relative value) |
|---|---|---|---|
| DP7 | 0.69 | 1.45 | 1.31 |
| DP8 | 0.80 | 1.43 | 1.26 |
| DCP4 | 1.00 | 1.00 | 1.00 |

Synthesis Example 7

Preparation of Light-Emitting Material EM-C

A light-emitting material EM-C was synthesized according to the following synthesis method.

[Chemical Formula 71]

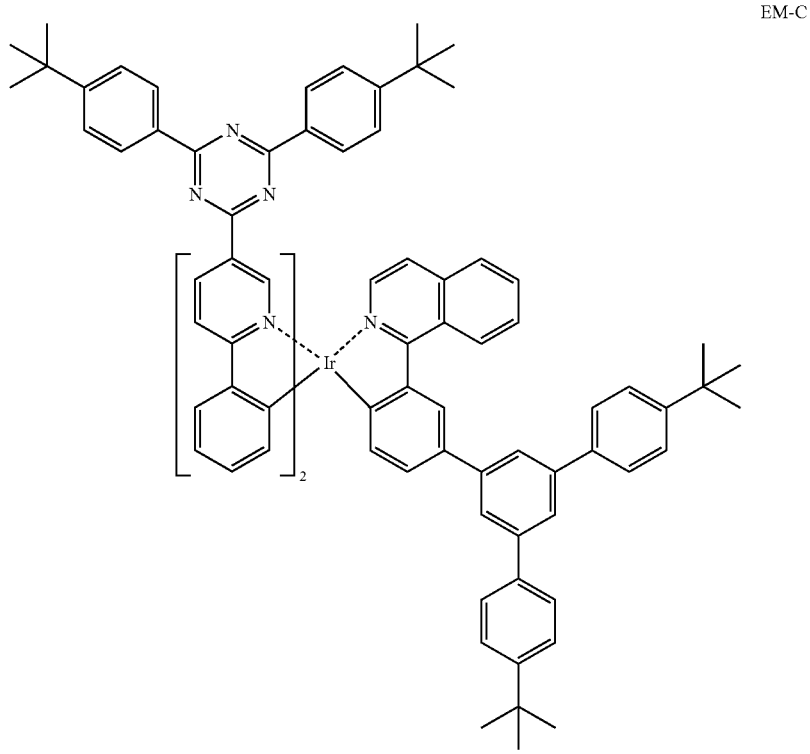

EM-C 5-bromo-2-phenylpyridine and 4,6-bis(4-tert-butylphenyl)-2-chloro-1,3,5-triazin were synthesized according to a method described in Japanese Patent Application Laid-Open No. 2008-179617. Next, a compound L-2 was synthesized based on these materials by the following method.

[Chemical Formula 72]

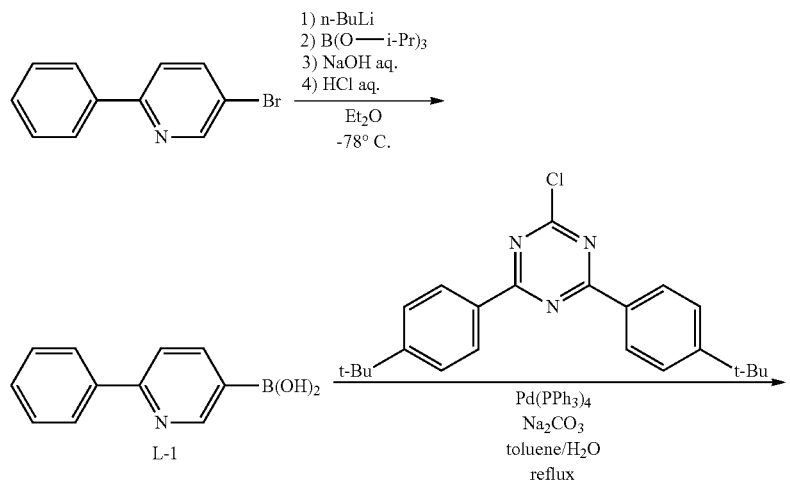

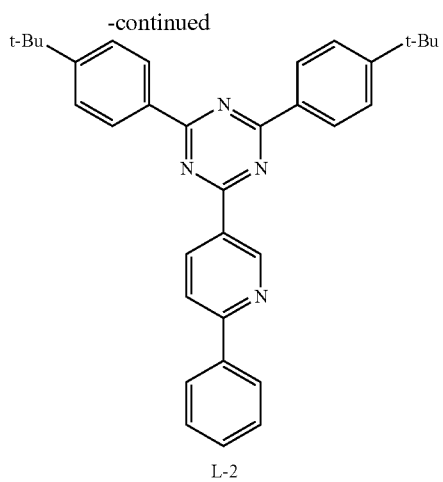

L-2

5-bromo-2-phenylpyridine (103.0 g, 440 mmol) and 1,320 mL dehydrated diethyl ether were measured and placed in a reactor and the mixture was cooled to −67° C. under a nitrogen atmosphere. An n-butyllithium/hexane solution (1.59 M, 318.2 mL, 506 mmol) was added dropwise to the mixture over a period of 20 minutes. After the drip was completed, the obtained solution was stirred at −67° C. for 1.5 hours, then triisopropyl borate (95.2 g, 506 mmol) was added and the mixture was stirred at −67° C. for 4 hours, and then the temperature was gradually increased to room temperature and the mixture was stirred all night. 440 mL of 1N aqueous sodium hydroxide and 500 mL of distilled water were added to the reaction solution and the mixture was stirred at room temperature for 30 minutes. The aqueous layer was recovered from the reaction solution by carrying out a separation process, and about 400 mL of 3N hydrochloric acid was added to adjust the pH to 5, a syrupy precipitate was generated. The supernatant was removed from the reaction solution, the precipitate was washed twice with 200 mL of diluted water, and it was dissolved in 800 mL of methanol to obtain a methanol solution. The supernatant was extracted twice with 1,000 mL of ethyl acetate and dried over anhydrous magnesium sulfate, and then was vacuum-concentrated together with the methanol solution. Ethyl acetate was added to the obtained residue and water was removed by azeotropy to obtain a compound L-1 (82.9 g) as pale gray powder.

4,6-bis(4-tert-butylphenyl)-2-chloro-1,3,5-triazin (137.1 g, 361 mmol), the compound L-1 (82.6 g, 415 mmol), toluene (2,890 mL), and tetrakis(triphenylphosphine) palladium (0) (8.34 g, 7.22 mmol) were measured and placed in a reactor and while the mixture was stirred at 50° C. under a nitrogen air flow to allow the solid content to be dissolved. A 2M sodium carbonate aqueous solution (722 mL) was added to the obtained solution, and the mixture was refluxed for 17 hours. The organic layer was recovered from the reaction solution and was washed with 1,000 mL of a 5% by weight sodium hydrogen carbonate aqueous solution and 100 mL of a 10% by weight brine. The washed organic layer was dried over sodium sulfate, and concentrated to about 400 mL. The obtained concentrated solution was purified by silica gel column chromatography (toluene), and the solvent was removed by distillation. The obtained residue was dissolved in 350 mL of chloroform, ethanol (1,400 mL) was added to allow it to be crystallized. The crystal was separated and recovered by filtration, washed with 500 mL of ethanol, and dried to obtain a compound L-2 (169.2 g).

The analysis result of the obtained compound L-2 is as follows. In measuring the compound L-2 by an LC-MS, ion-exchanged water containing about 0.1% by weight acetic acid and acetonitrile containing about 0.1% by weight acetic acid were used in the mobile phase of the LC-MS while changing their ratio at the flow rate of 0.2 mL/min.

LC-MS (APPI, positive) m/z: 499 ([M+H]$^+$)

$^1$H-NMR (300 MHz, CDCl$_3$), δ=1.42 (s, 18H), 7.52 (m, 3H), 7.62 (d, J=6.8 Hz, 4H), 7.95 (d, J=8.4 Hz, 1H), 8.16 (d, J=7.3 Hz, 2H), 8.69 (d, J=6.8 Hz, 4H), 9.04 (d, J=8.4 Hz, 1H), 10.02 (s, 1H).

Next, a metal complex compound EM-C, which is a light-emitting material, was synthesized based on the compound L-2 by the following method.

[Chemical Formula 73]
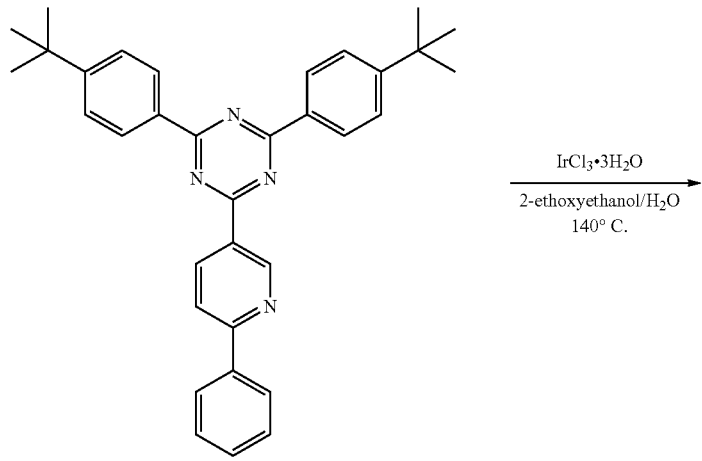
L-2
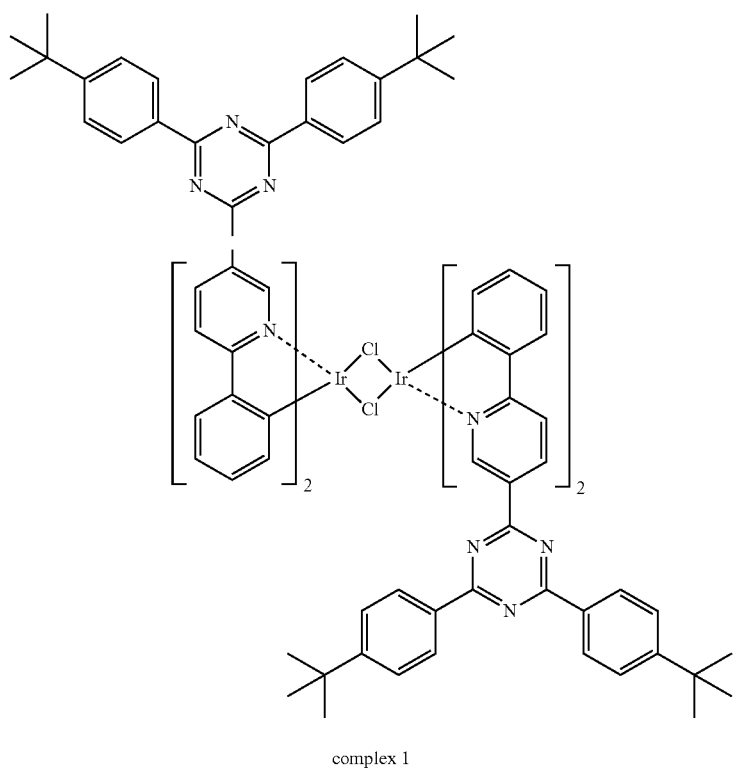
complex 1

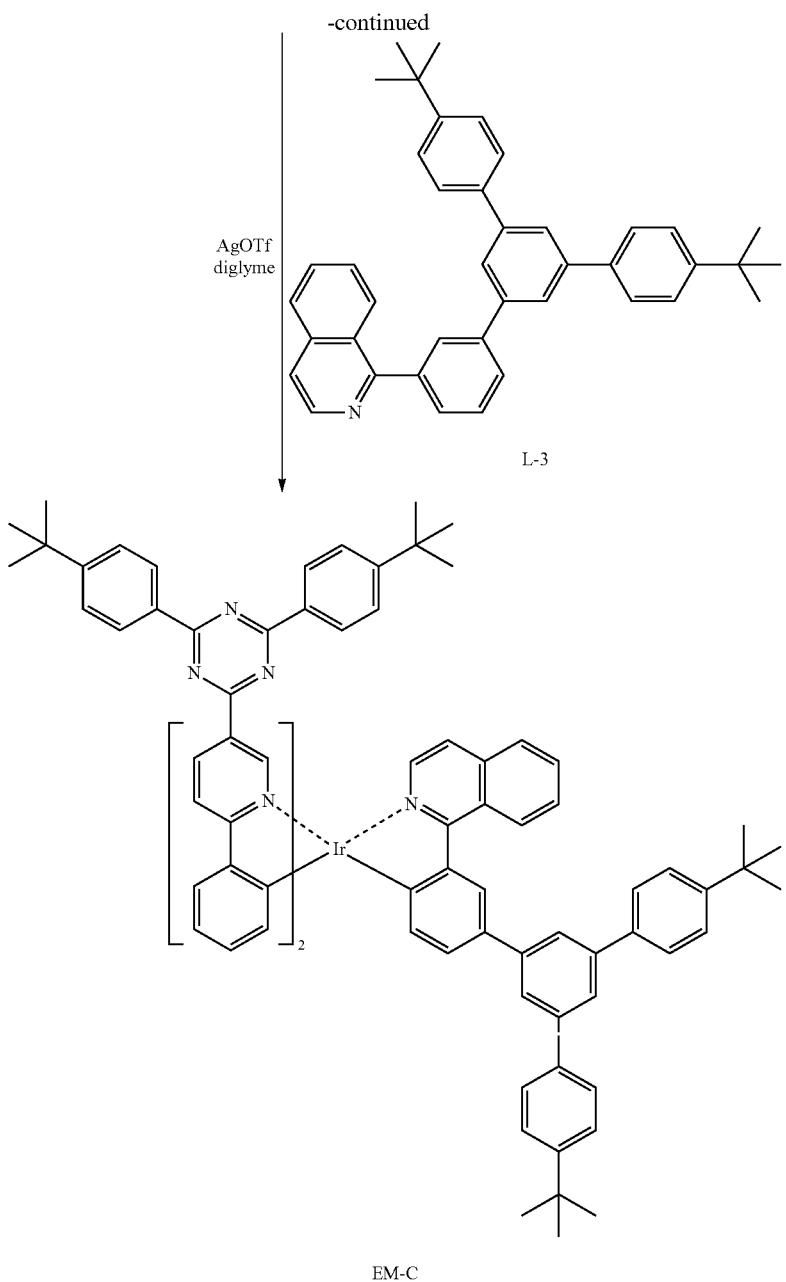

The compound L-2 (22.17 g, 44 mmol), iridium chloride trihydrate (6.95 g, 20 mmol), 2-ethoxyethanol (96 mL), and water (32 mL) were measured and placed in a reactor, and the mixture was heated at 140° C. for 15 hours under an argon stream. After air-cooling the mixture, the obtained mixture was separated by filtration, and the residue was washed with methanol (150 mL), water, (100 mL), and methanol (150 mL) in this order to obtain a red solid. The red solid was dissolved in chloroform (200 mL), then ethanol (300 mL) was added to the mixture, and it was refluxed for 2 hours. After air-cooling, the deposited solid was separated and recovered by filtration and washed with ethanol. After repeating this procedure for three times, the obtained solid was collected and dried under vacuum to obtain a metal complex 1 (20.03 g).

The metal complex 1 (759 mg, 0.30 mmol), a compound L-3 (330 mg, 0.61 mmol) which had been synthesized according to the method described in WO2006/062226, and diglyme (9 mL) were measured and placed in a reactor, silver trifluoromethanesulfonate (157 mg, 0.61 mmol) was added to the mixture, and it was stirred at 100° C. for 10 hours under an argon stream. After air-cooling the reaction mixture, pure water (50 mL) was added to it and the obtained precipitate was separated by filtration. A toluene/hexane (1/2 (on volume basis)) mixed solvent (40 mL) was added to the precipitate and the mixture was filtered. The filtrate was dried over sodium sulfate. The solution was filtered and then purified by silica gel column chromatography (hexane/toluene=1/1.5 (on volume basis)), and the solvent was removed by distillation. The obtained residue was washed with methanol (50 mL) and dried under vacuum to obtain a metal complex compound EM-C (252 mg, 0.15 mmol).

The analysis result of the obtained metal complex compound EM-C is as follows.

LC-MS (APCI, positive) m/z: 1,733 ([M+H]⁺)

¹H-NMR (600 MHz, THF-d₈), δ=1.22 (s, 18H), 1.35 (s, 18H), 1.38 (s, 18H), 6.81 (m, 1H), 6.82 (m, 1H), 6.86 (m, 1H), 6.90 (m, 1H), 6.96 (d, J=7.1 Hz, 1H), 7.41 (d, J=7.1 Hz, 1H), 7.22 (d, J=8.2 Hz, 1H), 7.24 (d, J=8.2 Hz, 1H), 7.47 (d, J=8.2 Hz, 4H), 7.48 (d, J=8.5 Hz, 4H), 7.50 (d, J=8.2 Hz, 4H), 7.66 (m, 1H), 7.66 (d, J=8.2 Hz, 4H), 7.71 (m, 2H), 7.74 (s, 1H), 7.84 (s, 2H), 7.89 (d, J=7.9 Hz, 1H), 7.93 (d, J=7.9 Hz, 1H), 8.03 (d, J=6.4 Hz, 1H), 8.06 (m, 1H), 8.29 (d, J=8.8 Hz, 1H), 8.38 (d, J=8.5 Hz, 4H), 8.41 (d, J=8.8 Hz, 1H), 8.43 (d, J=8.2 Hz, 4H), 8.67 (s, 1H), 8.99 (d, J=8.8 Hz, 1H), 9.21 (m, 1H), 9.23 (d, J=8.8 Hz, 1H), 9.28 (s, 1H), 9.44 (s, 1H).

(Synthesis of Monomer CM16)

The following step was carried out to obtain a monomer CM16 which exhibited 99.0% or more of HPLC area normalization value (UV: 254 nm).

[Chemical Formula 74]

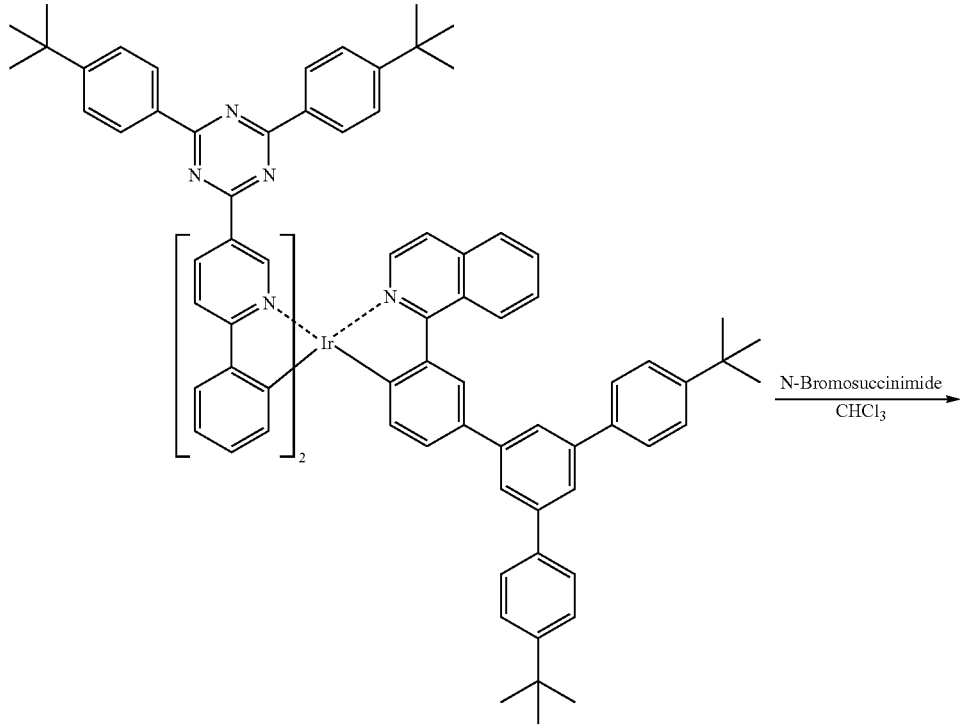

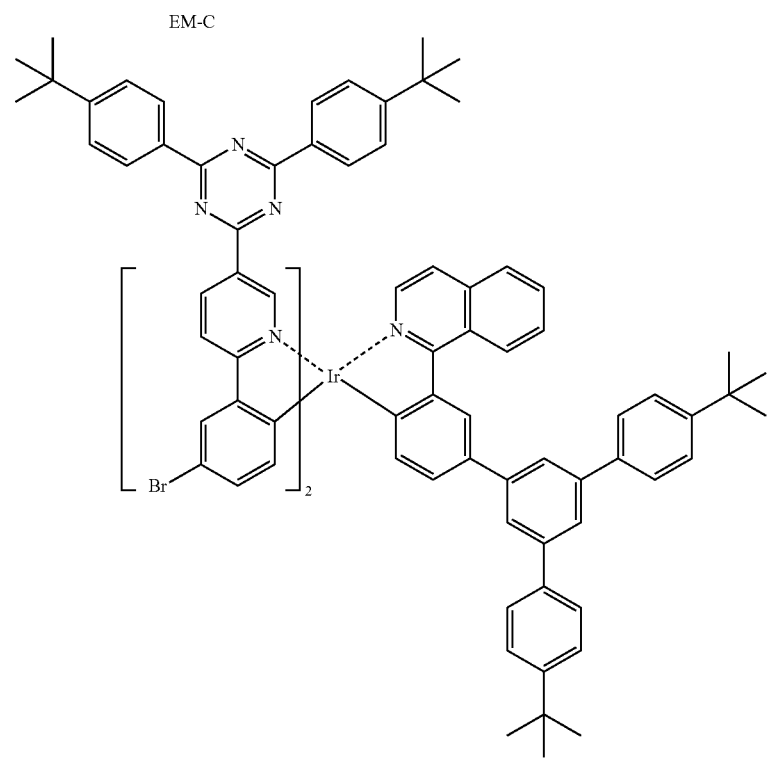

A metal complex compound EM-C (4.25 g, 2.5 mmol) and chloroform (400 mL) were measured and placed in a reactor and the metal complex was dissolved under an argon stream. N-bromosuccinimide (872 mg, 4.9 mmol) was added thereto, and the mixture was stirred at room temperature for 24 hours. The solvent was removed by distillation and then a chloroform/hexane mixed solvent (100 mL) was added to the residue to dissolve the residue. The obtained solution was purified by silica gel chromatography (developing solvent: chloroform/hexane mixed solvent). The eluted solution was recovered, the solvent was removed by distillation, and then the residue was washed with methanol to obtain a metal complex monomer CM16 (3.76 g, 2.0 mmol) represented by the aforementioned formula.

The analysis result of the obtained metal complex monomer CM16 is as follows.

MALDI-TOFMS (positive, [Measuring method 1]) m/z: 1,890 ([M])

$^1$H-NMR (300 MHz, THF-$d_8$), δ=1.27 (s, 18H), 1.36 (s, 18H), 1.41 (s, 18H), 6.95 (m, 4H), 7.24 (m, 2H), 7.48 (m, 12H), 7.69 (m, 5H), 7.74 (m, 3H), 7.83 (s, 2H), 7.99 (d, J=6.0 Hz, 1H), 8.09 (m, 3H), 8.40 (m, 9H), 8.54 (d, J=8.6 Hz, 1H), 8.68 (s, 1H), 9.05 (m, 1H), 9.22 (m, 2H), 9.28 (d, J=8.6 Hz, 1H), 9.46 (s, 1H).

Example 13

Synthesis of Polymer Compound P9

<First Step>

After heating a mixture containing the monomer CM11 (0.2770 g), the monomer CM13 (0.0806 g), the monomer CM3 (0.2383 g), and toluene (31 mL) functioning as a solvent to about 80° C. under a nitrogen atmosphere, dichlorobis(triphenylphosphine)palladium (0.38 mg), a 20% by mass tetraethylammonium hydroxide aqueous solution (6.6 g) were added, and while being further heated in an oil bath, the mixture was stirred for about 3 hours under reflux to obtain a polymer compound having a block (A). The polystyrene-equivalent number-average molecular weight (Mn) and the polystyrene-equivalent weight-average molecular weight (Mw) of the polymer compound present in the reaction solution and having a block (A) were Mn=8.3×10$^3$ and Mw=1.2×10$^4$.

<Second Step>

Next, the monomer CM11 (0.3878 g), the monomer CM10 (0.2249 g), the monomer CM13 (0.3303 g), the monomer CM12 (0.1385 g), the monomer CM16 (0.0945 g), and toluene (19 mL) functioning as a solvent were added to the reaction solution, then the mixture was heated to about 80° C., then dichlorobis(triphenylphosphine)palladium (0.53 g) was added, and then while being further heated in an oil bath, the mixture was stirred for about 4 hours under reflux.

Next, phenylboronic acid (30.8 mg), dichlorobis(triphenylphosphine)palladium (0.94 g), and a 20% by mass tetraethylammonium hydroxide aqueous solution (6.6 g) were added, and while being further heated in an oil bath, the mixture was stirred for about 16 hours under reflux.

A solution prepared by dissolving sodium N,N-diethyldithiocarbamate trihydrate (0.35 g) in ion-exchanged water (6.7 mL) was added to the reaction solution, and then while being heated to 85° C., the mixture was stirred for 2.5 hours.

The organic layer was serially washed with 3.6% by mass hydrochloric acid (about 25 mL) twice, with a 2.5% by mass ammonia aqueous solution (about 25 mL) twice, and with ion-exchanged water (about 25 mL) four times. Then the organic layer was added dropwise to methanol to allow the product to be precipitated, then the product was filtered out and dried to obtain a solid. The solid was dissolved in toluene (about 95 mL), then it was passed through a silica gel column and alumina column in which toluene had been previously passed through, and the obtained solution was added dropwise to methanol (about 475 mL) to allow a solid to be precipitated, and then it was filtered out and dried to obtain a polymer compound (1.134 g: the polymer compound P9). The polystyrene-equivalent number-average molecular weight (Mn) and the polystyrene-equivalent weight-average molecular weight (Mw) of the polymer compound P9 were Mn=9.1×10$^4$ and Mw=3.1×10$^5$.

Because the polymer compound P9 was obtained at a charging ratio (molar ratio) of the monomers shown in Tables 38 and 39, it is estimated that the polymer compound P9 is a polymer compound having the constitutional units and the molar ratios shown in the following Tables 40 and 41. In this case, the average chain length n of the block (A) is estimated to be 3.33.

TABLE 38

| Monomer for polymerization of block (A) | 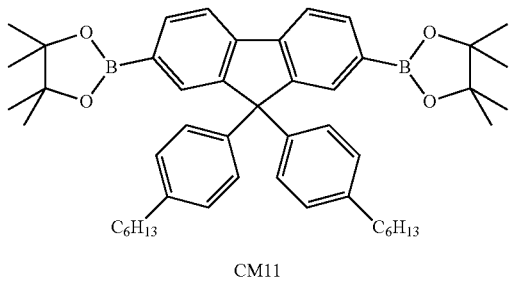 CM11 | 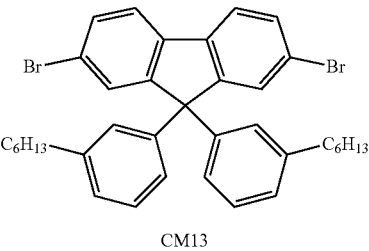 CM13 |
|---|---|---|
| Proportion of Monomer | 15.0 | 5.0 |

TABLE 38-continued

| | Monomer for polymerication of block (A) | CM3 (2,4-bis(4-bromophenyl)-6-(4-dodecylphenyl)-1,3,5-triazine) |
|---|---|---|
| | Proportion of Monomer | 15.0 |

TABLE 39

| Monomer for polymerization of block (B) | CM11 (2,7-bis(pinacolboryl)-9,9-bis(4-hexylphenyl)fluorene) | CM10 (2,7-bis(pinacolboryl)-9,9-dioctylfluorene) |
|---|---|---|
| Proportion of Monomer | 21.0 | 14.0 |
| Monomer for polymerization of block (B) | CM13 (2,7-dibromo-9,9-bis(3-hexylphenyl)fluorene) | CM12 (N,N'-bis(4-bromophenyl)-N,N'-bis(2,6-dimethyl-4-tert-butylphenyl)-1,4-phenylenediamine derivative) |
| Proportion of Monomer | 20.5 | 7.5 |

TABLE 39-continued

| | |
|---|---|
| Monomer for polymerization of block (B) | [structure: bis-tBu-phenyl triazine linked to pyridyl-phenyl Ir complex with Br substituent and tri(tBu-phenyl)benzene ligand] CM16 |
| Proportion of Monomer | 2.0 |

TABLE 40

| Block (A) | [fluorene unit with 9,9-bis(4-hexylphenyl) substituents] | [fluorene unit with 9,9-bis(3-hexylphenyl) substituents] |
|---|---|---|
| | Constitutional unit represented by formula (4) | Constitutional unit represented by formula (4) |
| Proportion of constitutional unit | 15.0 | 5.0 |

| Block (A) | [2,4,6-triphenyl-1,3,5-triazine with one phenyl bearing $C_{12}H_{25}$ substituent] |
|---|---|
| | Constitutional unit represented by formula (2) |
| Proportion of constitutional unit | 15.0 |

TABLE 41

| Block (B) | 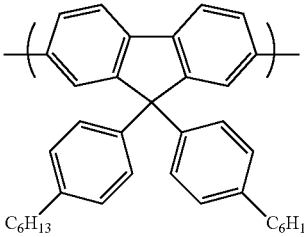 | 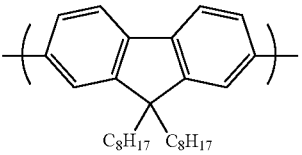 |
|---|---|---|
| | Constitutional unit represented by formula (4) | Constitutional unit represented by formula (4) |
| Proportion of constitutional unit | 21.0 | 14.0 |

| Block (B) | 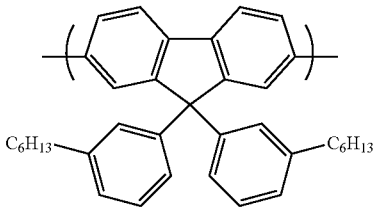 | 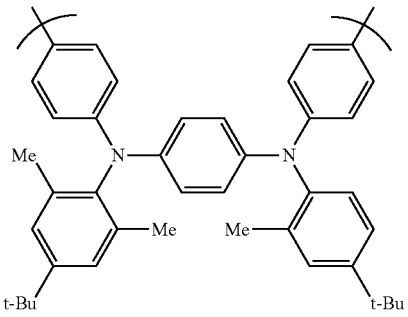 |
|---|---|---|
| | Constitutional unit represented by formula (4) | Constitutional unit represented by formula (5) |
| Proportion of constitutional unit | 20.5 | 7.5 |

| Block (B) | 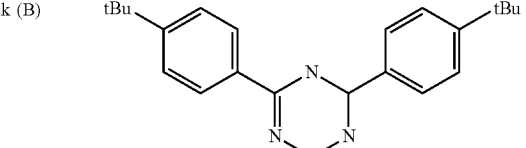 |
|---|---|
| | Constitutional unit derived from phosphorescence-emitting compound |
| Proportion of constitutional unit | 2.0 |

Example 14

Case of Using Polymer Compound P9 for Light-Emitting Layer

<Preparation of Solution Containing Polymer Compound P9>

The polymer compound P9 was dissolved in xylene (manufactured by Kanto Chemical Co., Inc. with the grade for use in electronics) to achieve a concentration of the total solid content of 1.6% by mass. The solution obtained as above will be hereinafter referred to as a "1.6% by mass xylene solution containing the polymer compound P9."

<Fabrication of Light-Emitting Device DP9>

A light-emitting device DP9 was fabricated in the similar manner as Example 7 except that the 1.6% by mass xylene solution containing the polymer compound P9 was used instead of the 1.8% by mass xylene solution containing the composition MP5 of Example 7 and that the rotation speed in the spin coating was changed from 1,760 rpm to 2,100 rpm.

<Evaluation of Characteristics>

When a voltage was applied to the obtained light-emitting device DP9, red luminescence with a peak wavelength (EL) at 615 nm was obtained. The driving voltage at the brightness of 1,000 cd/m$^2$ was 4.23 V, and the chromaticity coordinate C.I.E. 1931 was (x, y)=(0.650, 0.349).

Synthesis Example 8

Synthesis of Polymer Compound CP5

After heating a mixture containing the monomer CM11 (0.2659 g), the monomer CM10 (0.0900 g), the monomer CM13 (0.1644 g), the monomer CM3 (0.0953 g), the monomer CM12 (0.0554 g), the monomer CM16 (0.0378 g), and toluene (16 mL) functioning as a solvent to about 80° C. under a nitrogen atmosphere, dichlorobis(triphenylphosphine)palladium (0.39 g), a 20% by weight tetraethylammonium hydroxide aqueous solution (2.65 g) were added, and while being further heated in an oil bath, the mixture was stirred for about 5 hours under reflux.

Next, phenylboronic acid (12.3 mg), dichlorobis(triphenylphosphine)palladium (0.39 g), and a 20% by weight tetraethylammonium hydroxide aqueous solution (2.65 g) were added, and while being further heated in an oil bath, the mixture was stirred for about 18 hours under reflux.

A solution prepared by dissolving sodium N,N-diethyldithiocarbamate trihydrate (0.14 g) in ion-exchanged water (2.7 in L) was added, and then while being heated to 85° C., the mixture was stirred for 2 hours.

The organic layer was serially washed with 3.6% by weight hydrochloric acid (about 10 mL) twice, with a 2.5% by weight ammonia aqueous solution (about 10 mL) twice, and with ion-exchanged water (about 10 mL) four times. Then the organic layer was added dropwise to methanol to allow a polymer compound to be precipitated, then the polymer compound was filtered out and dried to obtain a solid. The solid was dissolved in toluene (about 28 mL), then it was passed through a silica gel column and alumina column in which toluene had been previously passed through, and the obtained solution was added dropwise to methanol (about 190 mL) to allow a polymer compound to be precipitated, and then it was filtered out and dried to obtain a polymer compound (0.419 g: the polymer compound CP5). The polystyrene-equivalent number-average molecular weight (Mn) and the polystyrene-equivalent weight-average molecular weight (Mw) of the polymer compound CP5 were Mn=9.3×10$^4$ and Mw=3.0×10$^5$.

Because the polymer compound CP5 was obtained at a charging ratio of the monomers shown in Table 42, it is estimated that the polymer compound CP5 is a polymer having the constitutional units and the molar ratios shown in the following Table 43.

TABLE 42

| Monomer | CM11 | CM10 |
|---|---|---|
| Proportion of Monomer | 36.0 | 14.0 |

TABLE 42-continued

| | Monomer | Monomer |
|---|---|---|
| Monomer | CM13 (9,9-bis(3-hexylphenyl)-2,7-dibromofluorene) | CM3 (2,4-bis(4-bromophenyl)-6-(4-dodecylphenyl)-1,3,5-triazine) |
| Proportion of Monomer | 25.5 | 15.0 |
| Monomer | CM12 | CM16 |
| Proportion of Monomer | 7.5 | 2.0 |

TABLE 43

| CP5 | | |
|---|---|---|
| | Constitutional unit represented by formula (4) — 9,9-bis(4-hexylphenyl)fluorene | Constitutional unit represented by formula (4) — 9,9-bis(octyl)fluorene (C₈H₁₇) |
| Proportion of constitutional unit | 36.0 | 14.0 |

TABLE 43-continued

| | CP5 | |
|---|---|---|
| Proportion of constitutional unit | Constitutional unit represented by formula (4)<br>25.5 | Constitutional unit represented by formula (2)<br>15.0 |
| CP5 | | |
| Proportion of constitutional unit | Constitutional unit represented by formula (5)<br>7.5 | Constitutional unit derived from phosphorescence-emitting compound<br>2.0 |

Comparative Example 5

Case of Using Polymer Compound CP5 for Light-Emitting Layer

<Preparation of Solution Containing Polymer Compound CP5>

The polymer compound CP5 was dissolved in xylene (manufactured by Kanto Chemical Co., Inc. with the grade for use in electronics) to achieve a content of the total solid content of 1.8% by mass. The solution obtained as above will be hereinafter referred to as a "1.8% by mass xylene solution containing the polymer compound. CP5."

<Fabrication of Light-Emitting Device DCP5>

A light-emitting device DCP5 was fabricated in the similar manner as Example 7 except that the 1.8% by mass xylene solution containing the polymer compound CP5 was used instead of the 1.8% by mass xylene solution containing the composition MP5 of Example 7 and that the rotation speed in the spin coating was changed from 1,760 rpm to 2,500 rpm.

<Evaluation of Characteristics>

When a voltage was applied to the obtained light-emitting device DCP5, red luminescence with a peak wavelength (EL) at 615 nm was obtained. The driving voltage at the brightness of 1,000 cd/m$^2$ was 4.70 V, and the chromaticity coordinate C.I.E. 1931 was (x, y)=(0.648, 0.350).

The polymer compound (CP5) used for the light-emitting device DCP5 in Comparative Example 5 is a polymer compound including constitutional units similar to those of the polymer compound (P9) used for the light-emitting device DP9 in Example 14, but not having a block (A) with an electron transporting property as that imparted in P9. In order to verify the difference of characteristics occurring due to the difference in the structures of the polymer compounds, the following Table 44 shows relative values of the driving voltages for the light-emitting devices at the brightness of 1,000 cd/m², when the value of the DCP5 is 1.00.

TABLE 44

|  | Driving voltage at 1,000 cd/m² (relative value) |
| --- | --- |
| DP9 | 0.90 |
| DCP5 | 1.00 |

Example 15

Synthesis of Polymer Compound P10

<First Step>

After heating a mixture containing the monomer CM6 (0.3040 g), the monomer CM15 (0.1638 g), the monomer CM14 (0.2742 g), and toluene (29 mL) functioning as a solvent to about 80° C. under a nitrogen atmosphere, palladium acetate (0.22 mg), tris(2-methoxyphenyl)phosphine (1.13 mg), and a 20% by mass tetraethylammonium hydroxide aqueous solution (9.0 g) were added, and while being further heated in an oil bath, the mixture was stirred for about 4 hours under reflux to obtain a polymer compound having a block (A). The polystyrene-equivalent number-average molecular weight (Mn) and the polystyrene-equivalent weight-average molecular weight (Mw) of the polymer compound present in the reaction solution and having a block (A) were Mn=4.4×10³ and Mw=9.8×10³.

<Second Step>

Next, the monomer CM6 (0.9628 g), the monomer CM15 (1.1469 g), and toluene (10 mL) functioning as a solvent were added to the reaction solution, then the mixture was heated to about 80° C., and then palladium acetate (0.44 mg) and tris(2-methoxyphenyl)phosphine (2.54 mg) were added, and while being further heated in an oil bath, the mixture was stirred for about 4 hours under reflux.

Next, phenylboronic acid (63 mg), palladium acetate (0.64 mg), tris(2-methoxyphenyl)phosphine (3.64 mg), and a 20% by mass tetraethylammonium hydroxide aqueous solution (9.0 g) were added, and while being further heated in an oil bath, the mixture was stirred for about 15 hours under reflux.

A solution prepared by dissolving sodium N,N-diethyldithiocarbamate trihydrate (0.72 g) in ion-exchanged water (14 mL) was added to the reaction solution, and then while being heated to 85° C., the mixture was stirred for 3.5 hours.

The organic layer was serially washed with 3.6% by mass hydrochloric acid (about 36 mL) twice, with a 2.5% by mass ammonia aqueous solution (about 36 mL) twice, and with ion-exchanged water (about 36 mL) five times. Then the organic layer was added dropwise to methanol to allow the product to be precipitated, then the product was filtered out and dried to obtain a solid. The solid was dissolved in toluene (about 200 mL), then it was passed through a silica gel column and alumina column in which toluene had been previously passed through, and the obtained solution was added dropwise to methanol (about 680 mL) to allow a solid to be precipitated, and then it was filtered out and dried to obtain a polymer compound (1.499 g: the polymer compound P10). The polystyrene-equivalent number-average molecular weight (Mn) and the polystyrene-equivalent weight-average molecular weight (Mw) of the polymer compound P10 were Mn=1.8×10⁵ and Mw=5.1×10⁵.

Because the polymer compound P10 was obtained at a charging ratio (molar ratio) of the monomers shown in Tables 45 and 46, it is estimated that the polymer compound P10 is a polymer compound having the constitutional units and the molar ratios shown in the following Tables 47 and 48. In this case, the average chain length n of the block (A) is estimated to be 3.70.

TABLE 45

| Monomer for polymerization of block (A) | 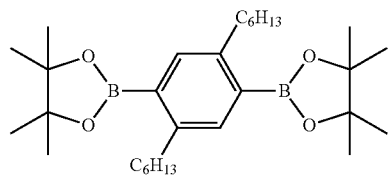 CM6 | 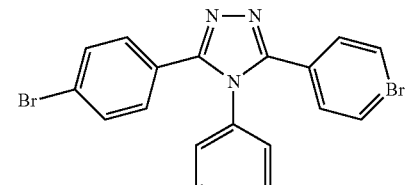 CM14 |
| --- | --- | --- |
| Proportion of Monomer | 12 | 10 |
| Monomer for polymerization of block (A) | 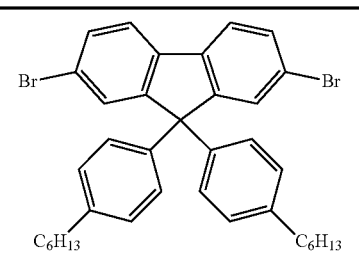 CM15 | |
| Proportion of Monomer | 5 | |

TABLE 46

| Monomer for polymerization of block (B) | CM6 | CM15 |
|---|---|---|
| Proportion of Monomer | 38 | 35 |

TABLE 47

| Block (A) | Constitutional unit represented by formula (3) | Constitutional unit represented by formula (2) | Constitutional unit represented by formula (4) |
|---|---|---|---|
| Proportion of constitutional unit | 12 | 10 | 5 |

TABLE 48

| Block (B) | Constitutional unit represented by formula (3) | Constitutional unit represented by formula (4) |
|---|---|---|
| Proportion of constitutional unit | 38 | 35 |

Example 16

Case of Using Polymer Compound P10 for Light-Emitting Layer

<Preparation of Composition MP10 and its Solution>

A composition MP10 including a mixture of the polymer compound P10 and the light-emitting material EM-A at a mass ratio of 70:30 was dissolved in xylene (manufactured by Kanto Chemical Co., Inc. with the grade for use in electronics) to achieve a content of the total solid content of 1.2% by mass. The solution obtained as above will be hereinafter referred to as a "1.2% by mass xylene solution containing the composition MP10."

<Fabrication of Light-Emitting Device DP10>

A light-emitting device DP10 was fabricated in the similar manner as Example 7 except that the 1.2% by mass xylene solution containing the composition MP10 was used instead of the 1.8% by mass xylene solution containing the composition MP5 of Example 7 and that the rotation speed in the spin coating was changed from 1,760 rpm to 1,650 rpm.

<Evaluation of Characteristics>

When a voltage was applied to the obtained light-emitting device DP10, green luminescence with a peak wavelength (EL) at 520 nm was obtained. The driving voltage at the brightness of 1,000 cd/m² was 7.82 V, and the chromaticity coordinate C.I.E. 1931 was (x, y)=(0.309, 0.636).

Example 17

Case of Using Polymer Compound P5 for Light-Emitting Layer

<Preparation of Composition MP5-2 and its Solution>
A composition MP5-2 including a mixture of the polymer compound P5 and the light-emitting material EM-C at a mass ratio of 92.5:7.5 was dissolved in xylene (manufactured by Kanto Chemical Co., Inc. with the grade for use in electronics) to achieve a content of the total solid content of 1.8% by mass. The solution obtained as above will be hereinafter referred to as a "1.8% by mass xylene solution containing the composition MP5-2."

<Fabrication of Light-Emitting Device DP5-2>
A light-emitting device DP5-2 was fabricated in the similar manner as Example 7 except that the 1.8% by mass xylene solution containing the composition MP5-2 was used instead of the 1.8% by mass xylene solution containing the composition MP5 of Example 7 and that the rotation speed in the spin coating was changed from 1,760 rpm to 1,700 rpm.

<Evaluation of Characteristics>
When a voltage was applied to the obtained light-emitting device DP5-2, red luminescence with a peak wavelength (EL) at 615 nm was obtained. The driving voltage at the brightness of 1,000 cd/m² was 3.94 V, and the chromaticity coordinate C.I.E. 1931 was (x, y)=(0.643, 0.355). When the initial brightness was set at 8,000 cd/m² and the device was driven with a constant current, time taken for reducing the brightness by 20% was 113.6 hours and the brightness 60% reduction life was 463.4 hours.

Comparative Example 6

Case of Using Polymer Compound CP3 for Light-Emitting Layer (Preparation of Composition MCP3 and its Solution)
A composition MCP3 including a mixture of the polymer compound CP3 and the light-emitting material EM-C at a mass ratio of 92.5:7.5 was dissolved in xylene (manufactured by Kanto Chemical Co., Inc. with the grade for use in electronics) to achieve a concentration of the total solid content of 1.8% by mass. The solution obtained as above will be hereinafter referred to as a "1.8% by mass xylene solution containing the composition MCP3."

<Fabrication of Light-Emitting Device DCP3>
A light-emitting device DCP3 was fabricated in the similar manner as Example 7 except that the 1.8% by mass xylene solution containing the composition MCP3 was used instead of the 1.8% by mass xylene solution containing the composition MP5 of Example 7 and that the rotation speed in the spin coating was changed from 1,760 rpm to 2,080 rpm.

<Evaluation of Characteristics>
When a voltage was applied to the obtained light-emitting device DCP3, red luminescence with a peak wavelength (EL) at 615 nm was obtained. The driving voltage at the brightness of 1,000 cd/m² was 4.21 V, and the chromaticity coordinate C.I.E. 1931 was (x, y)=(0.644, 0.355). When the initial brightness was set at 8,000 cd/m² and the device was driven with a constant current, time taken for reducing the brightness by 20% was 101.0 hours and the brightness 60% reduction life was 383.2 hours.

The polymer compound used for the light-emitting device DCP3 in Comparative Example 6 is a polymer compound including constitutional units similar to those of the polymer compound P5 used for the light-emitting device DP5-2 in Example 17, but not having a block (A) having an electron transporting property as that imparted in P5. In order to verify the difference of characteristics occurring due to the difference in the structures of the polymer compounds, the following Table 49 shows relative values of the driving voltages for the light-emitting devices at the brightness of 1,000 cd/m², the time taken for reducing the brightness by 20%, which becomes an index for the stability of the light-emitting device, and the brightness 60% reduction life, when the values of the DCP3 is 1.00.

TABLE 49

| | Driving voltage at 1,000 cd/m² (relative value) | Time required for reducing brightness by 20% (relative value) | Time required for reducing brightness by 60% (relative value) |
|---|---|---|---|
| DP5-2 | 0.94 | 1.12 | 1.21 |
| DCP3 | 1.00 | 1.00 | 1.00 |

REFERENCE SIGNS LIST

0: Substrate
1: Anode
2: Hole injection layer (charge injection layer)
3: Hole transport layer
4: Light-emitting layer
6: Electron injection layer (charge injection layer)
7: Cathode
10: Light-emitting device

The invention claimed is:
1. A polymer compound comprising a block (A) comprising a structure comprising two or more first groups and a second group represented by formula (0-0) linking the first groups, and
wherein the polymer compound comprises as the first groups at least one of a group represented by formula (0-1) and a group represented by formula (0-2);

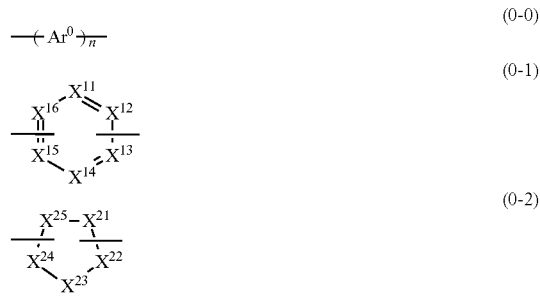

wherein
in formula (0-0), Ar⁰ represents an arylene group or a divalent aromatic heterocyclic group having a structure different from that of the first group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; n represents an average chain length in terms of $Ar^0$ and is a numerical value of 1.0 or more and 8.0 or less; and in formulas (0-1) and (0-2), $X^{11}$, $X^{12}$, $X^{13}$, $X^{14}$, $X^{15}$, $X^{16}$, $X^{21}$, $X^{22}$, $X^{23}$, $X^{24}$ and $X^{25}$ each independently represent a carbon atom or a nitrogen atom, where two or three of $X^{11}$, $X^{12}$, $X^{13}$, $X^{14}$, $X^{15}$ and $X^{16}$ are a nitrogen atom and three of $X^{21}$, $X^{22}$, $X^{23}$, $X^{24}$ and $X^{25}$ are a nitrogen atom; and the group represented by formula (0-1) and the group represented by formula (0-2) may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent, wherein the block (A) comprises multiple constitutional units represented by formula (0);

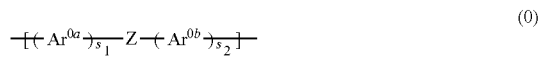

(0)

wherein in formula (0), Z represents the group represented by formula (0-1) or the group represented by formula (0-2);

$Ar^{0a}$ and $Ar^{0b}$ each independently have the same definition as the $Ar^0$ and are each independently a group having a structure different from that of Z; when multiple $Ar^{0a}$ and $Ar^{0b}$ groups are present, the groups may be the same or different; and $s_1$ and $s_2$ each independently represent 1 or 2, further comprising: a block (B) having a structure different from that of the block (A), wherein the block (B) is contained so that a value represented by expression (VII) becomes 0.5 or less;

[B]/[A]  (VII)

wherein in expression (VII), [A] represents a mol % of the constitutional unit represented by formula (0) contained in the block (A); and [B] represents a mol % of the constitutional unit represented by formula (0) in the block (B).

2. The polymer compound according to claim 1, wherein the n is a numerical value of 1.0 or more and 6.5 or less.

3. The polymer compound according to claim 2, wherein the n is a numerical value of 1.5 or more and 5.0 or less.

4. The polymer compound according to claim 1, wherein the $Ar^{0a}$ and $Ar^{0b}$ are each independently at least one group selected from the group consisting of a phenylene group, a naphthalene-diyl group, a fluorene-diyl group and a dihydrophenanthrene-diyl group.

5. The polymer compound according to claim 1, comprising as the constitutional unit represented by formula (0) a constitutional unit represented by formula (2);

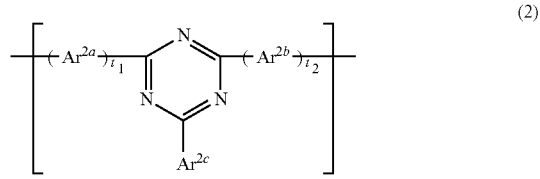

(2)

wherein in formula (2), $Ar^{2a}$ and $Ar^{2b}$ have the same definition as the $Ar^{0a}$ and the $Ar^{0b}$, respectively, where $Ar^{2a}$ and $Ar^{2b}$ are groups different from a 1,3,5-triazine-diyl group; $Ar^{2c}$ represents an aryl group or a monovalent aromatic heterocyclic group, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; when multiple $Ar^{2a}$ and $Ar^{2b}$ groups are present, the groups may be the same or different; and $t_1$ and $t_2$ each independently represent 1 or 2.

6. The polymer compound according to claim 5, wherein the $Ar^{2a}$ and $Ar^{2b}$ are each independently at least one group selected from the group consisting of a phenylene group, a naphthalene-diyl group, a fluorene-diyl group and a dihydrophenanthrene-diyl group.

7. The polymer compound according to claim 5, wherein the block (A) comprises the constitutional unit represented by formula (2) and a constitutional unit represented by formula (I);

(I)

wherein in formula (1), $Ar^1$ represents an arylene group or a divalent aromatic heterocyclic group, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

8. The polymer compound according to claim 7, comprising as the constitutional unit represented by formula (I) at least one constitutional unit selected from the group consisting of a constitutional unit represented by formula (3); and a constitutional unit represented by formula (4), which is different from the constitutional unit represented by formula (2) and the constitutional unit represented by formula (3);

(3)

(4)

wherein in formula (3), $Ar^{3a}$ represents an arylene group or a divalent aromatic heterocyclic group, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; $R^{3a}$ is an alkyl group, an aryl group or a monovalent aromatic heterocyclic group and is a group substituted at a substitution site neighboring a site forming a bonding to another constitutional unit in $Ar^{3a}$; when multiple $R^{3a}$ groups are present, the groups may be the same or different; g is an integer of 1 to 4; and in formula (4), $Ar^{4a}$ represents an arylene group or a divalent aromatic heterocyclic group, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; when multiple $Ar^{4a}$ groups are present, the groups may be the same or different; and k is an integer of 1 to 3.

9. The polymer compound according to claim 8, wherein the constitutional units represented by formula (3) are present adjacent to both sides of the constitutional unit represented by formula (2).

10. The polymer compound according to claim 8, wherein the constitutional units represented by formula (2) are present adjacent to both sides of the constitutional unit represented by formula (3) or both sides of the constitutional unit represented by formula (4).

11. The polymer compound according to claim 8, comprising as the constitutional unit represented by formula (3) at least one constitutional unit selected from the group consisting of the constitutional unit represented by formula (1) and a constitutional unit represented by formula (7);

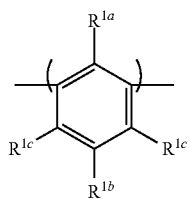  (1)

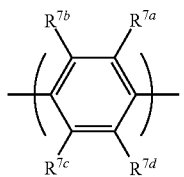  (7)

wherein
in formula (1), $R^{1a}$ represents a hydrogen atom, an alkyl group, an aryl group, a monovalent aromatic heterocyclic group, an aralkyl group or a substituted amino group; $R^{1b}$ and $R^{1c}$ each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; at least one of $R^{1a}$ and $R^{1c}$ comprises a group other than a hydrogen atom; the two $R^{1c}$ groups may be the same or differenr; and
in formula (7), $R^{7a}$ and $R^{7c}$ each independently represent an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group or a cyano group; and $R^{7b}$ and $R^{7d}$ each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group.

12. The polymer compound according to claim 8, comprising as the constitutional unit represented by formula (4) at least one constitutional unit selected from the group consisting of a constitutional unit represented by formula (9), a constitutional unit represented by formula (10) and a constitutional unit represented by formula (11);

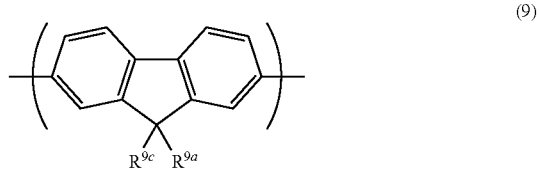  (9)

  (10)

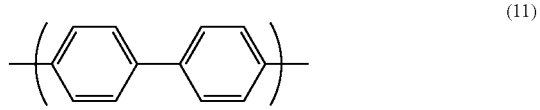  (11)

wherein
in formula (9), $R^{9a}$ and $R^{9c}$ each independently represent an alkyl group, an aryl group, a monovalent aromatic heterocyclic group or an aralkyl group; and $R^{9a}$ and $R^{9c}$ may be bonded together to form a ring structure.

13. The polymer compound according to claim 1, comprising:
the block (A); and
a block (B) comprising a constitutional unit represented by formula (IB) and/or a constitutional unit represented by formula (II);

  (IB)

  (II)

wherein
in formula (IB), $Ar^{1B}$ represents an arylene group or a divalent aromatic heterocyclic group, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; and
in formula (II), $Ar^2$ represents a divalent aromatic amine residue, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent.

14. The polymer compound according to claim 13, comprising as the constitutional unit represented by formula (IB) at least one constitutional unit selected from the group consisting of a constitutional unit represented by formula (3B) and a constitutional unit represented by formula (4B), which is different from the constitutional unit represented by formula (3B), and as the constitutional unit represented by formula (II) a constitutional unit represented by formula (5);

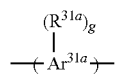
(3B)

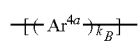
(4B)

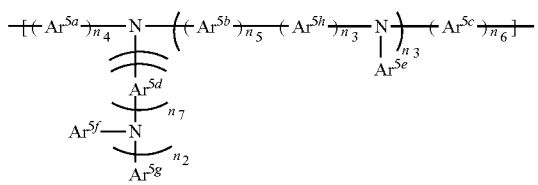
(5)

wherein in formula (3B), $Ar^{31a}$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; $R^{31a}$ is an alkyl group, an aryl group or a monovalent aromatic heterocyclic group, and is a group substituted at a substitution site neighboring a site at forming a bonding to another constitutional unit in $Ar^{31a}$; when multiple $R^{31a}$ groups are present, the groups may be the same or different; $g_B$ is an integer of 1 to 4;

in formula (4B), $Ar^{41a}$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; when multiple $Ar^{41a}$ groups are present, the groups may be the same or different; $k_B$ is an integer of 1 to 3; and in formula (5), $Ar^{5a}$, $Ar^{5b}$, $Ar^{5c}$, $Ar^{5d}$ and $Ar^{5h}$ each independently represent an arylene group or a divalent aromatic heterocyclic group; $Ar^{5c}$, $Ar^{5f}$ and $Ar^{5g}$ each independently represent an aryl group or a monovalent aromatic heterocyclic group; $Ar^{5a}$, $Ar^{5b}$, $Ar^{5c}$, $Ar^{5d}$, $Ar^{5e}$, $Ar^{5f}$, $Ar^{5g}$ and $Ar^{5h}$ may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; the groups represented by $Ar^{5d}$, $Ar^{5c}$, $Ar^{5f}$ and $Ar^{5g}$ may each form a 5- to 7-membered ring by bonding to a group other than the concerned group which bonds to a nitrogen atom to which the concerned group bonds, directly or via a group represented by —O—, —S—, —C(=O)—, —C(=O)—O—, —N($R^A$)—, —C(=O)—N($R^A$)— or —C($R^A$)$_2$—; $R^A$ in the formulas represents an alkyl group, an aryl group, a monovalent aromatic heterocyclic group or an aralkyl group; when multiple $Ar^{5a}$, $Ar^{5b}$, $Ar^{5c}$, $Ar^{5d}$ and $Ar^{5h}$ groups are present, the groups may be the same or different;

$n_1$ and $n_2$ are each independently 0 or 1; $n_3$ is 0 or a positive integer; and $n_4$, $n_5$, $n_6$ and $n_7$ are each independently a positive integer.

15. The polymer compound according to claim 13, comprising as the constitutional unit represented by formula (IB) at least one constitutional unit selected from the group consisting of a constitutional unit represented by formula (1B), a constitutional unit represented by formula (7B), a constitutional unit represented by formula (9B), a constitutional unit represented by formula (10B) and a constitutional unit represented by formula (11B);

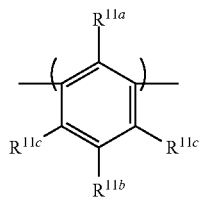
(1B)

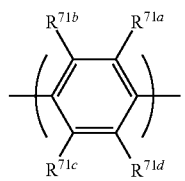
(7B)

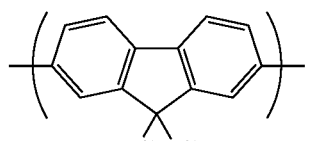
(9B)

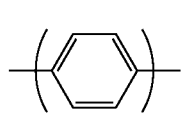
(10B)

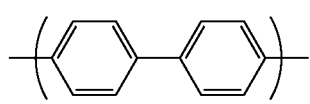
(11B)

wherein in formula (1B), $R^{11a}$ represents a hydrogen atom, an alkyl group, an aryl group, a monovalent aromatic heterocyclic group, an aralkyl group or a substituted amino group;

$R^{11b}$ and $R^{11c}$ each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; the two $R^{11c}$ groups may be the same or different;

in formula (7B), $R^{71a}$ and $R^{71c}$ each independently represent an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group or a cyano group;

$R^{71b}$ and $R^{71d}$ independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; and in formula (9B), $R^{91a}$ and $R^{91c}$ each independently represent an alkyl group, an aryl group, a monovalent aromatic heterocyclic group or an aralkyl group; and $R^{91a}$ and $R^{91c}$ may be bonded together to form a ring structure.

16. The polymer compound according to claim 1, wherein a constitutional unit derived from a phosphorescent light-emitting compound is contained in at least one block selected from the group consisting of the block (A), the block (B), and a block different from the block (A) and the block (B).

17. The polymer compound according to claim 16, wherein the constitutional unit derived from a phosphorescent light-emitting compound is a constitutional unit derived from a phosphorescent light-emitting compound which includes at least one metal selected from the group consisting of gold, platinum, iridium, osmium, rhenium and europium as a central metal thereof.

18. The polymer compound according to claim 1, wherein a proportion of the constitutional units represented by formula (0) contained in the block (A) is 5 to 40 mol % in relation to all the constitutional units contained in the polymer compound and 5 to 100 mol % in relation to all the constitutional units contained in the block (A).

19. The polymer compound according to claim 14, wherein a proportion of a total mass of the constitutional unit represented by formula (0), the constitutional unit represented by formula (3), the constitutional unit represented by formula (4), the constitutional unit represented by formula (3B), the constitutional unit represented by formula (4B) and the constitutional unit represented by formula (5) is 0.9 or more when the total mass of the polymer compound is 1.0.

20. The polymer compound according to claim 1, wherein a value represented by expression (V) is 0.01 or more and 0.8 or less;

$$[C]/[D] \quad (V)$$

wherein in expression (V), [C] represents a polystyrene-equivalent weight-average molecular weight of the block (A), and [D] represents a polystyrene-equivalent weight-average molecular weight of the polymer compound.

21. A composition comprising:

a polymer compound according to claim 1; and at least one material selected from the group consisting of a hole transport material, an electron transport material and a light-emitting material.

22. The composition according to claim 21, comprising a phosphorescent light-emitting compound as at least one material selected from the group consisting of the hole transport material, the electron transport material and the light-emitting material.

23. The composition according to claim 22, wherein the phosphorescent light-emitting compound is a phosphorescent light-emitting compound containing at least one metal selected from the group consisting of gold, platinum, iridium, osmium, rhenium and europium as a central metal thereof.

24. The composition according to claim 23, wherein the phosphorescent light-emitting compound is a compound comprising a structure represented by formula (8);

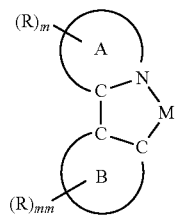

(8)

wherein in formula (8), M represents at least one metal selected from the group consisting of gold, platinum, iridium, osmium, rhenium and europium;

ring A may be a monocyclic ring or a fused ring, and represents a heteroaromatic ring which may include a heteroatom in addition to N in the formula;

ring B represents an aromatic ring which may be a monocyclic ring or a fused ring;

R represents a substituent, and when multiple R substituents are present, the substituents may be the same or different; and m and mm each represent 0 or a positive integer.

25. A solution comprising:

a polymer compound according to claim 1; and a solvent.

26. A film comprising a polymer compound according to claim 1.

27. A light-emitting device comprising an organic layer comprising a polymer compound according to claim 1.

28. The light-emitting device according to claim 27, wherein the organic layer is a light-emitting layer.

29. A surface light source comprising a light-emitting device according to claim 28.

30. A display device comprising a light-emitting device according to claim 28.

31. A method for producing a polymer compound according to claim 1, comprising:

a first step of synthesizing a first compound comprising multiple constitutional units represented by formula (0) by condensation-polymerizing a compound represented by formula (R-0) or by condensation-polymerizing a first monomer mixture comprising the compound represented by formula (R-0) and a compound represented by formula (R-I); and a second step of producing a polymer compound having a block (A) comprising the multiple constitutional units represented by formula (0) by condensation-polymerizing the first compound and a second compound having a structure different from a structure of the first compound and capable of being condensation-polymerized with the first compound;

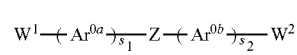

(R-0)

(R-I)

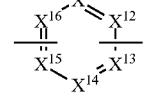

(0-1)

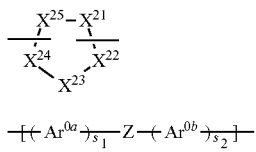

$$\text{--}\!\!+\!\!(\text{Ar}^{0a})_{s_1}\!\!-\!\!Z\!\!-\!\!(\text{Ar}^{0b})_{s_2}\!\!+\!\!\text{--}\qquad(0)$$

wherein in formulas (R-0) and (0), Z represents a group represented by formula (0-1) or a group represented by formula (0-2); $\text{Ar}^{0a}$ and $\text{Ar}^{0b}$ each independently represent an arylene group or a divalent aromatic heterocyclic group having a structure different from that of Z, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; when multiple $\text{Ar}^{0a}$ and $\text{Ar}^{0b}$ groups are present, the groups may be the same or different; $s_1$ and $s_2$ each independently represent 1 or 2;

in formula (R-I), $\text{Ar}^1$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent;

in formulas (0-1) and (0-2), $X^{11}, X^{12}, X^{13}, X^{14}, X^{15}, X^{16}, X^{21}, X^{22}, X^{23}, X^{24}$ and $X^{25}$ each independently represent a carbon atom or a nitrogen atom, where two or three of $X^{11}, X^{12}, X^{13}, X^{14}, X^{15}$ and $X^{16}$ are a nitrogen atom and three of $X^{21}, X^{22}, X^{23}, X^{24}$ and $X^{25}$ are a nitrogen atom; the group represented by formula (0-1) and the group represented by formula (0-2) may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; and in formulas (R-0) and (R-I), $W^1, W^2, W^{21}$ and $W^{22}$ are each independently a polymerizable group capable of involving a condensation-polymerization reaction.

32. The method for producing a polymer compound according to claim 31, wherein in the second step, a second monomer mixture comprising the compound represented by formula (R-I) and a compound represented by formula (R-II) is used as the second compound;

$$W^{31}\text{---}\text{Ar}^2\text{---}W^{32}\qquad(\text{R-II})$$

wherein in formula (R-II), $\text{Ar}^2$ represents a divalent aromatic amine residue, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; and $W^{31}$ and $W^{32}$ are each independently a polymerizable group capable of involving a condensation-polymerization reaction.

33. A method for producing a polymer compound according to claim 1, comprising:

a first step of producing a first compound comprising multiple constitutional units represented by formula (0) by condensation-polymerizing a compound represented by formula (R-0) or by condensation-polymerizing a first monomer mixture comprising the compound represented by formula (R-0) and a compound represented by formula (R-I);

a second step of producing a second compound comprising multiple constitutional units represented by formula (II) by condensation-polymerizing a second monomer mixture comprising the compound represented by formula (R-I) and a compound represented by formula (R-II); and a third step of producing a polymer compound having a block (A) comprising multiple constitutional units represented by formula (0) and a block (B) comprising multiple constitutional units represented by formula (II) by condensation-polymerizing the first compound and the second compound;

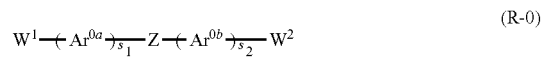
(R-0)

(R-I)

(R-II)

(0-1)

(0-2)

(0)

(II)

wherein in formulas (R-0) and (0), Z represents a group represented by formula (0-1) or a group represented by formula (0-2); $\text{Ar}^{0a}$ and $\text{Ar}^{0b}$ each independently represent an arylene group or a divalent aromatic heterocyclic group having a structure different from that of Z, and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; when multiple $\text{Ar}^{0a}$ and $\text{Ar}^{0b}$ groups are present, the groups may be the same or different; $s_1$ and $s_2$ each independently represent 1 or 2;

in formula (R-I), $\text{Ar}^1$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent;

in formulas (R-II) and (II), $Ar^2$ represents a divalent aromatic amine residue and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent;

in formulas (0-1) and (0-2), $X^{11}$, $X^{12}$, $X^{13}$, $X^{14}$, $X^{15}$, $X^{16}$, $X^{21}$, $X^{22}$, $X^{23}$, $X^{24}$ and $X^{25}$ each independently represent a carbon atom or a nitrogen atom, where two or three of $X^{11}$, $X^{12}$, $X^{13}$, $X^{14}$, $X^{15}$ and $X^{16}$ are a nitrogen atom and three of $X^{21}$, $X^{22}$, $X^{23}$, $X^{24}$ and $X^{25}$ are a nitrogen atom; the group represented by formula (0-1) and the group represented by formula (0-2) may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; and in formulas (R-0), (R-I) and (R-II), $W^1$, $W^2$, $W^{21}$, $W^{22}$, $W^{31}$ and $W^{32}$ are each independently a polymerizable group capable of involving a condensation-polymerization reaction.

34. A method for producing a polymer compound according to claim 1, comprising:

a first step of synthesizing a first compound by condensation-polymerizing a compound represented by formula (R-I) or by condensation-polymerizing a first monomer mixture comprising the compound represented by formula (R-I) and a compound represented by formula (R-II); and a second step of producing a polymer compound having a block (A) comprising multiple constitutional units represented by formula (0) by condensation-polymerizing the first compound and a compound represented by formula (R-0) or by condensation-polymerizing the first compound and a second monomer mixture comprising the compound represented by formula (R-0) and the compound represented by formula (R-I);

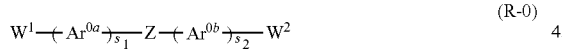  (R-0)

  (R-I)

  (R-II)

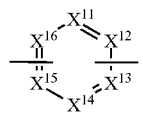  (0-1)

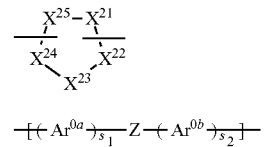  (0-2)

$$-\!\!\!+\!\!(Ar^{0a})_{s_1}\!-\!Z\!-\!(Ar^{0b})_{s_2}\!\!+\!\!-$$ (0)

wherein in formulas (R-0) and (0), Z represents a group represented by formula (0-1) or a group represented by formula (0-2); $Ar^{0a}$ and $Ar^{0b}$ each independently represent an arylene group or a divalent aromatic heterocyclic group having a structure different from that of Z and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; when multiple $Ar^{0a}$ and $Ar^{0b}$ groups are present, the groups may be the same or different; $s_1$ and $s_2$ each independently represent 1 or 2;

in formula (R-I), $Ar^1$ represents an arylene group or a divalent aromatic heterocyclic group and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent;

in formula (R-II), $Ar^2$ represents a divalent aromatic amine residue and may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent;

in formulas (0-1) and (0-2), $X^{11}$, $X^{12}$, $X^{13}$, $X^{14}$, $X^{15}$, $X^{16}$, $X^{21}$, $X^{22}$, $X^{23}$, $X^{24}$ and $X^{25}$ each independently represent a carbon atom or a nitrogen atom, where two or three of $X^{11}$, $X^{12}$, $X^{13}$, $X^{14}$, $X^{15}$ and $X^{16}$ are a nitrogen atom and three of $X^{21}$, $X^{22}$, $X^{23}$, $X^{24}$ and $X^{25}$ are a nitrogen atom; the group represented by formula (0-1) and the group represented by formula (0-2) may have an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group as a substituent; and in formulas (R-0), (R-I) and (R-II), $W^1$, $W^2$, $W^{21}$, $W^{22}$, $W^{31}$ and $W^{32}$ are each independently a polymerizable group capable of involving a condensation-polymerization reaction.

* * * * *